(12) United States Patent
Seo

(10) Patent No.: US 12,089,429 B2
(45) Date of Patent: *Sep. 10, 2024

(54) LIGHT-EMITTING ELEMENT, LIGHT-EMITTING DEVICE, ELECTRONIC DEVICE, AND LIGHTING DEVICE

(71) Applicant: SEMICONDUCTOR ENERGY LABORATORY CO., LTD., Atsugi (JP)

(72) Inventor: Satoshi Seo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 753 days.

This patent is subject to a terminal disclaimer.

(21) Appl. No.: 17/154,426

(22) Filed: Jan. 21, 2021

(65) Prior Publication Data

US 2021/0167313 A1      Jun. 3, 2021

Related U.S. Application Data

(63) Continuation of application No. 15/046,875, filed on Feb. 18, 2016, now Pat. No. 10,903,440.

(30) Foreign Application Priority Data

Feb. 24, 2015   (JP) ................. 2015-033719

(51) Int. Cl.
*H10K 50/11*   (2023.01)
*C09K 11/02*   (2006.01)
(Continued)

(52) U.S. Cl.
CPC ............. *H10K 50/11* (2023.02); *C09K 11/02* (2013.01); *C09K 11/06* (2013.01); *H10K 50/13* (2023.02);
(Continued)

(58) Field of Classification Search
CPC ........ H10K 50/11; H10K 50/13; H10K 59/38; C09K 11/06
See application file for complete search history.

(56) References Cited

U.S. PATENT DOCUMENTS 7,009,338 B2   3/2006   D'Andrade et al.
7,175,922 B2   2/2007   Jarikov et al.
(Continued)

FOREIGN PATENT DOCUMENTS

CN      102668159 A        9/2012
DE   102013205863 A1 *  10/2013   .......... H01L 27/3211
(Continued)

OTHER PUBLICATIONS

Endo.A et al., "Thermally Activated Delayed Fluorescence from Sn4+-Porphyrin Complexes and Their Application to Organic Light Emitting Diodes—A Novel Mechanism for Electroluminescence", Adv. Mater. (Advanced Materials), Aug. 12, 2009, vol. 21, No. 47, pp. 4802-4806.

(Continued)

*Primary Examiner* — Walter H Swanson
*Assistant Examiner* — Jacob T Nelson
(74) *Attorney, Agent, or Firm* — NIXON PEABODY LLP; Jeffrey L. Costellia

(57) ABSTRACT

A novel light-emitting element is provided. Alternatively, a novel light-emitting element which can achieve both high efficiency and a long lifetime is provided. The light-emitting element includes a light-emitting layer between a pair of electrodes. The light-emitting element includes a first light-emitting layer and a second light-emitting layer. The first light-emitting layer includes a fluorescent material. The second light-emitting layer includes a phosphorescent material. A difference in peak value between a first emission spectrum of light from the first light-emitting layer and a (Continued)

second emission spectrum of light from the second light-emitting layer is 30 nm or less.

18 Claims, 26 Drawing Sheets

(51) Int. Cl.
 *C09K 11/06* (2006.01)
 *H10K 50/13* (2023.01)
 *H10K 59/38* (2023.01)
 *H10K 101/10* (2023.01)
(52) U.S. Cl.
 CPC ............. *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/185* (2013.01); *H10K 59/38* (2023.02); *H10K 2101/10* (2023.02)

(56) References Cited

U.S. PATENT DOCUMENTS

| | | |
|---|---|---|
| 7,183,010 B2 | 2/2007 | Jarikov |
| 7,285,907 B2 | 10/2007 | D'Andrade et al. |
| 7,332,857 B2 | 2/2008 | Seo et al. |
| 7,572,522 B2 | 8/2009 | Seo et al. |
| 7,597,967 B2 | 10/2009 | Kondakova et al. |
| 7,906,897 B2 | 3/2011 | Satou |
| 7,943,925 B2 | 5/2011 | Yamazaki |
| 7,993,760 B2 | 8/2011 | Komori et al. |
| 8,021,574 B2 | 9/2011 | Kawamura et al. |
| 8,025,815 B2 | 9/2011 | Kawamura et al. |
| 8,029,697 B2 | 10/2011 | Kawamura et al. |
| 8,034,256 B2 | 10/2011 | Kawamura et al. |
| 8,034,465 B2 | 10/2011 | Liao et al. |
| 8,101,857 B2 | 1/2012 | Kido et al. |
| 8,154,195 B2 | 4/2012 | Nishimura et al. |
| 8,211,552 B2 | 7/2012 | Nishimura et al. |
| 8,221,907 B2 | 7/2012 | Kawamura et al. |
| 8,247,086 B2 | 8/2012 | Inoue et al. |
| 8,274,214 B2 | 9/2012 | Ikeda et al. |
| 8,294,142 B2 | 10/2012 | Nishimura et al. |
| 8,299,456 B2 | 10/2012 | Seo et al. |
| 8,330,350 B2 | 12/2012 | Nishimura et al. |
| 8,426,036 B2 | 4/2013 | Nishimura et al. |
| 8,436,343 B2 | 5/2013 | Nishimura et al. |
| 8,568,903 B2 | 10/2013 | Kawamura et al. |
| 8,587,192 B2 | 11/2013 | Nishimura et al. |
| 8,710,495 B2 | 4/2014 | Seo et al. |
| 8,723,025 B2 | 5/2014 | Kido et al. |
| 8,779,655 B2 | 7/2014 | Nishimura et al. |
| 8,853,680 B2 | 10/2014 | Yamazaki et al. |
| 8,928,010 B2 | 1/2015 | Yamazaki et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,013 B2 | 3/2015 | Seo |
| 8,994,263 B2 | 3/2015 | Shitagaki et al. |
| 9,054,317 B2 | 6/2015 | Monkman et al. |
| 9,059,421 B2 | 6/2015 | Seo et al. |
| 9,059,430 B2 | 6/2015 | Seo et al. |
| 9,065,066 B2 | 6/2015 | Seo et al. |
| 9,082,995 B2 | 7/2015 | Nishimura et al. |
| 9,153,790 B2 | 10/2015 | Kuma et al. |
| 9,159,942 B2 | 10/2015 | Seo et al. |
| 9,175,213 B2 | 11/2015 | Seo et al. |
| 9,219,243 B2 | 12/2015 | Matsubara et al. |
| 9,263,693 B2 | 2/2016 | Seo et al. |
| 9,276,228 B2 | 3/2016 | Seo et al. |
| 9,299,944 B2 | 3/2016 | Seo et al. |
| 9,356,250 B2 | 5/2016 | Ohsawa et al. |
| 9,362,517 B2 | 6/2016 | Ohsawa et al. |
| 9,368,741 B2 | 6/2016 | Ishisone et al. |
| 9,431,614 B2 | 8/2016 | Seo et al. |
| 9,444,063 B2 | 9/2016 | Nonaka et al. |
| 9,515,279 B2 | 12/2016 | Ishisone et al. |
| 9,559,313 B2 | 1/2017 | Seo et al. |
| 9,590,208 B2 | 3/2017 | Seo et al. |
| 9,595,686 B2 | 3/2017 | Seo et al. |
| 9,601,708 B2 | 3/2017 | Yamamoto et al. |
| 9,604,928 B2 | 3/2017 | Shitagaki et al. |
| 9,614,170 B2 | 4/2017 | Ogiwara et al. |
| 9,634,279 B2 | 4/2017 | Seo et al. |
| 9,653,697 B2 | 5/2017 | Ishisone et al. |
| 9,660,211 B2 | 5/2017 | Seo et al. |
| 9,882,144 B2 | 1/2018 | Kawamura et al. |
| 9,899,620 B2 | 2/2018 | Ogiwara et al. |
| 9,947,885 B2 | 4/2018 | Seo et al. |
| 10,062,867 B2 | 8/2018 | Seo et al. |
| 10,128,455 B2 | 11/2018 | Nonaka et al. |
| 10,186,665 B2 | 1/2019 | Kawamura et al. |
| 10,361,389 B2 | 7/2019 | Seo et al. |
| 10,374,186 B2 | 8/2019 | Ohsawa et al. |
| 10,454,054 B2 | 10/2019 | Ishisone et al. |
| 10,505,132 B2 | 12/2019 | Seo et al. |
| 10,600,983 B2 | 3/2020 | Nishide et al. |
| 10,644,254 B2 | 5/2020 | Seo et al. |
| 10,734,594 B2 | 8/2020 | Seo et al. |
| 10,818,861 B2 | 10/2020 | Seo et al. |
| 10,903,440 B2 * | 1/2021 | Seo ............ H10K 50/13 |
| 11,355,722 B2 | 6/2022 | Seo et al. |
| 11,393,997 B2 | 7/2022 | Seo et al. |
| 11,730,007 B2 | 8/2023 | Seo et al. |
| 2003/0175553 A1 | 9/2003 | Thompson et al. |
| 2005/0048310 A1 | 3/2005 | Cocchi et al. |
| 2005/0104510 A1 | 5/2005 | Parthasarathy et al. |
| 2005/0221116 A1 | 10/2005 | Cocchi et al. |
| 2006/0134464 A1 | 6/2006 | Nariyuki |
| 2006/0228577 A1 | 10/2006 | Nagara |
| 2006/0232194 A1 | 10/2006 | Tung et al. |
| 2007/0077594 A1 | 4/2007 | Hikmet et al. |
| 2007/0090756 A1 | 4/2007 | Okada et al. |
| 2007/0126350 A1 | 6/2007 | Lee et al. |
| 2007/0244320 A1 | 10/2007 | Inoue et al. |
| 2008/0149923 A1 | 6/2008 | Ohsawa et al. |
| 2008/0160345 A1 | 7/2008 | Inoue et al. |
| 2008/0231174 A1 | 9/2008 | Parthasarathy et al. |
| 2008/0286604 A1 | 11/2008 | Inoue et al. |
| 2008/0286610 A1 | 11/2008 | Deaton et al. |
| 2009/0045731 A1 | 2/2009 | Nishimura et al. |
| 2009/0140643 A1 | 6/2009 | Ohsawa et al. |
| 2009/0179196 A1 | 7/2009 | Adachi et al. |
| 2010/0051968 A1 | 3/2010 | Seo et al. |
| 2010/0052527 A1 | 3/2010 | Ikeda et al. |
| 2010/0145044 A1 | 6/2010 | Inoue et al. |
| 2010/0171109 A1 | 7/2010 | Nishimura et al. |
| 2010/0331585 A1 | 12/2010 | Kawamura et al. |
| 2011/0001146 A1 | 1/2011 | Yamazaki et al. |
| 2011/0121320 A1 | 5/2011 | Pieh et al. |
| 2011/0133227 A1 | 6/2011 | Lee et al. |
| 2011/0210316 A1 | 9/2011 | Kadoma et al. |
| 2011/0215714 A1 | 9/2011 | Seo et al. |
| 2012/0032186 A1 | 2/2012 | Lee et al. |
| 2012/0056170 A1 | 3/2012 | Pan et al. |
| 2012/0098417 A1 | 4/2012 | Inoue et al. |
| 2012/0126205 A1 | 5/2012 | Kawamura et al. |
| 2012/0126208 A1 | 5/2012 | Kawamura et al. |
| 2012/0126209 A1 | 5/2012 | Kawamura et al. |
| 2012/0153305 A1 | 6/2012 | Choong et al. |
| 2012/0161111 A1 | 6/2012 | Chiang et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217486 A1 | 8/2012 | Takemura et al. |
| 2012/0217487 A1 | 8/2012 | Yamazaki et al. |
| 2012/0223633 A1 | 9/2012 | Yoshinaga et al. |
| 2012/0235127 A1 | 9/2012 | Takasu et al. |
| 2012/0242219 A1 | 9/2012 | Seo et al. |
| 2012/0248421 A1 | 10/2012 | Yamazaki et al. |
| 2012/0248424 A1 | 10/2012 | Sasaki |
| 2012/0256535 A1 | 10/2012 | Seo et al. |

(56) References Cited

U.S. PATENT DOCUMENTS

| | | | |
|---|---|---|---|
| 2012/0262057 A1* | 10/2012 | Fujita | H10K 85/657 |
| | | | 313/504 |
| 2012/0267618 A1 | 10/2012 | Monkman et al. | |
| 2012/0274201 A1 | 11/2012 | Seo et al. | |
| 2013/0002131 A1 | 1/2013 | Inoue et al. | |
| 2013/0048964 A1 | 2/2013 | Takeda et al. | |
| 2013/0140530 A1 | 6/2013 | Kho et al. | |
| 2013/0187143 A1 | 7/2013 | Nishimura et al. | |
| 2013/0207088 A1 | 8/2013 | Seo | |
| 2013/0221278 A1 | 8/2013 | Inoue et al. | |
| 2013/0240850 A1 | 9/2013 | Forrest et al. | |
| 2013/0292664 A1 | 11/2013 | Nishimura et al. | |
| 2013/0306945 A1 | 11/2013 | Seo | |
| 2013/0320837 A1 | 12/2013 | Weaver et al. | |
| 2014/0034927 A1 | 2/2014 | Seo et al. | |
| 2014/0034930 A1 | 2/2014 | Seo et al. | |
| 2014/0061604 A1 | 3/2014 | Seo et al. | |
| 2014/0084274 A1 | 3/2014 | Yamazaki et al. | |
| 2014/0167027 A1 | 6/2014 | Yersin et al. | |
| 2014/0246071 A1 | 9/2014 | Kido et al. | |
| 2014/0252332 A1 | 9/2014 | Carroll | |
| 2014/0361281 A1 | 12/2014 | Carroll | |
| 2015/0053958 A1 | 2/2015 | Ishisone et al. | |
| 2015/0069352 A1 | 3/2015 | Kim et al. | |
| 2016/0064684 A1 | 3/2016 | Seo et al. | |
| 2016/0163768 A1* | 6/2016 | Song | H10K 59/38 |
| | | | 257/40 |
| 2017/0053970 A1 | 2/2017 | Ishisone et al. | |
| 2017/0155092 A1 | 6/2017 | Seo et al. | |
| 2017/0179411 A1 | 6/2017 | Shitagaki et al. | |
| 2017/0213877 A1 | 7/2017 | Seo et al. | |
| 2017/0279063 A1 | 9/2017 | Seo et al. | |
| 2019/0067614 A1 | 2/2019 | Nonaka et al. | |
| 2019/0109285 A1 | 4/2019 | Kawamura et al. | |
| 2019/0140027 A1 | 5/2019 | Ishisone et al. | |
| 2024/0049493 A1 | 2/2024 | Seo et al. | |

FOREIGN PATENT DOCUMENTS

| | | | |
|---|---|---|---|
| EP | 2482619 A | 8/2012 | |
| EP | 2980877 A | 2/2016 | |
| JP | 2007-189002 A | 7/2007 | |
| JP | 2008-112976 A | 5/2008 | |
| JP | 2010-049818 A | 3/2010 | |
| JP | 2011-044365 A | 3/2011 | |
| JP | 2011-070963 A | 4/2011 | |
| JP | 2011-077330 A | 4/2011 | |
| JP | 2012-186461 A | 9/2012 | |
| JP | 2013-509670 | 3/2013 | |
| JP | 2013-236058 A | 11/2013 | |
| JP | 2014-044942 A | 3/2014 | |
| JP | 2014-045179 A | 3/2014 | |
| JP | 2014-075249 A | 4/2014 | |
| JP | 2014-096557 A | 5/2014 | |
| JP | 2014-241405 A | 12/2014 | |
| JP | 2015-109407 A | 6/2015 | |
| KR | 2012-0092550 A | 8/2012 | |
| KR | 2012-0092555 A | 8/2012 | |
| TW | 201232864 | 8/2012 | |
| TW | 201301598 | 1/2013 | |
| WO | WO-2011/021433 | 2/2011 | |
| WO | WO-2013054621 A1* | 4/2013 | G09G 3/3208 |
| WO | WO-2014/021443 | 2/2014 | |
| WO | WO-2014/104315 | 7/2014 | |
| WO | WO-2014/157619 | 10/2014 | |
| WO | WO-2014/185434 | 11/2014 | |
| WO | WO-2015/005440 | 1/2015 | |

OTHER PUBLICATIONS

Baldo.M et al., "Highly Efficient Phosphorescent Emission From Organic Electroluminescent Devices", Nature, Sep. 10, 1998, vol. 395, pp. 151-154.

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Gu.G et al., "Transparent Organic Light Emitting Devices", Appl. Phys. Lett. (Applied Physics Letters), May 6, 1996, vol. 68, No. 19, pp. 2606-2608.

Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.

Adachi.C et al., "NEARLY 100% Internal Phosphorescence Efficiency in an Organic Light Emitting Device", J. Appl. Phys. (Journal of Applied Physics), Nov. 15, 2001, vol. 90, No. 10, pp. 5048-5051.

Baldo.M et al., "Prospects for Electrically Pumped Organic Lasers", Phys. Rev. B (Physical Review. B), Jul. 19, 2002, vol. 66, pp. 035321-1-035321-16.

Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Kondakova.M et al., "High-efficiency, low-voltage phosphorescent organic light-emitting diode devices with mixed host", J. Appl. Phys. (Journal of Applied Physics), Nov. 4, 2008, vol. 104, p. 094501-1-094501-17.

Seo.J et al., "Efficient blue-green organic light-emitting diodes based on heteroleptic tris-cyclometalated iridium(III) complexes", Thin Solid Films, Sep. 25, 2008, vol. 517, No. 5, pp. 1807-1810.

Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.

Goushi.K et al., "Efficient organic light-emitting diodes through up-conversion from triplet to singlet excited states of exciplexes", Appl. Phys. Lett. (Applied Physics Letters), Jul. 12, 2012, vol. 101, No. 2, pp. 023306-1-023306-4.

Yersin.H et al., Highly Efficient OLEDs with Phosphorescent Materials, 2008, pp. 1-97,283-309, Wiley-VCH Verlag GmbH & Co..

Tokito.S et al., "Improvement in performance by doping", Organic EL Display, Aug. 20, 2004, pp. 67-99, Ohmsha.

Jeon. W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(Flrpic):Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

(56) References Cited

OTHER PUBLICATIONS

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.
Lee.J et al., "Stabilizing the efficiency of phosphorescent organic light-emitting diodes", SPIE Newsroom, Apr. 21, 2008, pp. 1-3.
Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.
Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.
Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

\* cited by examiner

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

One embodiment of the present invention relates to a light-emitting element in which a light-emitting layer capable of emitting light by application of an electric field is provided between a pair of electrodes. One embodiment of the present invention relates to a light-emitting device, a display device, an electronic device, and a lighting device each including the above light-emitting element.

Note that one embodiment of the present invention is not limited to the above technical field. The technical field of one embodiment of the invention disclosed in this specification and the like relates to an object, a method, or a manufacturing method. Alternatively, the technical field of one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

A light-emitting element having a structure in which an organic compound that is a light-emitting substance is provided between a pair of electrodes (also referred to as an organic electroluminescence (EL) element) has attracted attention as a next-generation flat panel display in terms of characteristics such as thinness, lightweight, high-speed response, and low voltage driving. In addition, a display using such an organic EL element is excellent in contrast and image quality, and has a wide viewing angle.

In the case of such an organic EL element, electrons from a cathode and holes from an anode are injected into an EL layer, so that current flows. By recombination of the injected electrons and holes, the organic compound having a light-emitting property is excited and provides light emission.

The excited state of an organic compound can be a singlet excited state (S*) or a triplet excited state (T*), and light emission from the singlet excited state is referred to as fluorescence, and light emission from the triplet excited state is referred to as phosphorescence. The statistical generation ratio of the excited states in the light-emitting element is considered to be S*:T*=1:3.

In a material that emits light from the singlet excited state (hereinafter referred to as fluorescent material), at room temperature, generally light emission from the triplet excited state (phosphorescence) is not observed while only light emission from the singlet excited state (fluorescence) is observed. Therefore, the internal quantum efficiency (the ratio of generated photons to injected carriers) of a light-emitting element using a fluorescent material is assumed to have a theoretical limit of 25% based on the ratio of S* to T* that is 1:3.

In contrast, in a material that emits light from the triplet excited state (hereinafter referred to as a phosphorescent material), light emission from the triplet excited state (phosphorescence) is observed. Since intersystem crossing easily occurs in a phosphorescent material, the internal quantum efficiency can be increased to 100% in theory. That is, a light-emitting element using a phosphorescent material can have higher emission efficiency than a light-emitting element using a fluorescent material. For this reason, light-emitting elements using phosphorescent materials are now under active development in order to obtain highly efficient light-emitting elements (see Patent Document 1).

REFERENCE

Patent Document

[Patent Document 1] Japanese Published Patent Application No. 2012-186461

SUMMARY OF THE INVENTION

The light-emitting element using a phosphorescent material can have higher emission efficiency than a light-emitting element using a fluorescent material. In contrast, the lifetime of the light-emitting element using a phosphorescent material is in some cases shorter than that of the light-emitting element using a fluorescent material. Particularly in the light-emitting element using a phosphorescent material whose emission wavelength is located on the shorter wavelength side, that is, a phosphorescent material whose emission spectrum has a peak in a blue wavelength range, it is difficult to obtain characteristics which can sufficiently achieve both high efficiency and a long lifetime.

In view of the above-described problems, an object of one embodiment of the present invention is to provide a novel light-emitting element. Another object of one embodiment of the present invention is to provide a novel light-emitting element which can achieve both high efficiency and a long lifetime.

Another object of one embodiment of the present invention is to provide a light-emitting device, an electronic device, and a lighting device that include the light-emitting element.

Note that the descriptions of these objects do not disturb the existence of other objects. In one embodiment of the present invention, there is no need to achieve all the objects. Other objects will be apparent from and can be derived from the description of the specification, the drawings, the claims, and the like.

According to one embodiment of the present invention, a light-emitting element includes a light-emitting layer between a pair of electrodes. The light-emitting element includes a first light-emitting layer and a second light-emitting layer. The first light-emitting layer includes a fluorescent material. The second light-emitting layer includes a phosphorescent material. A difference in peak value between a first emission spectrum of light from the first light-emitting layer and a second emission spectrum of light from the second light-emitting layer is 30 nm or less.

In the above embodiment, emission color of light from the fluorescent material is preferably the same as or similar to emission color of light from the phosphorescent material. Moreover, in the above embodiment, the first emission spectrum and the second emission spectrum each preferably have the peak value in a blue wavelength range.

According to another embodiment of the present invention, a light-emitting element includes a light-emitting layer between a pair of electrodes. The light-emitting element includes a first EL layer and a second EL layer. The first EL layer includes a first light-emitting layer and a second light-emitting layer. The first light-emitting layer includes a fluorescent material. The second light-emitting layer includes a first phosphorescent material. The second EL layer includes a third light-emitting layer. The third light-emitting layer includes a second phosphorescent material. A difference in peak value between a first emission spectrum of light from the first light-emitting layer and a second emission spectrum of light from the second light-emitting layer is 30 nm or less.

In the above embodiment, emission color of light from the fluorescent material is preferably the same as or similar to emission color of light from the first phosphorescent material. Moreover, in the above embodiment, the first emission spectrum and the second emission spectrum each preferably have the peak value in a blue wavelength range.

According to another embodiment of the present invention, a light-emitting element includes a light-emitting layer between a pair of electrodes. The light-emitting element includes a first EL layer and a second EL layer. The first EL layer includes a first light-emitting layer and a second light-emitting layer. The first light-emitting layer includes a fluorescent material. The second light-emitting layer includes a first phosphorescent material. The second EL layer includes a third light-emitting layer and a fourth light-emitting layer. The third light-emitting layer includes a second phosphorescent material. The fourth light-emitting layer includes a third phosphorescent material. A difference in peak value between a first emission spectrum of light from the first light-emitting layer and a second emission spectrum of light from the second light-emitting layer is 30 nm or less.

In the above embodiment, emission color of light from the fluorescent material is preferably the same as or similar to emission color of light from the first phosphorescent material. Moreover, in the above embodiment, the first emission spectrum and the second emission spectrum each preferably have the peak value in a blue wavelength range.

According to another embodiment of the present invention, a light-emitting device includes the above-described light-emitting element and a color filter. According to another embodiment of the present invention, an electronic device includes the above-described light-emitting element or the above-described light-emitting device, and a touch sensor. According to another embodiment of the present invention, a lighting device includes the above-described light-emitting element or the above-described electronic device, and a housing.

According to one embodiment of the present invention, a novel light-emitting element can be provided. Alternatively, a novel light-emitting element which can achieve both high efficiency and a long lifetime can be provided. Alternatively, a light-emitting device, an electronic device, and a lighting device that include the light-emitting element can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

DETAILED DESCRIPTION OF THE INVENTION

Figure 1A:
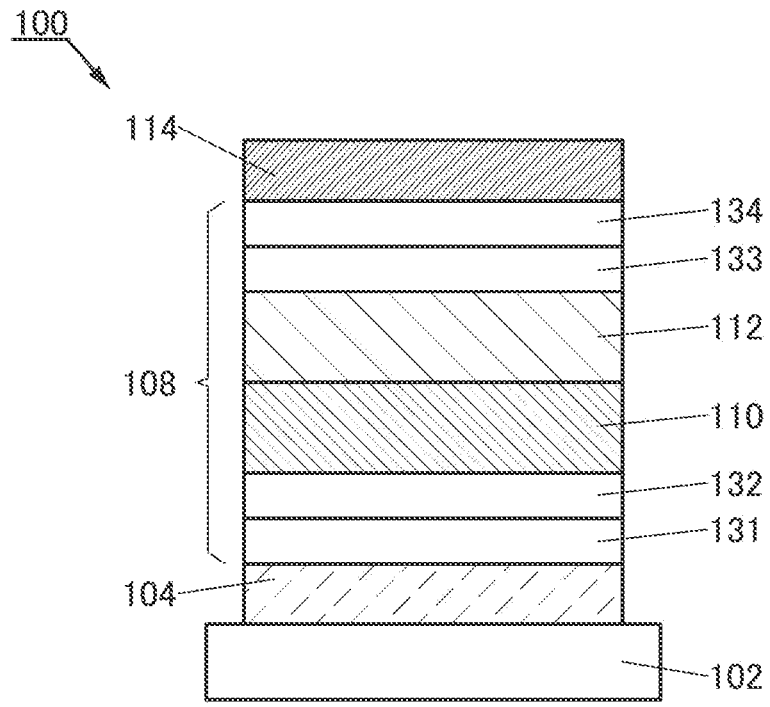
FIGS. 1A and 1B are schematic cross-sectional views illustrating a light-emitting element.

Embodiments of the present invention will be described in detail below with reference to the drawings. Note that one embodiment of the present invention is not limited to the following description, and the modes and details thereof can be modified in various ways without departing from the spirit and scope of the present invention. Accordingly, one embodiment of the present invention should not be interpreted as being limited to the content of the embodiments below.

Note that the position, the size, the range, or the like of each structure illustrated in drawings and the like is not accurately represented in some cases for easy understanding. Therefore, one embodiment of the disclosed invention is not necessarily limited to the position, the size, the range, or the like disclosed in the drawings and the like.

The ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In order to describe structures of the invention with reference to the drawings in this specification and the like, the same reference numerals are used in common for the same portions in different drawings.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Embodiment 1

In this embodiment, a light-emitting element of one embodiment of the present invention will be described with reference to FIGS. 1A and 1B, FIGS. 2A and 2B, FIGS. 3A and 3B, FIGS. 4A and 4B, FIG. 5, FIG. 6, and FIG. 7.

<1-1. Structure 1 of Light-Emitting Element>

FIGS. 1A and B are schematic cross-sectional views of a light-emitting element 100 of one embodiment of the present invention.

The light-emitting element 100 illustrated in FIG. 1A includes a first light-emitting layer 110 and a second light-emitting layer 112 between a first electrode 104 and a second electrode 114. The light-emitting element 100 in FIG. 1A further includes a hole-injection layer 131, a hole-transport layer 132, an electron-transport layer 133, and an electron-injection layer 134, in addition to the first light-emitting layer 110 and the second light-emitting layer 112.

More specifically, the light-emitting element 100 includes the first electrode 104 over a substrate 102, the hole-injection layer 131 over the first electrode 104, the hole-transport layer 132 over the hole-injection layer 131, the first light-emitting layer 110 over the hole-transport layer 132, the second light-emitting layer 112 over the first light-emitting layer 110, the electron-transport layer 133 over the second light-emitting layer 112, the electron-injection layer 134 over the electron-transport layer 133, and the second electrode 114 over the electron-injection layer 134.

Note that layers between a pair of electrodes (here, the hole-injection layer 131, the hole-transport layer 132, the first light-emitting layer 110, the second light-emitting layer 112, the electron-transport layer 133, and the electron-injection layer 134) are collectively referred to as an EL layer 108.

The first light-emitting layer 110 includes at least a fluorescent material. Note that the first light-emitting layer 110 may include another material such as a host material or an assist material in addition to the fluorescent material. For example, in the first light-emitting layer 110, the host material is present in the highest proportion by weight, and the fluorescent material is dispersed in the host material. In the first light-emitting layer 110, it is preferable that the $S_1$ level of the host material be higher than the $S_1$ level of the fluorescent material, and that the $T_1$ level of the host material be lower than the $T_1$ level of the fluorescent material.

The second light-emitting layer 112 includes at least a phosphorescent material. Note that the second light-emitting layer 112 may include another material such as a host material or an assist material in addition to the phosphorescent material. For example, in the second light-emitting layer 112, the host material is present in the highest proportion by weight, and the phosphorescent material is dispersed in the host material. In the second light-emitting layer 112, it is preferable that the $T_1$ level of the host material be higher than the $T_1$ level of the fluorescent material.

Note that a material whose emission spectrum has a peak in a blue wavelength range is particularly preferable for the fluorescent material of the first light-emitting layer 110. Moreover, a material whose emission spectrum has a peak in a blue wavelength range is particularly preferable for the phosphorescent material of the second light-emitting layer 112. The blue wavelength range is preferably 400 nm or more and 500 nm or less and further preferably 420 nm or more and 480 nm or less.

A difference in peak value between a first emission spectrum of light from the first light-emitting layer 110 and a second emission spectrum of light from the second light-emitting layer 112 is 30 nm or less, preferably 25 nm or less and further preferably 20 nm or less. In other words, the emission color of light from the first light-emitting layer 110 is preferably the same as or similar to the emission color of light from the second light-emitting layer 112.

For example, when a blue fluorescent material is used for the first light-emitting layer 110 and a blue phosphorescent material is used for the second light-emitting layer 112, the light-emitting element 100 can achieve both high efficiency and a long lifetime.

Figure 1B:
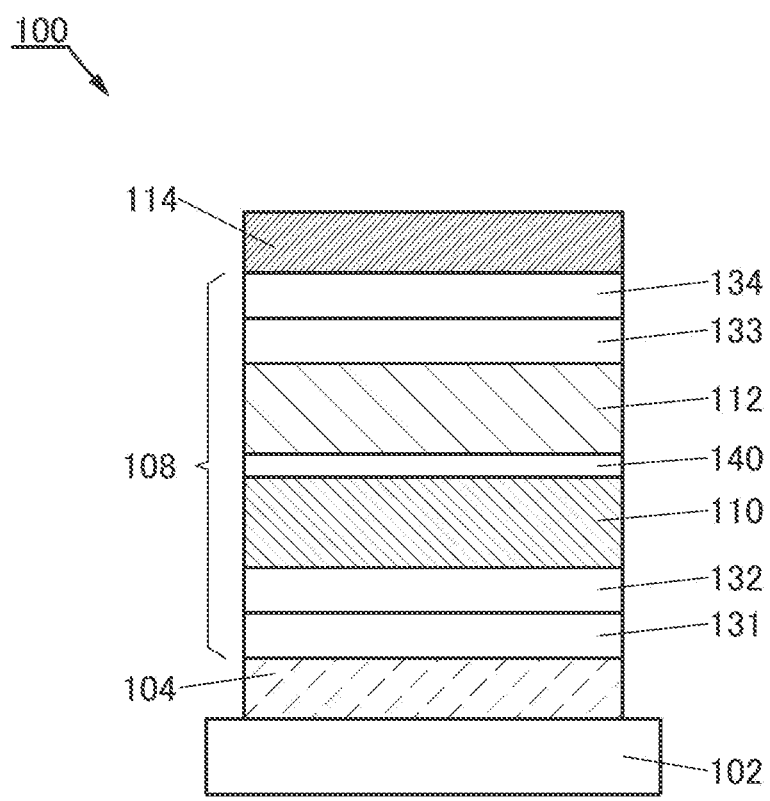

Although, in FIG. 1A, the first light-emitting layer 110 and the second light-emitting layer 112 are provided in contact with each other, for example, one embodiment of the present invention is not limited to such a structure. As illustrated in FIG. 1B, a buffer layer 140 may be provided between the first light-emitting layer 110 and the second light-emitting layer 112, for example.

The buffer layer 140 is provided to prevent energy transfer by the Dexter mechanism (particularly triplet energy transfer) from the host material in an excited state or the phosphorescent material in an excited state which is generated in the second light-emitting layer 112 to the host material or the fluorescent material in the first light-emitting layer 110. Thus, the thickness of the buffer layer 140 may be several nanometers. Specifically, the thickness of the buffer layer 140 may be greater than or equal to 0.1 nm and less than or equal to 20 nm, greater than or equal to 1 nm and less than or equal to 10 nm, or greater than or equal to 1 nm and less than or equal to 5 nm.

The buffer layer 140 may include a single material or both a hole-transport material and an electron-transport material. In the case of a single material, a bipolar material may be used. The bipolar material here refers to a material in which the ratio between the electron mobility and the hole mobility is 100 or less. As a material included in the buffer layer 140, a hole-transport material, an electron-transport material, or the like can be used. The hole-transport material or the electron-transport material will be described later. The material included in the buffer layer 140 is preferably formed of the same material as the host material of the second light-emitting layer 112. This facilitates the manufacture of the light-emitting element 100 and reduces the driving voltage of the light-emitting element 100.

For example, when the buffer layer 140 is formed of the same materials as the host material and the assist material of the second light-emitting layer 112, the first light-emitting layer 110 and the second light-emitting layer 112 are stacked with each other while the layer (the buffer layer 140) not including the phosphorescent material of the second light-emitting layer 112 is provided therebetween. In the case of such a structure, depending on using or not using the phosphorescent material, the second light-emitting layer 112 or the buffer layer 140 can be deposited. In other words, the buffer layer 140 includes a region not including the phosphorescent material while the second light-emitting layer 112 includes a region including the phosphorescent material.

Note that a material included in the buffer layer 140 may have a higher $T_1$ level than the host material of the second light-emitting layer 112.

For example, in the case where the buffer layer 140 includes a hole-transport material and an electron-transport material, a carrier recombination region can be adjusted by adjusting the mixture ratio of the hole-transport material and the electron-transport material. For example, in the case where the first electrode 104 and the second electrode 114 serve as an anode and a cathode, respectively, the carrier recombination region can be shifted from the first electrode 104 side to the second electrode 114 side by increasing the proportion of the hole-transport material in the buffer layer 140. As a result, the contribution of the second light-emitting layer 112 to light emission can be increased. In contrast, by increasing the proportion of the electron-transport material in the buffer layer 140, the carrier recombination region can be shifted from the second electrode 114 side to the first electrode 104 side, so that the contribution of the first light-emitting layer 110 to light emission can be increased.

The hole-transport material and the electron-transport material may form an exciplex in the buffer layer 140, which effectively prevents exciton diffusion. Specifically, energy transfer from the host material in an excited state or the phosphorescent material in an excited state of the second light-emitting layer 112 to the host material or the fluorescent material of the first light-emitting layer 110 can be prevented.

Figure 2A:
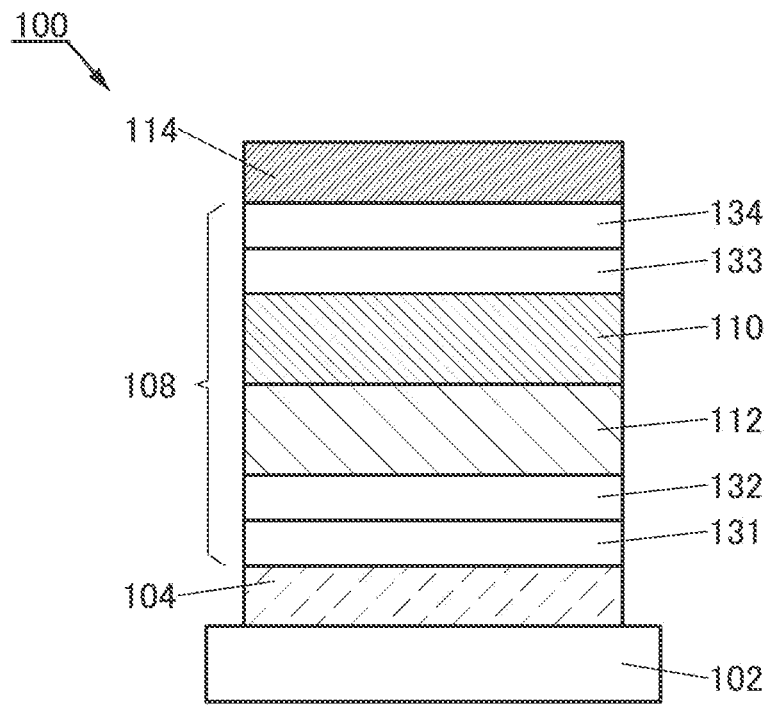
FIGS. 2A and 2B are schematic cross-sectional views illustrating a light-emitting element.
Figure 2B:
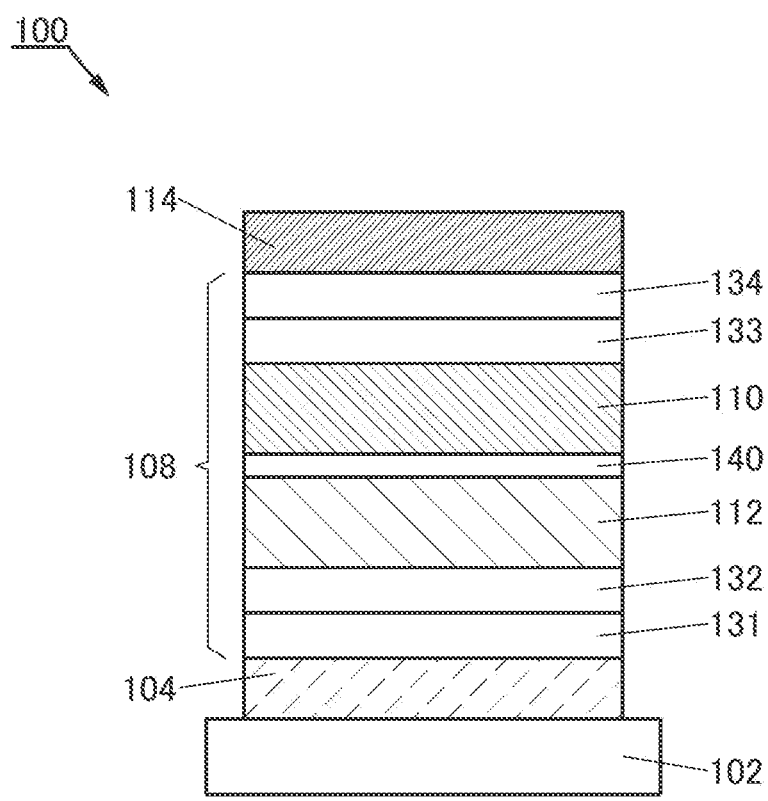

Although, in FIGS. 1A and 1B, the first light-emitting layer 110 is located on the first electrode 104 side and the second light-emitting layer 112 is located on the second electrode 114 side, for example, one embodiment of the present invention is not limited to such a structure. For example, as illustrated in FIGS. 2A and 2B, the first light-emitting layer 110 may be located on the second electrode 114 side and the second light-emitting layer 112 may be located on the first electrode 104 side.

<1-2. Characteristics and Luminance Degradation of Light-Emitting Elements>

Here, characteristics and luminance degradation of a light-emitting element including a fluorescent material and a light-emitting element including a phosphorescent material are described. First, the light-emitting element including a fluorescent material (a light-emitting element 1) and the light-emitting element including a phosphorescent material (a light-emitting element 2) were fabricated and their characteristics and luminance degradation were evaluated.

Figure 3A:
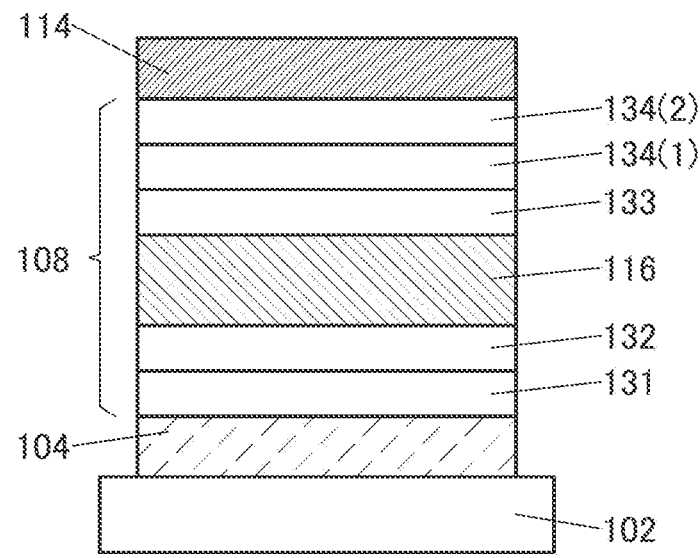
FIGS. 3A and 3B are schematic cross-sectional views illustrating a light-emitting element.
Figure 3B:
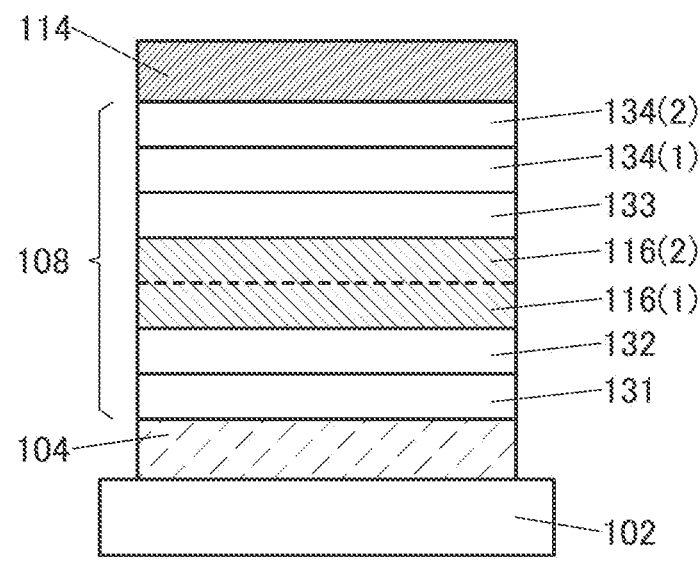

Schematic cross-sectional views of the light-emitting elements 1 and 2 are illustrated in FIGS. 3A and 3B, the detailed structures of the light-emitting elements 1 and 2 are shown in Table 1, and structures and abbreviations of compounds used here are given below. Note that FIG. 3A is the schematic cross-sectional view of the light-emitting element 1 and FIG. 3B is the schematic cross-sectional view of the light-emitting element 2.

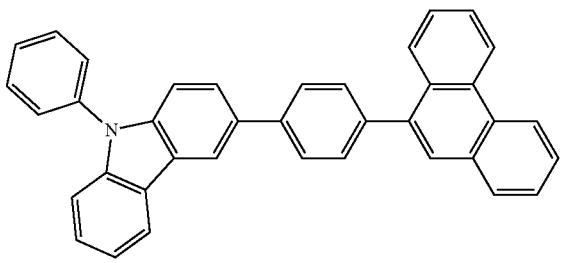

PCPPn

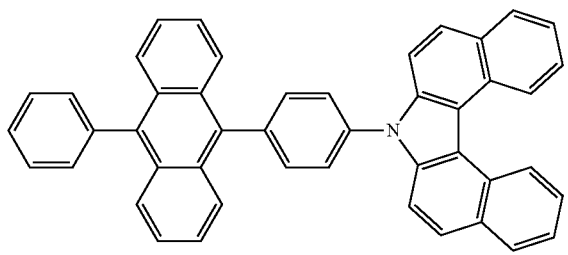

cgDBCzPA

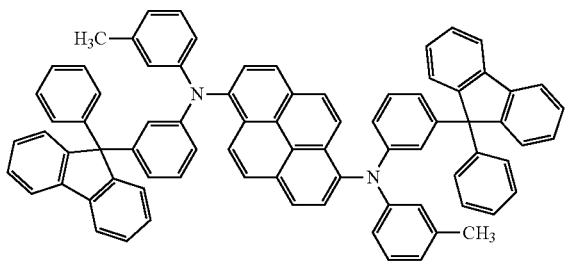

1,6mMemFLPAPrn

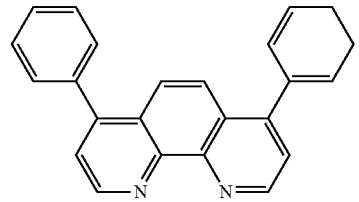

Bphen

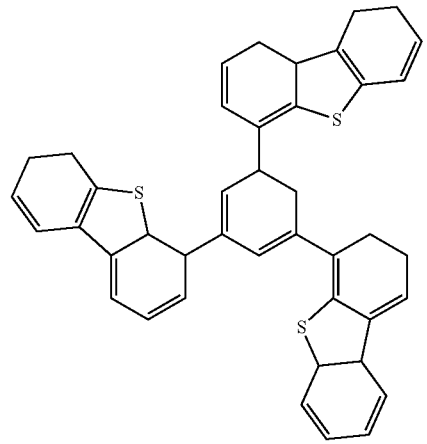

DBT3P-II

-continued

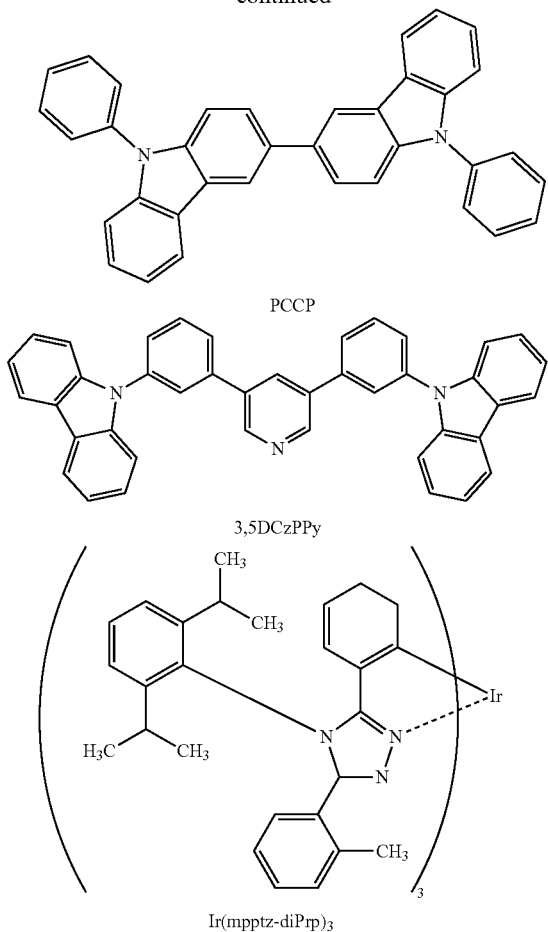

PCCP 3,5DCzPPy

Ir(mpptz-diPrp)₃ was washed with water, baking was performed at 200° C. for one hour, and then UV ozone treatment was performed on a surface of the first electrode 104 for 370 seconds.

After that, the substrate 102 was transferred into a vacuum evaporation apparatus where the pressure had been reduced to about $1\times10^{-4}$ Pa, and was subjected to vacuum baking at 170° C. for 60 minutes in a heating chamber of the vacuum evaporation apparatus, and then the substrate 102 was cooled down for about 30 minutes.

Next, the substrate 102 was fixed to a holder in the vacuum evaporation apparatus so that a side on which the first electrode 104 was provided faced downward. In this embodiment, the hole-injection layer 131, the hole-transport layer 132, a light-emitting layer 116, the electron-transport layer 133, an electron-injection layer 134(1), an electron-injection layer 134(2), and the second electrode 114 were sequentially formed by a vacuum evaporation method.

First, the pressure in the vacuum evaporation apparatus was reduced to about $1\times10^{-4}$ Pa. Then, 3-[4-(9-phenanthryl)-phenyl]-9-phenyl-9H-carbazole (abbreviation: PCPPn) and molybdenum oxide were deposited by co-evaporation at a weight ratio of 2·1 (=PcPPn: molybdenum oxide), whereby the hole-injection layer 131 was formed over the first electrode 104. Note that the thickness of the hole-injection layer 131 was 20 nm.

Then, the hole-transport layer 132 was formed over the hole-injection layer 131. As the hole-transport layer 132, PCPPn was evaporated. Note that the thickness of the hole-transport layer 132 was 20 nm.

Next, the light-emitting layer 116 was formed over the hole-transport layer 132. As the light-emitting layer 116, 7-[4-(10-phenyl-9-anthryl)phenyl]-7H-dibenzo[cg]carbazole (abbreviation: cgDBCzPA) and N,N-bis(3-methylphenyl)-N,N-bis[3-(9-phenyl-9H-fluoren-9-yl)phenyl]pyrene-1,6-diamine (abbreviation: 1,6mMemFLPAPrn) were deposited by co-evaporation at a weight ratio of 1:0.03 (=cgDBCzPA:1,6mMemFLPAPrn). Note that the thickness of the light-emitting layer 116 was 20 nm. In the light-

TABLE 1

| | Layer | Reference numeral | Thickness (nm) | Material | Weight ratio |
|---|---|---|---|---|---|
| Light-emitting element 1 | Second electrode | 114 | 200 | Al | — |
| | Electron-injection layer | 134(2) | 1 | LiF | — |
| | | 134(1) | 15 | Bphen | — |
| | Electron-transport layer | 133 | 10 | cgDBCzPA | — |
| | Light-emitting layer | 116 | 20 | cgDBCzPA:1,6mMemFLPAPrn | 1:0.03 |
| | Hole-transport layer | 132 | 20 | PCPPn | — |
| | Hole-injection layer | 131 | 20 | PCPPn:MoOx | 2:1 |
| | First electrode | 104 | 70 | ITSO | — |
| Light-emitting element 2 | Second electrode | 114 | 200 | Al | — |
| | Electron-injection layer | 134(2) | 1 | LiF | — |
| | | 134(1) | 15 | Bphen | — |
| | Electron-transport layer | 133 | 10 | 3,5DCzPPy | — |
| | Light-emitting layer | 116(2) | 10 | 3,5DCzPPy:Ir(mpptz-diPrp)₃ | 1:0.06 |
| | | 116(1) | 30 | PCCP:3,5DCzPPy:Ir(mpptz-diPrp)₃ | 1:0.3:0.06 |
| | Hole-transport layer | 132 | 20 | PCCP | — |
| | Hole-injection layer | 131 | 20 | DBT3P-II:MoOx | 2:1 |
| | First electrode | 104 | 70 | ITSO | — |

<1-3. Method for Fabricating Light-Emitting Element 1>

As the first electrode 104, an oxide containing silicon, indium, and tin (abbreviation: ITSO) was deposited over the substrate 102 by a sputtering method. Note that the thickness of the first electrode 104 was 70 nm, and the area of the first electrode 104 was 4 mm² (2 mm×2 mm).

Next, as pretreatment of evaporation of an organic compound layer, the first electrode 104 side of the substrate 102 emitting layer 116, cgDBCzPA serves as a host material and 1,6mMemFLPAPrn serves as a guest material.

After that, as the electron-transport layer 133, cgDBCzPA was deposited over the light-emitting layer 116 by evaporation to a thickness of 10 nm. Then, as the electron-injection layer 134(1), bathophenanthroline (abbreviation: Bphen) was deposited over the electron-transport layer 133 by evaporation to a thickness of 15 nm. Then, as the electron-injection layer 134(2), lithium fluoride (LiF) was deposited over the electron-injection layer 134(1) by evaporation to a thickness of 1 nm.

Then, as the second electrode 114, aluminum (Al) was deposited over the electron-injection layer 134(2) by evaporation. Note that the thickness of the second electrode 114 was 200 nm.

The light-emitting element over the substrate 102 fabricated as described above was sealed by being bonded to a sealing substrate (not illustrated) in a glove box in a nitrogen atmosphere so as not to be exposed to the air (specifically, a sealant was applied to surround the element, and irradiation with ultraviolet light having a wavelength of 365 nm at 6 J/cm$^2$ and heat treatment at 80° C. for one hour were performed for sealing).

Through the above process, the light-emitting element 1 was fabricated.

<1-4. Method for Fabricating Light-Emitting Element 2>

First, as the first electrode 104, ITSO was deposited over the substrate 102 by a sputtering method. Note that the thickness of the first electrode 104 was 70 nm, and the area of the first electrode 104 was 4 mm$^2$ (2 mm×2 mm).

Next, as pretreatment of evaporation of an organic compound layer, the first electrode 104 side of the substrate 102 was washed with water, baking was performed at 200° C. for one hour, and then UV ozone treatment was performed on a surface of the first electrode 104 for 370 seconds.

After that, the substrate 102 was transferred into a vacuum evaporation apparatus where the pressure had been reduced to about 1×10$^{-4}$ Pa, and was subjected to vacuum baking at 170° C. for 60 minutes in a heating chamber of the vacuum evaporation apparatus, and then the substrate 102 was cooled down for about 30 minutes.

Next, the substrate 102 was fixed to a holder in the vacuum evaporation apparatus so that a side on which the first electrode 104 was provided faced downward. In this embodiment, the hole-injection layer 131, the hole-transport layer 132, a light-emitting layer 116(1), a light-emitting layer 116(2), the electron-transport layer 133, the electron-injection layer 134(1), the electron-injection layer 134(2), and the second electrode 114 were sequentially formed by a vacuum evaporation method.

First, after reducing the pressure of the vacuum evaporation apparatus to 1×10$^{-4}$ Pa, 4,4',4"-(benzene-1,3,5-triyl)tri (dibenzothiophene) (abbreviation: DBT3P-II) and molybdenum oxide were deposited by co-evaporation at a weight ratio of 2:1 (=DBT3P-II: molybdenum oxide), whereby the hole-injection layer 131 was formed over the first electrode 104. Note that the thickness of the hole-injection layer 131 was 20 nm.

Then, the hole-transport layer 132 was formed over the hole-injection layer 131. As the hole-transport layer 132, 9-phenyl-9H-3-(9-phenyl-9H-carbazol-3-yl)carbazole (abbreviation: PCCP) was deposited by evaporation. Note that the thickness of the hole-transport layer 132 was 20 nm.

Next, the light-emitting layer 116(1) was formed over the hole-transport layer 132. As the light-emitting layer 116(1), PCCP, 3,5-bis[3-(9H-carbazol-9-yl)phenyl]pyridine (abbreviation: 3,5DCzPPy), and tris{2-[5-(2-methylphenyl)-4-(2, 6-diisopropylphenyl)-4H-1,2,4-triazol-3-yl-κN2]phenyl-κC}iridium(TT) (abbreviation: Ir(mpptz-diPrp)$_3$) were deposited by co-evaporation at a weight ratio of 1:0.3:0.06 (=. PCCP:3,5DCzPPy:Ir(mpptz-diPrp)$_3$). Note that the thickness of the light-emitting layer 116(1) was 30 nm. Note that in the light-emitting layer 116(1), PCCP serves as a host material, 3,5DCzPPy serves as an assist material, and Ir(mpptz-diPrp)$_3$ serves as a guest material.

Next, the light-emitting layer 116(2) was formed over the light-emitting layer 116(1). As the light-emitting layer 116 (2), 3,5DCzPPy and Ir(mpptz-diPrp)$_3$ were deposited by co-evaporation at a weight ratio of 1:0.06 (=3,5DCzPPy:Ir (mpptz-diPrp)$_3$). Note that the thickness of the light-emitting layer 116(2) was 10 nm. Note that in the light-emitting layer 116(2), 3,5DCzPPy serves as a host material, and Ir(mpptz-diPrp)$_3$ serves as a guest material.

After that, as the electron-transport layer 133, 3,5DCzPPy was deposited over the light-emitting layer 116(2) by evaporation to a thickness of 10 nm. Then, as the electron-injection layer 134(1), Bphen was deposited over the electron-transport layer 133 by evaporation to a thickness of 15 nm. Then, as the electron-injection layer 134(2), LiF was deposited over the electron-injection layer 134(1) by evaporation to a thickness of 1 nm.

Then, as the second electrode 114, aluminum (Al) was deposited over the electron-injection layer 134(2) by evaporation. Note that the thickness of the second electrode 114 was 200 nm.

The light-emitting element over the substrate 102 fabricated as described above was sealed by being bonded to a sealing substrate (not illustrated) in a glove box in a nitrogen atmosphere so as not to be exposed to the air. Note that the sealing method was the same as that of the light-emitting element 1.

Through the above process, the light-emitting element 2 was fabricated.

Note that in all the above evaporation steps for the light-emitting elements 1 and 2, a resistive heating method was used as an evaporation method.

<1-5. Characteristics of Light-Emitting Elements 1 and 2>

Next, characteristics of the fabricated light-emitting elements 1 and 2 were measured. Note that the light-emitting elements 1 and 2 were measured at room temperature (in an atmosphere kept at 25° C.).

Figure 4A:
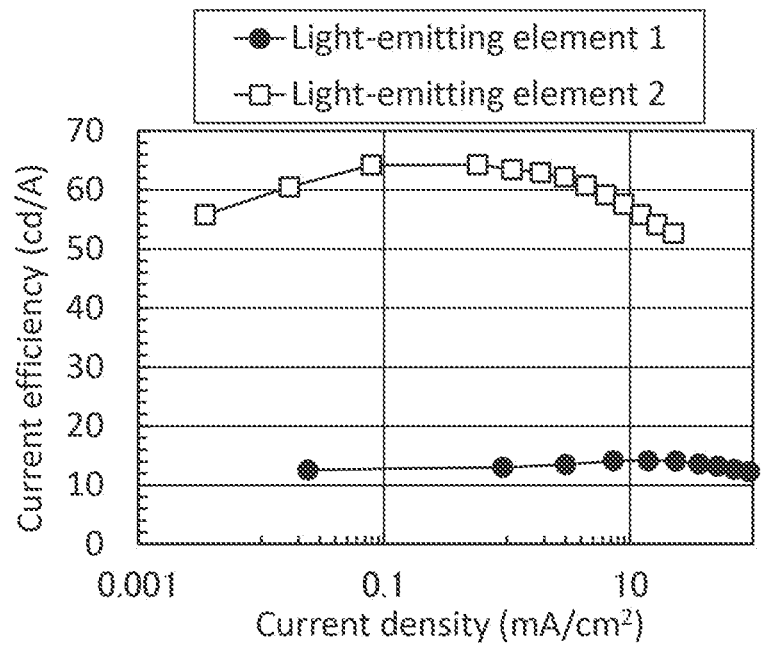
FIGS. 4A and 4B show characteristics of a light-emitting element 1 and a light-emitting element 2.
Figure 4B:
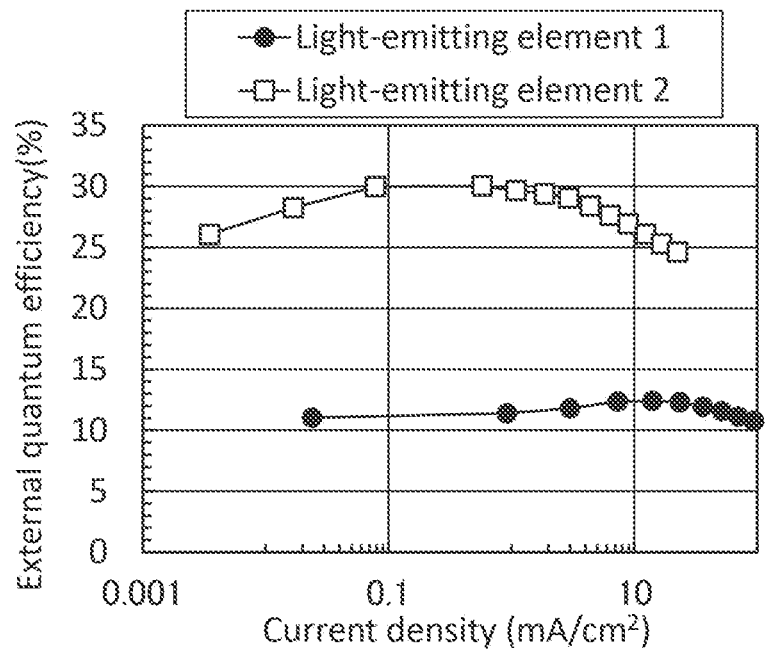

FIG. 4A shows the current efficiency vs. current density characteristics of the light-emitting elements 1 and 2. FIG. 4B shows the external quantum efficiency vs. current density characteristics of the light-emitting elements 1 and 2. The major element characteristics of the light-emitting elements 1 and 2 when the current densities thereof are 5 mA/cm$^2$ are shown in Table 2.

TABLE 2

|  | Current density (mA/cm$^2$) | CE (cd/A) | EQE (%) | Luminance (cd/m$^2$) | CIE(x) | CIE(y) |
| --- | --- | --- | --- | --- | --- | --- |
| Light-emitting element 1 | 5 | 14 | 12 | 700 | 0.14 | 0.16 |
| Light-emitting element 2 | 5 | 60 | 28 | 3000 | 0.17 | 0.38 |

Note that in Table 2, CE represents current efficiency, EQE represents external quantum efficiency, and CIB represents chromaticity (chromaticity coordinates in the CIE 1976 chromaticity system).

As shown in FIGS. 4A and 4B and Table 2, the current efficiency and the external quantum efficiency of the light-emitting element including a phosphorescent material (light-emitting element 2) are 4.3 times and 2.3 times, respectively, as high as those of the light-emitting element including a fluorescent material (light-emitting element 1). The light-emitting element including a phosphorescent material (light-emitting element 2) thus has higher emission efficiency than the light-emitting element including a fluorescent material (light-emitting element 1).

Figure 5:
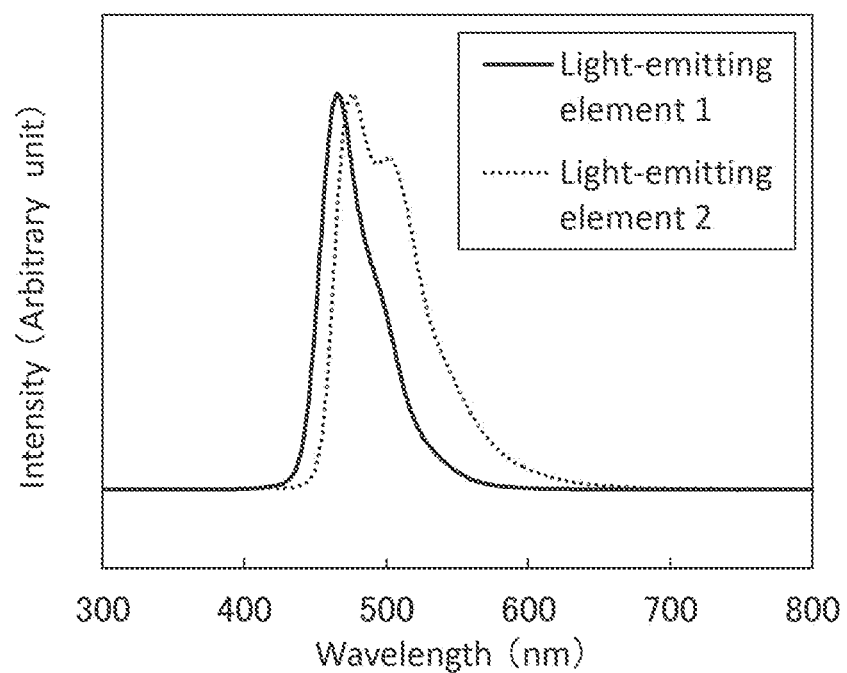
FIG. 5 shows emission spectra of the light-emitting element 1 and the light-emitting element 2.

FIG. 5 shows emission spectra when a current at a current density of 2.5 mA/cm² was supplied to the light-emitting elements 1 and 2.

As shown in FIG. 5 and Table 2, emission spectra of the light-emitting elements 1 and 2 each have a peak in a blue wavelength range. In other words, the emission color of light from the light-emitting layer 1 is the same as or similar to the emission color of light from the light-emitting layer 2. Note that the peak of the emission spectrum of the light-emitting element 1 was 465 nm, and the peak of the emission spectrum of the light-emitting element 2 was 476 nm. In other words, the fluorescent material exhibits emission at a shorter wavelength than the phosphorescent material and the difference between the emission peaks is 11 nm.

<1-6. Luminance Degradation of Light-Emitting Elements 1 and 2>

Next, luminance degradation of the light-emitting elements 1 and 2 was evaluated. As a method for evaluating the luminance degradation, the light-emitting element 1 and the light-emitting element 2 were subjected to constant driving at a current density of 36.3 mA/cm² (initial luminance of 4930 cd/m²) and a current density of 2.03 mA/cm² (initial luminance of 1270 cd/m²), respectively.

Figure 6:
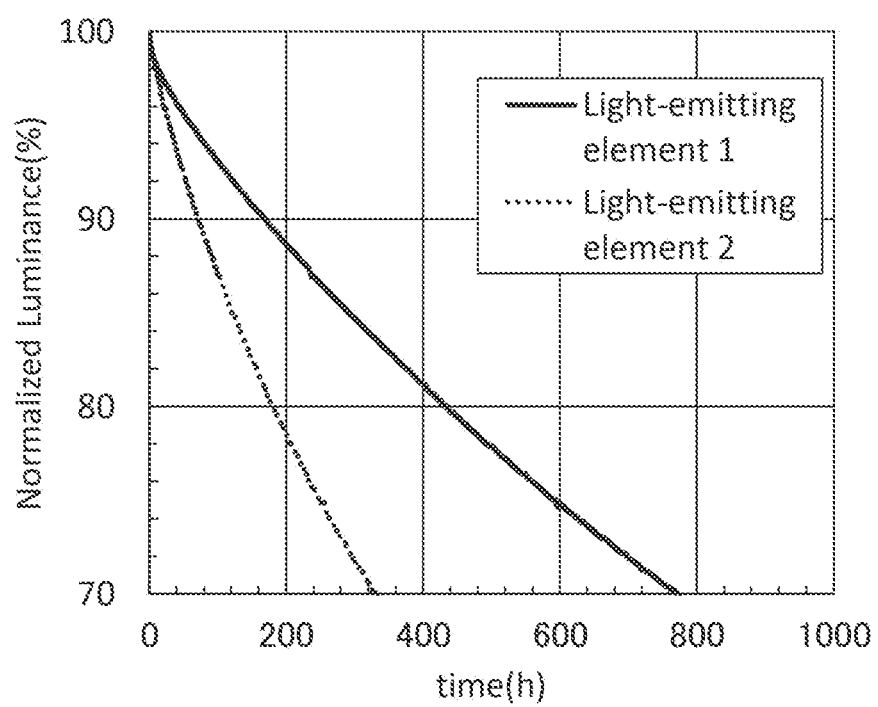
FIG. 6 shows luminance degradation of the light-emitting element 1 and the light-emitting element 2.

The evaluation result of the luminance degradation is shown in FIG. 6. In FIG. 6, the vertical axis represents normalized luminance (%) with the initial luminance of 100%, and the horizontal axis represents driving time (h) of the element.

As shown in FIG. 6, the normalized luminance of the light-emitting element including a fluorescent material (light-emitting element 1) is degrading more slowly than that of the light-emitting element including a phosphorescent material (light-emitting element 2). In other words, the light-emitting element including a fluorescent material (light-emitting element 1) has a longer lifetime than the light-emitting element including a phosphorescent material (light-emitting element 2).

Note that in FIG. 6, the light-emitting element including a fluorescent material (light-emitting element 1) and the light-emitting element including a phosphorescent material (light-emitting element 2) are each driven at a different current density, i.e., a different luminance; however, in the case of being driven at the same luminance, the light-emitting element including a fluorescent material (light-emitting element 1) has a much longer lifetime than the light-emitting element including a phosphorescent material (light-emitting element 2).

As described above, the light-emitting element including a phosphorescent material has higher efficiency but a shorter lifetime than the light-emitting element including a fluorescent material. In contrast, the light-emitting element including a fluorescent light-emitting element has lower efficiency but a longer lifetime than the light-emitting element including a phosphorescent material.

In view of this, with a stack of a light-emitting layer including a fluorescent material and a light-emitting layer including a phosphorescent material as the light-emitting element of one embodiment of the present invention, a light-emitting element with high efficiency and a long lifetime can be achieved. In addition, the emission color of light from the fluorescent material is preferably the same as or similar to the emission color of light from the phosphorescent material. For example, a difference in peak value between an emission spectrum of light from the light-emitting layer including a fluorescent material and an emission spectrum of light from the light-emitting layer including a phosphorescent material is 30 nm or less, preferably 20 nm or less, and further preferably 15 nm or less. It is preferable in terms of reliability that the emission wavelength of the fluorescent material be located on the shorter wavelength side than the phosphorescent material. A difference in peak value of the emission spectrum between the materials is preferably 5 nm or more.

<1-7. Calculation Results of Initial Characteristics>

Here, initial characteristics of the light-emitting element of one embodiment of the present invention, i.e., a light-emitting element in which a light-emitting layer including a fluorescent material and a light-emitting layer including a phosphorescent material are stacked (hereinafter referred to as a light-emitting element 3) was calculated.

Note that the calculation was made on the basis of the following three hypotheses:
(1) the ratio of excitons generated in the light-emitting layer including a fluorescent material to excitons generated in the light-emitting layer including a phosphorescent material was 0.8 to 0.2;
(2) the lifetime of a light-emitting element including the fluorescent material was inversely proportional to the initial luminance to the power of 1.8, and the lifetime of a light-emitting element including the phosphorescent material was inversely proportional to the initial luminance to the power of 2.0 (note that in one embodiment of the present invention, accelerating factor for luminance of the fluorescent material is preferably higher than accelerating factor for luminance of the phosphorescent material because such accelerating factor for luminance is higher in a phosphorescent material in many cases); and
(3) the shapes of their luminance degradation curves were the same and did not depend on their initial characteristics.

Note that the ratio of generated excitons is not limited to the above and can be set to an optimal ratio as appropriate by a practitioner.

Calculation results are shown in Table 3. Note that Table 3 shows calculation results of major element characteristics of the light-emitting element 3.

TABLE 3

| | Current density (mA/cm²) | CE (cd/A) | EQE (%) | Luminance (cd/m²) | Fluorescent luminance (cd/m²) | Phosphorescent luminance (cd/m²) | CIE(x) | CIE(y) |
|---|---|---|---|---|---|---|---|---|
| Light-emitting element 3 | 5 | 23.2 | 15.2 | 1160 | 560 | 600 | 0.15 | 0.23 |

The element characteristics of the light-emitting element 3 were calculated on the basis of the element characteristics of the light-emitting elements 1 and 2 in Table 2. Efficiency (current efficiency and external quantum efficiency) of the light-emitting element 3 can be obtained from the following formula 1.

Efficiency of light-emitting element 3=(efficiency of light-emitting element 1)×0.8+(efficiency of light-emitting element 2)×0.2  [Formula 1]

Note that the luminance of the light-emitting element 3 can be obtained by similar calculation. That is, the luminance of the light-emitting element 3 in Table 3 is a value (1160 cd/m$^2$) obtained by adding a luminance of 560 cd/m$^2$ which is obtained by multiplying the luminance of the light-emitting element 1 (700 cd/m$^2$) by 0.8 to a luminance of 600 cd/m$^2$ which is obtained by multiplying the luminance of the light-emitting element 2 (3000 cd/m$^2$) by 0.2. Note that in Table 3, the luminance of the light-emitting layer including a fluorescent material and the luminance of the light-emitting layer including a phosphorescent material are represented as fluorescent luminance and phosphorescent luminance, respectively.

According to the results shown in Table 2 and Table 3, the current efficiency and the external quantum efficiency of the light-emitting element 3 are 1.7 times and 1.3 times, respectively, as high as those of the light-emitting element 1.

<1-8. Calculation Results of Luminance Degradation>

Next, degradation curves when the light-emitting elements 1 to 3 are each driven at a luminance of 1160 cd/m$^2$ were calculated. Calculation results are shown in FIG. 7.

Figure 7:
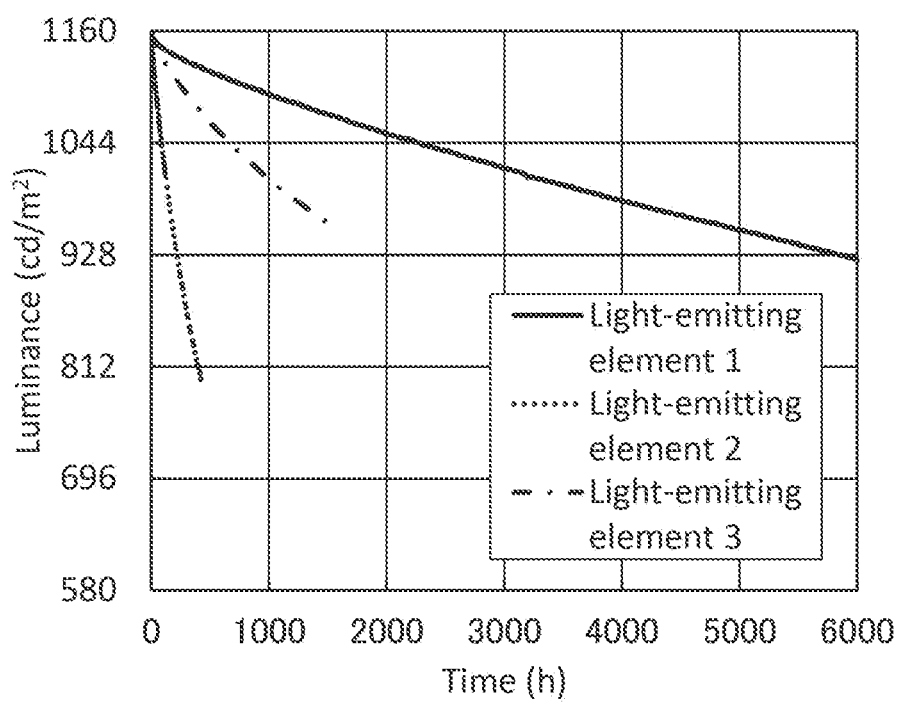
FIG. 7 shows luminance degradation of the light-emitting element 1, the light-emitting element 2, and a light-emitting element 3.

The luminance degradation curve of the light-emitting element 1 in FIG. 7 was (4930/1160)$^{1.8}$, times of that in FIG. 6, and the luminance degradation curve of the light-emitting element 2 in FIG. 7 was (1270/1160)$^2$ times of that in FIG. 6. A luminance degradation curve which was obtained by assuming that the light-emitting element 1 was driven at a luminance of 560 cd/m$^2$ and a luminance degradation curve which was obtained by assuming that the light-emitting element 2 was driven at a luminance of 600 cd/m$^2$ were calculated by a method similar to the above, and the two luminance degradation curves were added together to obtain the luminance degradation curve of the light-emitting element 3.

As shown in FIG. 7, the driving times required for 80% of initial luminance of the light-emitting elements, i.e., 928 cd/cm$^2$ are about 6000 hours in the light-emitting element 1, about 220 hours in the light-emitting element 2, and about 2000 hours in the light-emitting element 3. In other words, the lifetime of the light-emitting element 3 is almost one-third of that of the light-emitting element 1 and almost 9 times as long as that of the light-emitting element 2.

Here, the results of the cases in which the element characteristics of the light-emitting element 1 and the light-emitting element 2 were normalized by the light-emitting element 3 (normalized CE, normalized EQE, and normalized lifetime) are shown in Table 4. Note that in Table 4, when initial luminance is assumed to be 100V, normalized lifetime (LT80) corresponds to time required for 80% of luminance of the initial luminance.

TABLE 4

|  | Normalized CE | Normalized EQE | Normalized lifetime (LT80) | CIE(x) | CIE(y) |
| --- | --- | --- | --- | --- | --- |
| Light-emitting element 1 | 0.60 | 0.79 | 3.0 | 0.14 | 0.16 |
| Light-emitting element 2 | 2.6 | 1.84 | 0.11 | 0.17 | 0.38 |
| Light-emitting element 3 | 1 | 1 | 1 | 0.15 | 0.23 |

As shown in Table 4, the light-emitting element 3 of one embodiment of the present invention has higher efficiency than the light-emitting element 1 and has a longer lifetime than the light-emitting element 2. Specifically, the lifetime of the light-emitting element 3 is 9 times as long as that of the light-emitting element 2 including only a phosphorescent material, and the light-emitting element 3 has a high effect on a long lifetime despite a mere reduction in emission efficiency by about 60% in CE and about 45% in EQE as compared with the light-emitting element 2. This is an effect that cannot be expected, but the factor of the effect is probably due to a difference in luminance (current) accelerating factor between phosphorescence and fluorescence and a difference in current efficiency, which affect each other. Moreover, the emission efficiency of the light-emitting element 3 is higher than at least the emission efficiency of the light-emitting element 1 including only a fluorescent material. That is, the light-emitting element of one embodiment of the present invention can theoretically obtain higher emission efficiency than the light-emitting element including only a fluorescent material while maintaining a lifetime that is necessary to fabricate a product even with a blue phosphorescent material.

Note that the ratio of excitons generated in a fluorescent light-emitting layer to excitons generated in a phosphorescent light-emitting layer is preferably in the range of 0.9:0.1 to 0.5:0.5 from the these calculation results.

<1-9. Description of Components of Light-Emitting Elements>

Next, details of components of the light-emitting element 100 in FIGS. 1A and 1B and FIGS. 2A and 2B will be described.

[Substrate]

The substrate 102 is used as a support of the light-emitting element 100. For the substrate 102, glass, quartz, plastic, or the like can be used, for example. Alternatively, a flexible substrate can be used. A flexible substrate is a substrate that can be bent; examples of the flexible substrate include a plastic substrate made of a polycarbonate, a polyarylate, or a polyethersulfone. A film (made of polypropylene, a polyester, poly(vinyl fluoride), poly(vinyl chloride), or the like), an inorganic vapor-deposited film, or the like can be used.

The substrate may be formed with any other material that can serve as a support in a fabrication process of the light-emitting element 100. The light-emitting element 100 can be formed using a variety of substrates, for example. The type of the substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of a glass substrate include a barium borosilicate glass substrate, an aluminoborosilicate glass substrate, and a soda lime glass substrate. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate, and the light-emitting element 100 may be provided directly on the flexible substrate. Alternatively, a separation layer may be provided between the substrate and the light-emitting element 100. The separation layer can be used when part or the whole of the light-emitting element 100 formed over the separation layer is completed, separated from the substrate, and transferred to another substrate. In such a case, the light-emitting element 100 can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, after the light-emitting element 100 is formed using a substrate, the light-emitting element 100 may be transferred to another substrate. Examples of a substrate to which the light-emitting element 100 is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, the light-emitting element 100 with high durability, the light-emitting element 100 with high heat resistance, the light-emitting element 100 that is lightweight, or the light-emitting element 100 that is thin can be obtained.

[Pair of Electrodes]

As the first electrode 104 and the second electrode 114, a metal, an alloy, an electrically conductive compound, a mixture thereof, and the like can be used. Specific examples include an oxide containing indium and tin (typically, indium tin oxide (ITO)), an oxide containing silicon, indium, and tin (ITSO), an oxide containing indium, zinc, tungsten, and zinc, gold (Au), platinum (Pt), nickel (Ni), tungsten (W), chromium (Cr), molybdenum (Mo), iron (Fe), cobalt (Co), copper (Cu), palladium (Pd), and titanium (Ti). In addition, any of the following materials can be used: elements that belong to Group 1 or Group 2 of the periodic table, that is, alkali metals such as lithium (Li) and cesium (Cs) or alkaline earth metals such as calcium (Ca) and strontium (Sr), magnesium (Mg), and alloys containing at least one of the metals (e.g., Mg—Ag and Al—Li); rare earth metals such as europium (Eu) and ytterbium (Yb), and alloys containing at least one of the metals; and graphene. The first electrode 104 and the second electrode 114 can be formed by, for example, a sputtering method, an evaporation method (including a vacuum evaporation method), or the like.

One or both of the first electrode 104 and the second electrode 114 have light-transmitting properties so that light emission from the EL layer 108 can be extracted to the outside.

[First Light-Emitting Layer]

A material whose emission spectrum has a peak in a blue wavelength range is preferable for the fluorescent material of the first light-emitting layer 110. However, the fluorescent material of the first light-emitting layer 110 is not limited thereto, and a material whose emission spectrum has a peak in a green, yellow, or red wavelength range may be used.

Examples of the fluorescent material of the first light-emitting layer 110 include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), and N,N-bis(dibenzothiophen-2-yl)-N,N-diphenylpyrene-1,6-diamine (abbreviation: 1,6ThAPrn).

An anthracene derivative or a tetracene derivative is preferably used as the host material of the first light-emitting layer 110. This is because these derivatives each have a high $S_1$ level and a low $T_1$ level. Specific examples include 9-phenyl-3-[4-(10-phenyl-9-anthryl)phenyl]-9H-carbazole (abbreviation: PCzPA), 3-[4-(I-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). Besides, 5,12-diphenyltetracene, 5,12-bis(biphenyl-2-yl)tetracene, and the like can be given.

[Second Light-Emitting Layer]

A material whose emission spectrum has a peak in a blue wavelength range is preferable for the phosphorescent material of the second light-emitting layer 112. However, the phosphorescent material of the second light-emitting layer 112 is not limited thereto, and a material whose emission spectrum has a peak in a green, yellow, or red wavelength range may be used.

As the phosphorescent material of the second light-emitting layer 112, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a triazole ligand, a pyridine ligand, a pyrimidine ligand, a pyrazine ligand, a triazine ligand, a quinoline ligand, an isoquinoline ligand, or the like can be given. As the metal complex, a platinum complex having a porphyrin ligand or the like can be given.

As specific examples of the organoiridium complex, iridium complexes having a triazole ligand, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris{2-[5-(2-methylphenyl)-4-(2,6-diisopropylphenyl)-4H-1,2,4-triazol-3-yl-κN2]phenyl-κC}indium(III) (abbreviation: Ir(mpptz-diPrp)$_3$), tris(2-[4-{1-adamantyl}-3-methyl-4H-1,2,4-triazol-5-yl-N]phenyl- κC}iridium(III) (abbreviation: Ir(Mptz-Adm1)₃), tris{2-[4-(2-adamantyl)-3-methyl-4H-1,2,4-triazol-5-yl-κN]phenyl-κC}iridium(III) (abbreviation: Ir(Mptz-Adm2)₃), and tris{2-[4-(2-norbornyl)-3-methyl-4H-1,2,4-triazol-5-yl-κN]phenyl-κC}iridium(III) (abbreviation: Ir(Mptz-Nb)₃), are preferable as a blue phosphorescent material. Moreover, an iridium complex having an imidazole ligand, such as tris(3-(2,4,6-trimethylphenyl)-4H-imidazol-3-yl-N2)phenyl-κCirridium(III) (abbreviation: Ir(tmppim)₃) or tris[1-(3,5-diisopropylphenyl)-2-phenyl-1H-imidazol-C2,N]iridium (III) (abbreviation: Ir(biprpim)₃) can also be used as a blue phosphorescent material.

Examples of the host material of the second light-emitting layer 112 include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples are an aromatic amine and a carbazole derivative.

As the assist material of the second light-emitting layer 112, a substance which can form an exciplex together with the host material is preferably used. In this case, it is preferable that the host material, the assist material, and the phosphorescent material be selected such that the emission peak of the exciplex overlaps with an absorption band, specifically an absorption band on the longest wavelength side, of a triplet metal to ligand charge transfer (MLCT) transition of the phosphorescent material. This makes it possible to provide a light-emitting element with drastically improved emission efficiency. However, a material exhibiting thermally activated delayed fluorescence (TADF) may be used instead of the phosphorescent material. This is because the behavior of the TADF material in elements is similar to that of a phosphorescent material because emission energy of the TADF material is substantially close to the triplet excitation energy (e.g., in the case of using a blue TADF material, triplet excitation energy of a peripheral material such as the host material needs to be as high as that in the case of using a blue phosphorescent material). In the case of using the TADF material, it is preferable that an absorption band on the longest wavelength side be an absorption band of a singlet. Note that the TADF material is a substance that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is more than 0 eV and less than or equal to 0.2 eV, preferably more than 0 eV and less than or equal to 0.1 eV.

[Hole-Injection Layer and Hole-Transport Layer]

The hole-injection layer 131 is a layer that injects holes into the first light-emitting layer 110 through the hole-transport layer 132 with a high hole-transport property and includes a hole-transport material and an acceptor material. When a hole-transport material and an acceptor material are included, electrons are extracted from the hole-transport material by the acceptor substance to generate holes, and the holes are injected into the first light-emitting layer 110 through the hole-transport layer 132. The hole-injection layer 131 may have a structure in which a hole-transport material and an acceptor material are stacked. Note that the hole-transport layer 132 is formed using a hole-transport material.

Specific examples of the hole-transport materials used for the hole-injection layer 131 and the hole-transport layer 132 include aromatic amine compounds such as 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N'-diphenylamino)triphenylamine (abbreviation: TDATA), 4,4',4"-tris[N-3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Alternatively, the following carbazole derivatives can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). These materials described here are mainly materials each having a hole mobility of greater than or equal to $1 \times 10^{-6}$ cm²/Vs. Note that any other material may be used as long as the material has a hole-transport property higher than an electron-transport property.

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

Examples of the acceptor material used in the hole-injection layer 131 include compounds having an electron-withdrawing group (a halogen group or a cyano group) such as 7,7,8,8-tetracyano-2,3,5,6-tetrafluoroquinodimethane (abbreviation: F₄-TCNQ), chloranil, and 2,3,6,7,10,11-hexacyano-1,4,5,8,9,12-hexaazatriphenylene (HAT-CN). In particular, a compound in which electron-withdrawing groups are bonded to a condensed aromatic ring having a plurality of hetero atoms, like HAT-CN, is thermally stable and preferable. Furthermore, the examples also include transition metal oxides. Moreover, the examples include oxides of metals belonging to Groups 4 to 8 of the periodic table. Specifically, it is preferable to use vanadium oxide, niobium oxide, tantalum oxide, chromium oxide, molybdenum oxide, tungsten oxide, manganese oxide, and rhenium oxide because of their high electron accepting properties. Among them, molybdenum oxide is particularly preferable because of its stability in the atmosphere, low hygroscopic property, and easiness of handling.

Note that the hole-injection layer 131 may be formed of the above-described acceptor material alone or of the above-described acceptor material and another material in combination. In this case, the acceptor material extracts electrons from the hole-transport layer, so that holes can be injected into the hole-transport layer. The acceptor material transfers the extracted electrons to the anode.

[Electron-Transport Layer]

The electron-transport layer 133 is a layer including a material with a high electron-transport property. For the electron-transport layer 133, a metal complex such as Alq₃, tris(4-methyl-8-quinolinolato)aluminum (abbreviation: Almq₃), bis(10-hydroxybenzo[h]quinolinato)beryllium (abbreviation: BeBq₂), BAlq, Zn(BOX)₂, or bis[2-(2-hydroxyphenyl)benzothiazolato]zinc (abbreviation: Zn(BTZ)₂) can be used. Furthermore, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen, bathocuproine (abbreviation: BCP), or 4,4'-bis(5-methylbenzoxazol-2-yl) stilbene (abbreviation: BzOs) can also be used. Further alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2-bipyridine-6,6-diyl)] (abbreviation: PF-BPy). These materials described here are mainly materials each having an electron mobility of greater than or equal to $1\times10^{-6}$ cm$^2$/Vs. Note that other than the above-described materials, a material that has a property of transporting more holes than electrons may be used. Note that any other material may be used for the electron-transport layer 133 as long as the material has an electron-transport property higher than a hole-transport property.

The electron-transport layer 133 is not limited to a single layer, and may be a stack of two or more layers each containing any of the above-described materials.

[Electron-Injection Layer]

The electron-injection layer 134 is a layer including a material with a high electron-injection property. For the electron-injection layer 134, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 134. Examples of the electride include a material in which electrons are added at high concentration to calcium oxide-aluminum oxide.

Alternatively, the electron-injection layer 134 may be formed using a composite material in which an organic compound and an electron donor (donor) are mixed. The composite material is superior in an electron-injection property and an electron-transport property because electrons are generated in the organic compound by the electron donor. The organic compound here is preferably a material excellent in transporting the generated electrons; specifically, for example, the materials for forming the electron-transport layer 133 (e.g., a metal complex or a heteroaromatic compound) can be used. As the electron donor, a material showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

Note that the above-described light-emitting layer, the hole-transport layer, the hole-injection layer, the electron-transport layer, and the electron-injection layer can each be formed by any of the following methods: a sputtering method, an evaporation method (including a vacuum evaporation method), a printing method (such as relief printing, intaglio printing, gravure printing, planography printing, and stencil printing), an ink jet method, a coating method, and the like.

The structure described in this embodiment can be used in appropriate combination with any of the structures described in the other embodiments.

Embodiment 2

In this embodiment, an emission mechanism of the light-emitting element 100 described in Embodiment 1 will be described with reference to FIGS. 8A and 8B, FIGS. 9A and 9B, and FIGS. 10A and 10B.

<2-1. Emission Mechanism of Light-Emitting Element>

First, an emission mechanism of the light-emitting element 100 will be described.

In the light-emitting element 100 of one embodiment of the present invention, voltage application between a pair of electrodes (the first electrode 104 and the second electrode 114) causes electrons and holes to be injected from the cathode and the anode, respectively, into the EL layer 108 and thus current flows. By recombination of the injected electrons and holes, a guest material (a fluorescent material and a phosphorescent material) in the first light-emitting layer 110 and the second light-emitting layer 112 is brought into an excited state to provide light emission.

<2-2. Emission Mechanism 1 of First Light-Emitting Layer>

Next, an emission mechanism of the first light-emitting layer 110 of the light-emitting element 100 will be described.

Figure 8A:
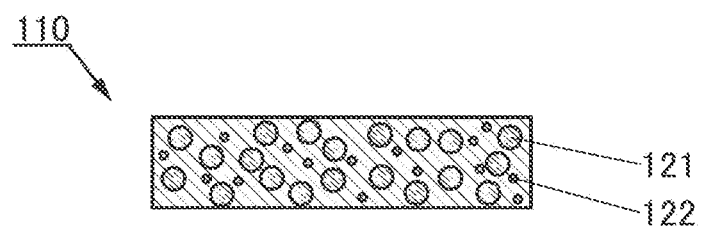
FIGS. 8A and 8B are a schematic cross-sectional view of a light-emitting element and a diagram illustrating the correlation of energy levels in a light-emitting layer.

FIG. 8A is an example of a schematic cross-sectional view of the first light-emitting layer 110. The first light-emitting layer 110 in FIG. 8A includes a host material 121 and a guest material 122.

It is preferable that the host material 121 have a difference of 0.2 eV or less between a singlet excitation energy level and a triplet excitation energy level. It is particularly preferable that the host material 121 be a material which exhibits thermally activated delayed fluorescence at room temperature. Note that the host material 121 may be composed of a single material or may include a plurality of materials. The guest material 122 may be a light-emitting organic compound, and the light-emitting organic compound is preferably a fluorescent material. An example in which a fluorescent material is used as the guest material 122 will be described below.

Note that light emission from the guest material 122 can be obtained through the following two processes:

(α) direct recombination process; and (β1) energy transfer process.

<2-3. (α) Direct Recombination Process>

Carriers (electrons and holes) are recombined in the guest material 122, and the guest material 122 is brought into an excited state. In the case where the excited state of the guest material 122 is a singlet excited state, fluorescence is obtained. In contrast, in the case where the excited state of the guest material 122 is a triplet excited state, thermal deactivation occurs.

In (α) direct recombination process, high emission efficiency can be obtained when the fluorescence quantum efficiency of the guest material 122 is high.

<2-4. (β1) Energy Transfer Process>

Carriers are recombined in the host material 121, and the host material 121 is brought into an excited state. In the case where the excited state of the host material 121 is a singlet excited state and the singlet excitation energy level of the host material 121 is higher than the singlet excitation energy level of the guest material 122, excitation energy is transferred from the host material 121 to the guest material 122, and thus the guest material 122 is brought into a singlet excited state. Fluorescence is obtained from the guest material 122 in the singlet excited state. Therefore, the singlet excitation energy level of the host material 121 is preferably higher than the singlet excitation energy level of the guest material 122.

Note that since direct transition of the guest material 122 from a singlet ground state to a triplet excited state is forbidden, energy transfer from the singlet excited state of the host material 121 to the triplet excited state of the guest material 122 is unlikely to be a main energy transfer process; therefore, a description thereof is omitted here. In other words, energy transfer from the singlet excited state of the host material 121 to the singlet excited state of the guest material 122 is important as represented by the following general formula (G1).

Note that in the general formula (G1), $^1H^*$ represents the singlet excited state of the host material 121; $^1G$ represents the singlet ground state of the guest material 122; H represents the singlet ground state of the host material 121; and $^1G^*$ represents the singlet excited state of the guest material 122.

Figure 8B:
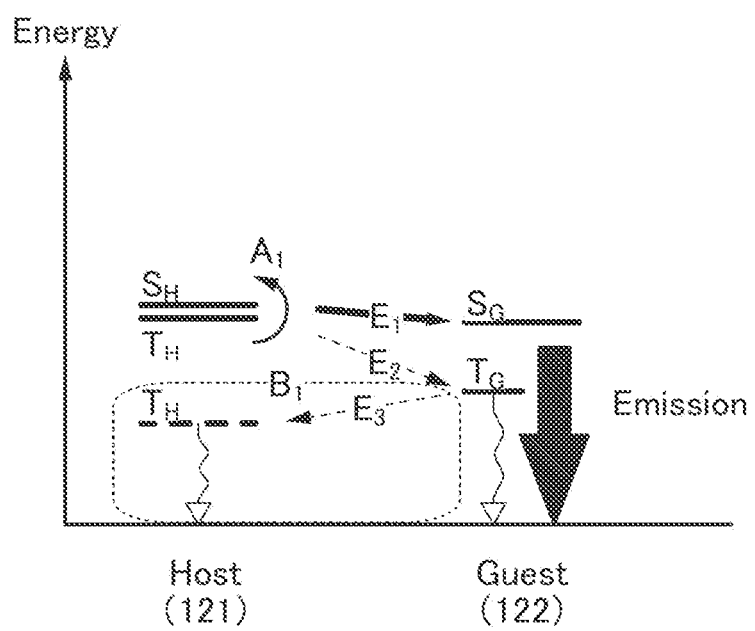

Next, in order to describe the energy transfer process of the host material 121 and the guest material 122, a schematic diagram illustrating the correlation of energy levels is shown in FIG. 8B. The following explains what terms and signs in FIG. 8B represent:

Host (121): the host material 121;
Guest (122): the guest material 122 (fluorescent material);
$S_H$: the level of the lowest singlet excitation energy of the host material 121;
$T_H$: the level of the lowest triplet excitation energy of the host material 121;
$S_G$: the level of the lowest singlet excitation energy of the guest material 122 (fluorescent material); and
$T_G$: the level of the lowest triplet excitation energy of the guest material 122 (fluorescent material).

Even in the case where the exited state of the host material 121 is the triplet excited state, when the Su of the host material 121 is higher than the Sc of the guest material 122, fluorescence is obtained through the following two processes.

As for a first process, excitation energy is transferred from the $T_H$ to the $S_H$ of the host material 121 by reverse intersystem crossing (upconversion) as shown by a route $A_1$ in FIG. 8B.

As for a subsequent second process, excitation energy is transferred from the $S_H$ of the host material 121 to the $S_G$ of the guest material 122 as shown by a route $E_1$ in FIG. 8B, whereby the guest material 122 is brought into the singlet excited state. Fluorescence is obtained from the guest material 122 in the singlet excited state.

The above-described first and second processes are represented by the following general formula (G2).

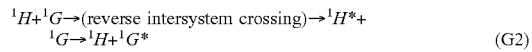

Note that in the general formula (G2), $^3H^*$ represents the triplet excited state of the host material 121; G represents the singlet ground state of the guest material 122; $^1H^*$ represents the singlet excited state of the host material 121; $^1H$ represents the singlet ground state of the host material 121; and $^1G^*$ represents the singlet excited state of the guest material 122.

As represented by the general formula (G2), the singlet excited state ($^1H^*$) of the host material 121 is generated from the triplet excited state ($^3H^*$) of the host material 121 by reverse intersystem crossing, and then energy is transferred to the guest material 122 in the singlet excited state ($^1G^*$).

When all the energy transfer processes described above in (β1) energy transfer process occur efficiently, both the triplet excitation energy and the singlet excitation energy of the host material 121 are efficiently converted into the singlet excited state ($^1G^*$) of the guest material 122. Thus, high-efficiency light emission is possible.

However, when the host material 121 is deactivated by emitting excitation energy as light or heat before the excitation energy is transferred from the singlet excited state and the triplet excited state of the host material 121 to the singlet excited state of the guest material 122, the emission efficiency is decreased. For example, in the case where the level of the lowest triplet excitation energy of the host material 121 is lower than the level of the lowest triplet excitation energy of the guest material 122 as indicated by broken line $B_1$ in FIG. 8B, thermal deactivation occur through an energy transfer process shown by a route $E_3$ in FIG. 8B. In that case, since there is a large energy difference between $T_H$ and $S_H$, reverse intersystem crossing shown by the route $A_1$ in FIG. 8B and the subsequent energy transfer process shown by the route $E_1$ are unlikely to occur, which reduces the generation efficiency of the singlet excited state of the guest material 122. Thus, it is preferable that the $T_H$ of the host material 121 be higher than the $T_G$ of the guest material 122. That is, in the case where the host material 121 is a material which exhibits thermally activated delayed fluorescence, it is preferable that the thermally activated delayed fluorescence emission energy of the host material 121 be higher than the phosphorescence emission energy of the guest material 122.

At this time, in the case where excitation energy is transferred from the $T_H$ of the host material 121 to the $T_G$ of the guest material 122 as shown by a route $E_2$ in FIG. 8B, the excitation energy is also thermally deactivated. Therefore, it is preferable that the energy transfer process shown by the route $E_2$ in FIG. 8B be less likely to occur because the generation efficiency of the triplet excited state of the guest material 122 can be decreased and the occurrence of thermal deactivation can be reduced. To achieve this, it is preferable that the concentration of the guest material 122 with respect to the host material 121 be low. Specifically, the concentration of the guest material 122 with respect to the host material 121 is preferably more than 0 wt % and less than or equal to 5 wt % and further preferably more than 0 wt % and less than or equal to 1 wt.

Note that when the direct recombination process in the guest material 122 is dominant, a large number of triplet excited states of the guest material 122 are generated in the light-emitting layer, resulting in a decreased emission efficiency due to thermal deactivation. That is, it is preferable that the probability of (β1) energy transfer process be higher than that of (α) direct recombination process because the occurrence of thermal deactivation when the excited state of the guest material 122 is a triplet excited state can be reduced. To achieve this, it is again preferable that the concentration of the guest material 122 with respect to the host material 121 be low. Specifically, the concentration of the guest material 122 with respect to the host material 121 is preferably more than 0 wt % and less than or equal to 5 wt % and further preferably more than 0 wt % and less than or equal to 1 wt %.

Next, factors controlling the above-described processes of intermolecular energy transfer between the host material 121 and the guest material 122 will be described. As mechanisms of the intermolecular energy transfer, two mechanisms, i.e., Förster mechanism (dipole-dipole interaction) and Dexter mechanism (electron exchange interaction), have been proposed.

<2-5. Förster Mechanism>

In Förster mechanism, energy transfer does not require direct contact between molecules and energy is transferred through a resonant phenomenon of dipolar oscillation between the host material 121 and the guest material 122. By the resonant phenomenon of dipolar oscillation, the host material 121 provides energy to the guest material 122, and thus, the host material 121 in an excited state is put in a ground state and the guest material 122 in a ground state is put in an excited state. Note that the rate constant $k_{h^* \to g}$ of Förster mechanism is expressed by Formula (1).

$$k_{h^* \to g} = \frac{9000K^2 \phi \ln 10}{128\pi^5 n^4 N \tau R^6} \int \frac{f'_h(v)\varepsilon_g(v)}{v^4} dv \tag{1}$$

In Formula (1), 1 denotes a frequency, $f'_h(v)$ denotes a normalized emission spectrum of the host material 121 (a fluorescent spectrum in energy transfer from a singlet excited state, and a phosphorescent spectrum in energy transfer from a triplet excited state), $\varepsilon_R(v)$ denotes a molar absorption coefficient of the guest material 122, N denotes Avogadro's number, n denotes a refractive index of a medium, R denotes an intermolecular distance between the host material 121 and the guest material 122, t denotes a measured lifetime of an excited state (fluorescence lifetime or phosphorescence lifetime), $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host material 121 and the guest material 122. Note that $K^2 = 2/3$ in random orientation.

<2-6. Dexter Mechanism>

In Dexter mechanism, the host material 121 and the guest material 122 are close to a contact effective range where their orbitals overlap, and the host material 121 in an excited state and the guest material 122 in a ground state exchange their electrons, which leads to energy transfer Note that the rate constant $k_{h^* \to g}$ of Dexter mechanism is expressed by Formula (2).

$$k_{h^* \to g} = \left(\frac{2\pi}{h}\right) K^2 \exp\left(-\frac{2R}{L}\right) \int f'_h(v) \varepsilon'_g(v) dv \tag{2}$$

In Formula (2), h denotes a Planck constant, K denotes a constant having an energy dimension, v denotes a frequency, $f'_h(v)$ denotes a normalized emission spectrum of the host material 121 (a fluorescent spectrum in energy transfer from a singlet excited state, and a phosphorescent spectrum in energy transfer from a triplet excited state), $\varepsilon'_g(v)$ denotes a normalized absorption spectrum of the guest material 122, L denotes an effective molecular radius, and R denotes an intermolecular distance between the host material 121 and the guest material 122.

Here, the efficiency of energy transfer from the host material 121 to the guest material 122 (energy transfer efficiency $\phi_{ET}$) is thought to be expressed by Formula (3). In the formula, $k_r$ denotes a rate constant of a light-emission process (fluorescence in energy transfer from a singlet excited state, and phosphorescence in energy transfer from a triplet excited state) of the host material 121, $k_n$ denotes a rate constant of a non-light-emission process (thermal deactivation or intersystem crossing) of the host material 121, and τ denotes a measured lifetime of an excited state of the host material 121.

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \tag{3}$$

According to Formula (3), it is found that the energy transfer efficiency $\phi_{ET}$ can be increased by increasing the rate constant $k_{h^* \to g}$ of energy transfer so that another competing rate constant $k_r + k_n$ (=1/τ) becomes relatively small.

<2-7. Concept for Promoting Energy Transfer>

In both the energy transfer processes of the general formulae (G1) and (G2), since energy is transferred from the singlet excited state ($^1H^*$) of the host material 121 to the singlet excited state ($^1G^*$) of the guest material 122, energy transfers by both Forster mechanism (Formula (1)) and Dexter mechanism (Formula (2)) are possible.

First, an energy transfer by Forster mechanism is considered. When c is eliminated from Formula (1) and Formula (3), it can be said that the energy transfer efficiency $\phi_{ET}$ is higher when the quantum yield $\phi$ (here, a fluorescence quantum efficiency because energy transfer from a singlet excited state is discussed) is higher. However, in practice, a more important factor is that the emission spectrum of the host material 121 (here, a fluorescent spectrum because energy transfer from a singlet excited state is discussed) largely overlaps with the absorption spectrum of the guest material 122 (absorption corresponding to the transition from the singlet ground state to the singlet excited state). Note that it is preferable that the molar absorption coefficient of the guest material 122 be also high. This means that the emission spectrum of the host material 121 overlaps with the absorption band of the guest material 122 which is on the longest wavelength side.

Next, an energy transfer by Dexter mechanism is considered. According to Formula (2), in order to increase the rate constant $k_{h^* \to g}$, it is preferable that an emission spectrum of the host material 121 (here, a fluorescent spectrum because energy transfer from a singlet excited state is discussed) largely overlap with an absorption spectrum of the guest material 122 (absorption corresponding to transition from a singlet ground state to a singlet excited state).

The above description suggests that the energy transfer efficiency can be optimized by making the emission spectrum of the host material 121 overlap with the absorption band of the guest material 122 which is on the longest wavelength side.

It is preferable that the host material 121 have a difference of 0.2 eV or less between a singlet excitation energy level and a triplet excitation energy level. This enables transition (reverse intersystem crossing) of the host material 121 from the triplet excited state to the singlet excited state to be likely to occur. Therefore, the generation efficiency of the singlet excited state of the host material 121 can be increased. Furthermore, it is preferable that the emission spectrum of the host material 121 (here, the emission spectrum of a material having a function of exhibiting thermally activated delayed fluorescence) overlap with the absorption band of the guest material 122 having a function as an energy acceptor, which is on the longest wavelength side. This facilitates energy transfer from the singlet excited state of the host material 121 to the singlet excited state of the guest material 122. Thus, the generation efficiency of the singlet excited state of the guest material 122 can be increased.

Since the triplet excitation energy level of the host material 121 is higher than the triplet excitation energy level of the guest material 122, transition of the host material 121 from the triplet excited state to the singlet excited state and energy transfer from the singlet excited state of the host material 121 to the singlet excited state of the guest material 122 are likely to occur. For this reason, thermal deactivation is less likely to occur; thus, the emission efficiency can be increased. In the case where the host material 121 is a material which exhibits thermally activated delayed fluorescence at room temperature, since the thermally activated delayed fluorescence emission energy is higher than the phosphorescence emission energy of the guest material 122, transition of the host material 121 from the triplet excited state to the singlet excited state and energy transfer from the singlet excited state of the host material 121 to the singlet excited state of the guest material 122 occur efficiently. For this reason, thermal deactivation is less likely to occur; thus, the emission efficiency can be increased.

<2-8. Emission Mechanism 2 of First Light-Emitting Layer>

Next, an emission mechanism different from <2,2. Emission mechanism 1 of first light-emitting layer> will be described below with reference to FIGS. 9A and 9B.

Figure 9A:
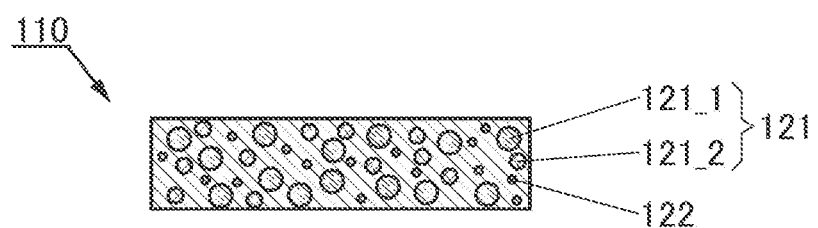
FIGS. 9A and 9B are a schematic cross-sectional view of a light-emitting element and a diagram illustrating the correlation of energy levels in a light-emitting layer.

FIG. 9A is an example of a schematic cross-sectional view of the first light-emitting layer 110. The first light-emitting layer 110 in FIG. 9A includes the host material 121 and the guest material 122. The host material 121 includes a first organic compound 121 . . . 1 and a second organic compound 121_2.

It is preferable that a combination of the first organic compound 121_1 and the second organic compound 121_2 form an exciplex (also referred to as an excited complex). An exciplex tends to have a very small difference between the singlet excitation energy level and the triplet excitation energy level, and thus transition (reverse intersystem crossing) from the triplet excited state to the singlet excited state is likely to occur. One of the first organic compound 1211 and the second organic compound 121_2 serves as a host material for the first light-emitting layer 110, and the other of the first organic compound 121 . . . 1 and the second organic compound 1212 serves as an assist material for the first light-emitting layer 110. Note that the first organic compound 121 . . . 1 serves as the host material and the second organic compound 121_2 serves as the assist material in the following description.

Note that also in the case of using a host material which allows a combination of the first organic compound 121 . . . 1 and the second organic compound 121 . . . 2 to form an exciplex, light emission from the guest material 122 can be obtained through the following two processes:

(α) direct recombination process; and (β2) energy transfer process.

Note that (α) direct recombination process is not described here because it is similar to the process described above in the subsection 2-3.

<2-9. (β2) Energy Transfer Process>

Although there is no limitation on the combination of the first organic compound 121_1 and the second organic compound 121_2 in the first light-emitting layer 110 as long as an exciplex can be formed, it is preferred that one organic compound be a material having a hole-transport property and the other organic compound be a material having an electron-transport property. In that case, a donor-acceptor excited state is formed easily, which allows an exciplex to be formed efficiently. In the case where the combination of the first organic compound 121_I and the second organic compound 121_2 is a combination of the material having a hole-transport property and the material having an electron-transport property, the carrier balance can be easily controlled depending on the mixture ratio. Specifically, the weight ratio of the material having a hole-transport property to the material having an electron-transport property is preferably within the range of 1:9 to 9:1. Since the carrier balance can be easily controlled in the structure, a recombination region can also be easily adjusted.

It is preferable that the exciplex formed by the first organic compound 121_I and the second organic compound 121_2 have a difference of 0.2 eV or less between the singlet excitation energy level and the triplet excitation energy level. This enables transition of the exciplex from the triplet excitation energy level to the singlet excitation energy level to be likely to occur. Therefore, the generation efficiency of the singlet excited state of the exciplex, i.e., the host material 121 can be increased. Furthermore, it is preferable that the emission spectrum of the host material 121 (here, the emission spectrum of the exciplex formed by the first organic compound 121_1 and the second organic compound 121_2) overlap with the absorption band of the guest material 122 which is on the longest wavelength side. This facilitates energy transfer from the singlet excited state of the host material 121 to the singlet excited state of the guest material 122. Therefore, the generation efficiency of the singlet excited state of the guest material 122 can be increased; thus, emission efficiency can be increased.

Figure 9B:
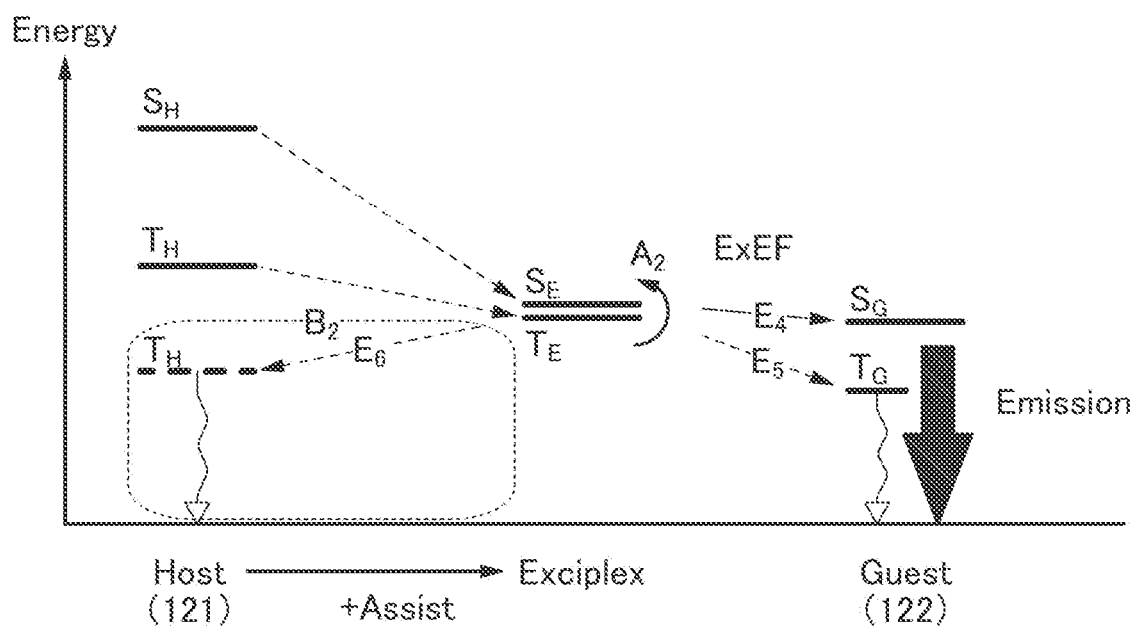

Here, in order to describe the energy transfer process of the exciplex, a schematic diagram illustrating the correlation of energy levels is shown in FIG. 9B. The following explains what terms and signs in FIG. 9B represent:

Host (121): the host material 121;

Guest (122): the guest material 122 (fluorescent material);

$S_H$: the level of the lowest singlet excitation energy of the host material 121;

$T_H$: the level of the lowest triplet excitation energy of the host material 121;

$S_E$: the level of the lowest singlet excitation energy of the exciplex;

$T_E$: the level of the lowest triplet excitation energy of the exciplex;

$S_G$: the level of the lowest singlet excitation energy of the guest material 122 (fluorescent material); and $T_G$: the level of the lowest triplet excitation energy of the guest material 122 (fluorescent material).

When carriers are transported to the first light-emitting layer 110, one of the first organic compound 121_1 and the second organic compound 121_2 receives holes and the other receives electrons, and a cation and an anon come close to each other, whereby the exciplex is formed at once. Alternatively, when one compound is brought into an excited state, the one immediately interacts with the other compound to form the exciplex. Therefore, most excitons in the first light-emitting layer 110 exist as the exciplexes. The band gap of the exciplex is narrower than that of each of the first organic compound 121_1 and the second organic compound 121_2; therefore, the driving voltage can be lowered when the exciplex is formed by recombination of a hole and an electron.

As shown in FIG. 9B, the first organic compound 1211 and the second organic compound 121_2 included in the host material 121 form the exciplex. Since a donor-acceptor excited state can be formed at this time, the $S_E$ and the $T_E$ of the exciplex are close to each other.

In the case where the excited state of the exciplex is a single excited state, excitation energy is transferred from the $S_E$ of the exciplex to the $S_G$ of the guest material 122 as shown by a route $E_4$ in FIG. 9B, whereby the guest material 122 is brought into the singlet excited state. Fluorescence is obtained from the guest material 122 in the singlet excited state. In other words, energy transfer occurs from the singlet excited state of the exciplex to the singlet excited state of the guest material 122 as represented by the following general formula (G3).

$$^1[H-A]^* + {}^1G \rightarrow H + {}^1A + {}^1G^* \quad (G3)$$

Note that in the general formula (G3), $^1[H-A]^*$ represents the singlet excited state of the exciplex formed by the first organic compound 121 ... 1 and the second organic compound 121_2; G represents the singlet ground state of the guest material 122; $^1H$ represents the singlet ground state of the first organic compound 121_1; $^1A$ represents the singlet ground state of the second organic compound 121_2; and $^1G^*$ represents the singlet excited state of the guest material 122.

Even in the case where the exited state of the exciplex is the triplet excited state, when the $S_E$ of the exciplex is higher than the $S_G$ of the guest material 122, fluorescence is obtained through the following two processes.

As for a first process, excitation energy is transferred from the $T_E$ to the $S_E$ of the exciplex by reverse intersystem crossing (upconversion) as shown by a route $A_2$ in FIG. 9B.

As for a subsequent second process, excitation energy is transferred from the $S_E$ of the exciplex to the $S_G$ of the guest material 122 as shown by a route $E_4$ in FIG. 9B, whereby the guest material 122 is brought into the singlet excited state. Fluorescence is obtained from the guest material 122 in the singlet excited state.

The above-described processes through the route $A_2$ and the route $E_4$ may be referred to as exciplex-singlet energy transfer (ExSET) or exciplex-enhanced fluorescence (ExEF) in this specification and the like.

The above-described first and second processes are represented by the following general formula (G4).

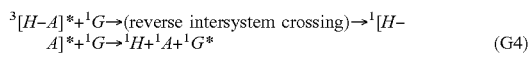
$$^3[H-A]^* + {}^1G \rightarrow \text{(reverse intersystem crossing)} \rightarrow {}^1[H-A]^* + {}^1G \rightarrow {}^1H + {}^1A + {}^1G^* \quad (G4)$$

Note that in the general formula (G4), $^3[H-A]^*$ represents the triplet excited state of the exciplex formed by the first organic compound 1211 and the second organic compound 121_2; 1G represents the singlet ground state of the guest material 122; $^1[H-A]^*$ represents the singlet excited state of the exciplex formed by the first organic compound 121_1 and the second organic compound 121_2; $^1H$ represents the singlet ground state of the first organic compound 121_1; $^1A$ represents the singlet ground state of the second organic compound 121_2; and $^1G^*$ represents the singlet excited state of the guest material 122.

As represented by the general formula (G4), the singlet excited state ($^1[H-A]^*$) of the exciplex is generated from the triplet excited state ($^3[H-A]^*$) of the exciplex by reverse intersystem crossing, and then energy is transferred to the singlet excited state ($^1G^*$) of the guest material 122.

When the host material 121 has the above structure, (β2) energy transfer process occurs efficiently, and both the singlet excitation energy and the triplet excitation energy of the exciplex are efficiently converted into the singlet excited state of the guest material 122. Thus, light emission can be efficiently obtained from the guest material 122 (fluorescent material) of the first light-emitting layer 110.

However, when the exciplex is deactivated by emitting the excitation energy as light or heat before excitation energy is transferred from the exciplex to the guest material 122, the emission efficiency may be decreased. For example, in the case where excitation energy is transferred from the $T_E$ of the exciplex to the $T_G$ of the guest material 122 as shown by a route $E_5$ in FIG. 9B, the excitation energy is thermally deactivated. Therefore, the concentration of the guest material 122 to the host material 121 is preferably more than 0 wt % and less than or equal to 5 wt % and further preferably more than 0 wt % and less than or equal to 1 wt %.

In the case where the $T_H$ of the host material 121, i.e., the triplet excitation energy level of the first organic compound 121_1 or the second organic compound 1212 is lower than the $T_B$ of the exciplex as indicated by broken line $B_2$ in FIG. 9B, thermal deactivation occurs through an energy transfer process shown by a route $E_6$ in FIG. 9B. Thus, it is preferable that the triplet excitation energy level of each of the first organic compound 121 ... 1 and the second organic compound 121_2 be higher than the Ta of the exciplex. Since the $S_E$ and $T_E$ of the exciplex are close to each other, in the case where the $T_E$ is lower than the Ta of the guest material 122, the energy level of $S_E$ is significantly lowered to the vicinity of $T_G$ or lower than $T_G$. As a result, energy transfer from the $S_E$ to the $S_G$ of the guest material 122 (route E) is unlikely to occur, and fluorescence is not easily obtained from the guest material 122. Thus, it is preferable that the $T_E$ of the exciplex be higher than the $T_G$ of the guest material 122. Accordingly, in the case where the exciplex exhibits thermally activated delayed fluorescence at room temperature, it is preferable that the phosphorescence emission energy of each of the first organic compound 121_1 and the second organic compound 121_2 be higher than the thermally activated delayed fluorescence emission energy of the exciplex. It is also preferable that the thermally activated delayed fluorescence emission energy of the exciplex be higher than the phosphorescence emission energy of the guest material 122.

Note that either <2-2. Emission mechanism 1 of first light-emitting layer> or <2-8. Emission mechanism 2 of first light-emitting layer> is preferably used for the first light-emitting layer 110 because the emission efficiency of the first light-emitting layer 110 can be increased.

<2-10. Emission Mechanism of Second Light-Emitting Layer>

Next, an emission mechanism of the second light-emitting layer 112 of the light-emitting element 100 will be described.

Figure 10A:
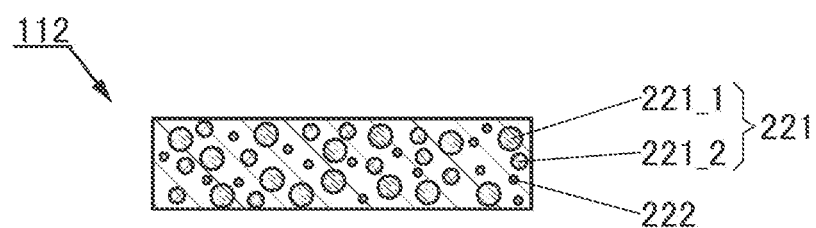
FIGS. 10A and 10B are a schematic cross-sectional view of a light-emitting element and a diagram illustrating the correlation of energy levels in a light-emitting layer.

FIG. 10A is an example of a schematic cross-sectional view of the second light-emitting layer 112. The second light-emitting layer 112 in FIG. 10A includes a host material 221 and a guest material 222. The host material 221 includes a third organic compound 221_1 and a fourth organic compound 2212.

The third organic compound 221_1 and the fourth organic compound 221_2 of the second light-emitting layer 112 form an exciplex. The third organic compound 2211 serves as a host material and the fourth organic compound 2212 serves as an assist material in the description hem.

Although there is no limitation on the combination of the third organic compound 221_1 and the fourth organic compound 221_2 in the second light-emitting layer 112 as long as an exciplex can be formed, it is preferred that one organic compound be a material having a hole-transport property and the other organic compound be a material having an electron-transport property. Note that the combination of the third organic compound 221_1 and the fourth organic compound 221_2 may have a structure similar to the combination of the first organic compound 121_1 and the second organic compound 121_2 which form an exciplex in the first light-emitting layer 110.

Figure 10B:
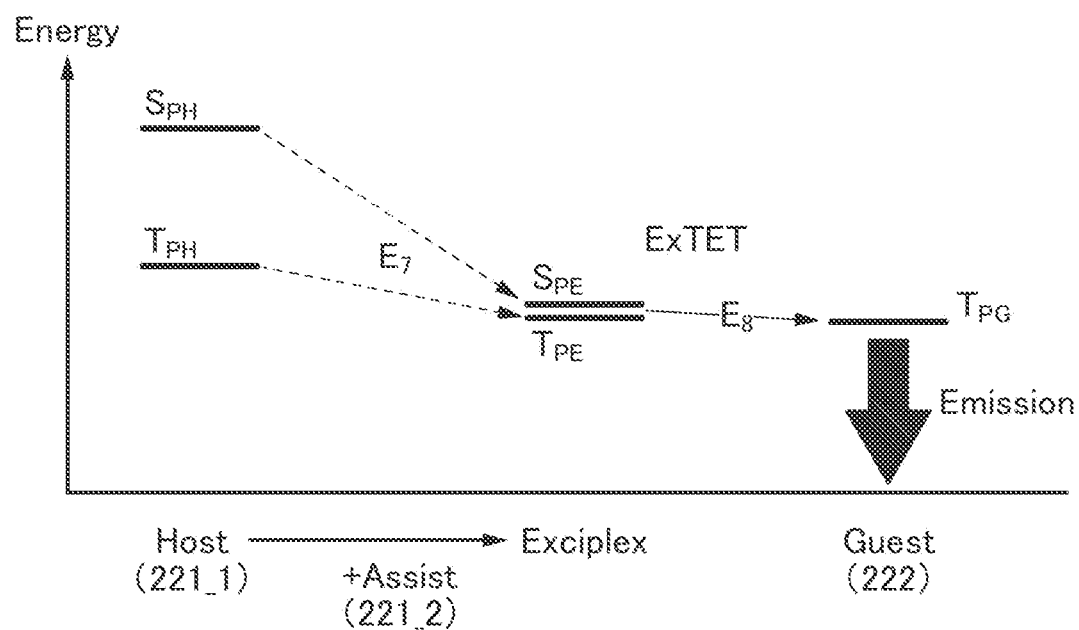

FIG. 10B illustrates the correlation of energy levels of the third organic compound 221_1, the fourth organic compound 221_2, and the guest material 222 in the second light-emitting layer 112. The following explains what terms and signs in FIG. 10B represent:

Host (221_1): the host material (third organic compound 221_1);

Assist (221_2): the assist material (fourth organic compound 221_2);

Guest (222): the guest material 222 (phosphorescent material);

$S_{PH}$: the level of the lowest singlet excited state of the host material (third organic compound 221_1);

$T_{PH}$: the level of the lowest triplet excited state of the host material (third organic compound 221_1);

$T_{PG}$: the level of the lowest triplet excited state of the guest material 222 (the phosphorescent material);

$S_{PE}$: the level of the lowest singlet excited state of the exciplex; and $T_{PE}$: the level of the lowest triplet excited state of the exciplex.

As shown by a route $E_7$ in FIG. 10B, the level ($S_{PE}$) of the lowest singlet excited state of the exciplex, which is formed by the third organic compound 221_1 and the fourth organic compound 221_2, and the level ($T_{PE}$) of the lowest triplet excited state of the exciplex are close to each other.

Both energies of $S_{PE}$ and $T_{PE}$ of the exciplex are then transferred to the level ($T_{PG}$) of the lowest triplet excited state of the guest material 222 (the phosphorescent material) as shown by a route $E_8$ in FIG. 10B; thus, light emission is obtained.

The above-escribed processes through the route $E_7$ and the route $E_8$ may be referred to as exciplex-triplet energy transfer (ExTET) in this specification and the like.

When one of the third organic compound 221_1 and the fourth organic compound 221_2 receiving holes and the other receiving electrons come close to each other, the exciplex is formed at once. Alternatively, when one compound is brought into an excited state, the one immediately takes in the other compound to form the exciplex. Therefore, most excitons in the second light-emitting layer 112 exist as the exciplexes. The band gap of the exciplex is narrower than that of each of the third organic compound 221_1 and the fourth organic compound 221_2; therefore, the driving voltage can be lowered when the exciplex is formed by recombination of a hole and an electron.

When the second light-emitting layer 112 has the above structure, light emission from the guest material 222 (the phosphorescent material) of the second light-emitting layer 112 can be efficiently obtained.

The structure described in this embodiment can be used in appropriate combination with any of the structures described in the other embodiments.

Embodiment 3

Figure 12:
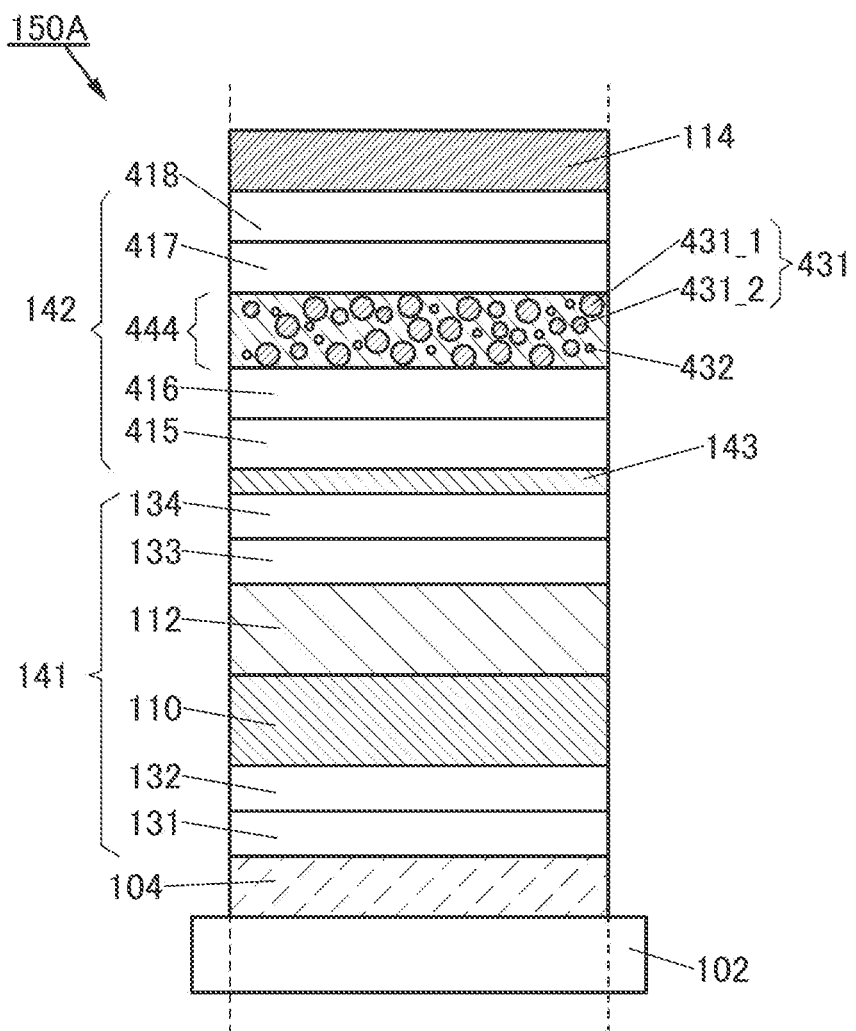
FIG. 12 is a schematic cross-sectional view illustrating a light-emitting element.
Figure 13:
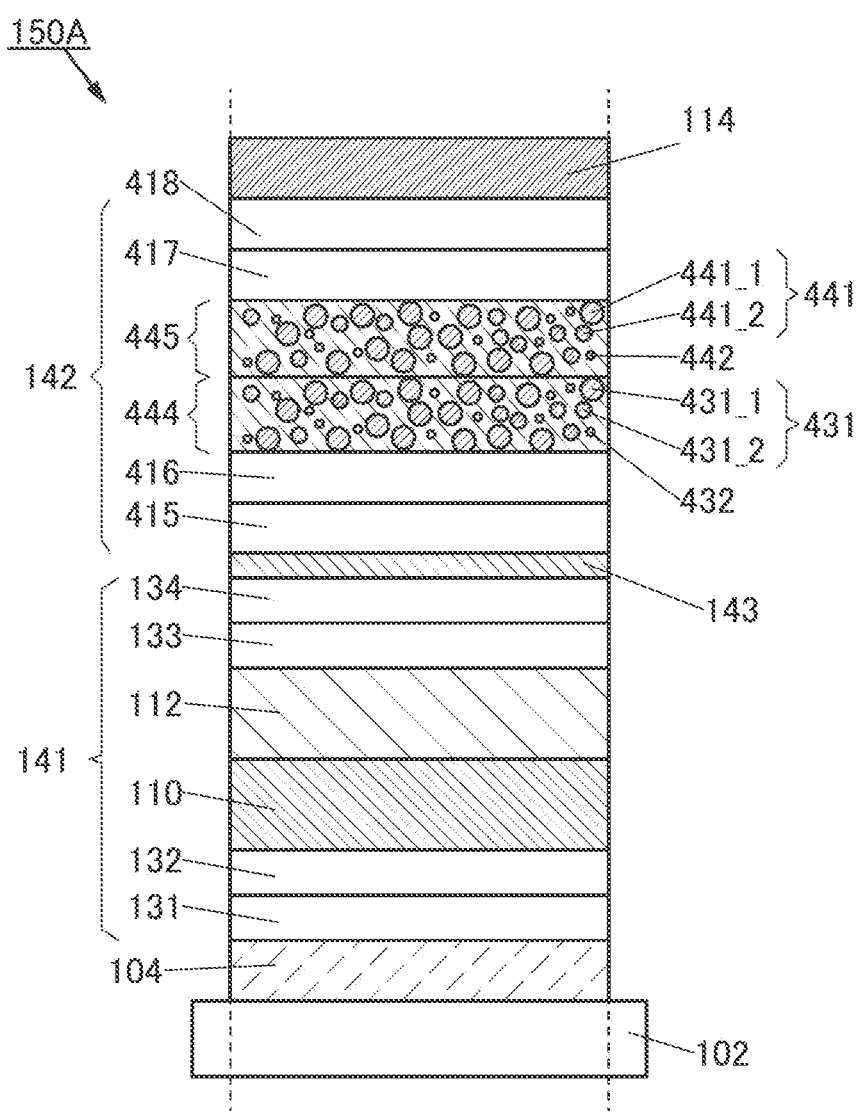
FIG. 13 is a schematic cross-sectional view illustrating a light-emitting element.

In this embodiment, a light-emitting element of one embodiment of the present invention will be described with reference to FIG. 11, FIG. 12, and FIG. 13. Note that FIG. 11 is a schematic cross-sectional view of a light-emitting element 150 of one embodiment of the present invention, and FIG. 12 and FIG. 13 are schematic cross-sectional views of a light-emitting element 150A of one embodiment of the present invention.

<3-1. Structure 2 of Light-Emitting Element>

Figure 11:
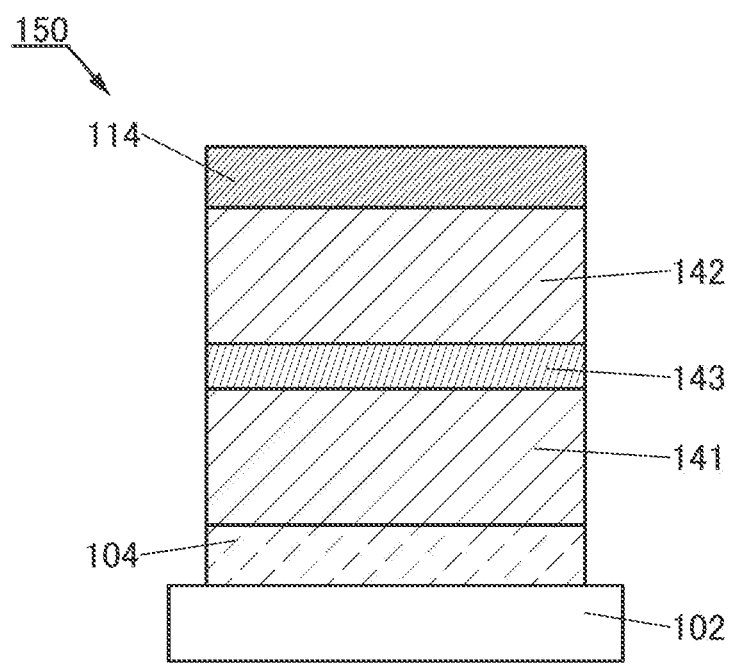
FIG. 11 is a schematic cross-sectional view illustrating a light-emitting element.

The light-emitting element 150 illustrated in FIG. 11 includes a plurality of EL layers (a first EL layer 141 and a second EL layer 142) between the first electrode 104 and the second electrode 114. One or both of the first EL layer 141 and the second EL layer 142 have the same structure as the EL layer 108 illustrated in FIGS. 1A and 1B. That is, the light-emitting element 100 in FIGS. 1A and 1B includes one EL layer while the light-emitting element 150 includes the plurality of EL layers. Note that in this specification and the like, an EL layer includes at least a light-emitting material.

In the light-emitting element 150 in FIG. 11, the first EL layer 141 and the second EL layer 142 are stacked, and a charge generation layer 143 is provided between the first EL layer 141 and the second EL layer 142. Note that the first EL layer 141 and the second EL layer 142 may have the same structure or different structures.

The charge generation layer 143 includes a composite material of an organic compound and a metal oxide. For the composite material, the composite material that can be used for the hole-injection layer 131 described above may be used. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1\times10^{-6}$ cm$^2$/Vs or higher is preferably used. Note that any other substance may be used as long as the substance has a hole-transport property higher than an electron-transport property. The composite material of an organic compound and a metal oxide is superior in carrier-injecting property and carrier-transporting property; therefore, low-voltage driving or low-current driving can be achieved. Note that when a surface of the EL layer 141 or the EL layer 142 on the anode side is in contact with the charge generation layer 143, the charge generation layer 143 can also serve as a hole-transport layer of the EL layer 141 or the EL layer 142; thus, a hole-transport layer does not need to be formed in the EL layer 141 or the EL layer 142.

The charge generation layer 143 may have a stacked-layer structure of a layer containing the composite material of an organic compound and a metal oxide and a layer containing another material. For example, the charge generation layer 143 may be formed using a combination of a layer containing the composite material of an organic compound and a metal oxide with a layer containing one compound selected from among electron-donating substances and a compound having a high electron-transporting property. Further, the charge generation layer 143 may be formed using a combination of a layer containing the composite material of an organic compound and a metal oxide with a transparent conductive film.

In any case, as the charge-generation layer 143, which is provided between the first EL layer 141 and the second EL layer 142, acceptable is a layer which injects electrons into the EL layer on one side and injects holes into the EL layer on the other side when voltage is applied to the first electrode 104 and the second electrode 114. For example, in FIG. 11, when a voltage is applied such that a potential of the first electrode 104 is higher than a potential of the second electrode 114, any structure may be used for the charge generation layer 143, as long as the charge generation layer 143 injects electrons and holes into the first EL layer 141 and the second EL layer 142, respectively.

In FIG. 11, the light-emitting element having two EL layers is described; however, one embodiment of the present invention can be similarly applied to a light-emitting element in which three or more EL layers are stacked. With a plurality of EL layers partitioned by the charge generation layer 143 between a pair of electrodes as in the light-emitting element 150, light with high luminance can be obtained while current density is kept low; thus, a light-emitting element with a long lifetime can be obtained. A light-emitting device that can be driven at a low voltage and has low power consumption can be achieved.

When the EL layer 108 described in Embodiment 1 is included in at least one of the plurality of EL layers, a light-emitting element with high efficiency and a long lifetime can be provided.

<3-2. Structure 3 of Light-Emitting Element>

Next, specific examples of the light-emitting element 150 in FIG. 11 will be described with reference to FIG. 12 and FIG. 13.

The light-emitting element 150A illustrated in FIG. 12 includes the first EL layer 141 and the second EL layer 142 between the first electrode 104 and the second electrode 114. The first EL layer 141 in FIG. 12 has the same structure as the EL layer 108 in FIGS. 1A and 1B. The second EL layer 142 in FIG. 12 includes a hole-injection layer 415, a hole-transport layer 416, a third light-emitting layer 444, an electron-transport layer 417, and an electron-injection layer 418.

The hole-injection layer 415, the hole-transport layer 416, the electron-transport layer 417, and the electron-injection layer 418 have the same structures as the hole-injection layer 131, the hole-transport layer 132, the electron-transport layer 133, and the electron-injection layer 134 described above, respectively.

The third light-emitting layer 444 includes a host material 431 and a guest material 432. The host material 431 includes a first organic compound 431_1 and a second organic compound 431_2. For example, the first organic compound 431_1 can be used as a host material and the second organic compound 431_2 can be used as an assist material. Although, in this embodiment, two kinds of organic compounds (the first organic compound 431_1 and the second organic compound 431_2) are used for the host material 431, for example, one kind or three or more kinds of materials may be used without limitation to such a structure.

A phosphorescent material is preferable as the guest material 432. Moreover, the guest material 432 preferably has an emission spectrum having a peak different from those of the first light-emitting layer 110 and the second light-emitting layer 112. When the first light-emitting layer 110, the second light-emitting layer 112, and the third light-emitting layer 444 emit light of complementary colors, white light emission can be obtained, for example. For example, in the case where the first light-emitting layer 110 and the second light-emitting layer 112 each have a peak of an emission spectrum in a blue wavelength range, it is preferable to use a material whose emission spectrum has a peak in a yellow wavelength range as the guest material 432 of the third light-emitting layer 444.

Alternatively, the light-emitting element 150A in FIG. 12 may have a structure in FIG. 13.

The light-emitting element 150A illustrated in FIG. 13 is different from the light-emitting element 150A in FIG. 12 in the structure of the second EL layer 142. The light-emitting element 150A in FIG. 13 further includes a fourth light-emitting layer 445 over the third light-emitting layer 444.

The fourth light-emitting layer 445 of the second EL layer 142 in the light-emitting element 150A in FIG. 13 includes a host material 441 and a guest material 442. The host material 441 includes a first organic compound 441_1 and a second organic compound 4412. For example, the first organic compound 4411 can be used as a host material and the second organic compound 441_2 can be used as an assist material.

A phosphorescent material is preferable as the guest material 442. Moreover, the guest material 442 preferably has an emission spectrum having a peak different from those of the first light-emitting layer 110, the second light-emitting layer 112, and the third light-emitting layer 444. For example, the first light-emitting layer 110 and the second light-emitting layer 112 each have a peak of an emission spectrum in a blue wavelength range, the third light-emitting layer 444 has a peak of an emission spectrum in a green wavelength range, and the fourth light-emitting layer 445 has a peak of an emission spectrum in a red wavelength range.

Note that the emission mechanisms and materials of the third light-emitting layer 444 and the fourth light-emitting layer 445 may be the same as those of the second light-emitting layer 112 described above.

The structure described in this embodiment can be used in appropriate combination with any of the structures described in the other embodiments.

Embodiment 4

In this embodiment, a display device including a light-emitting device of one embodiment of the present invention will be described with reference to FIGS. 14A and 14B <4. Display Device>

Figure 14A:
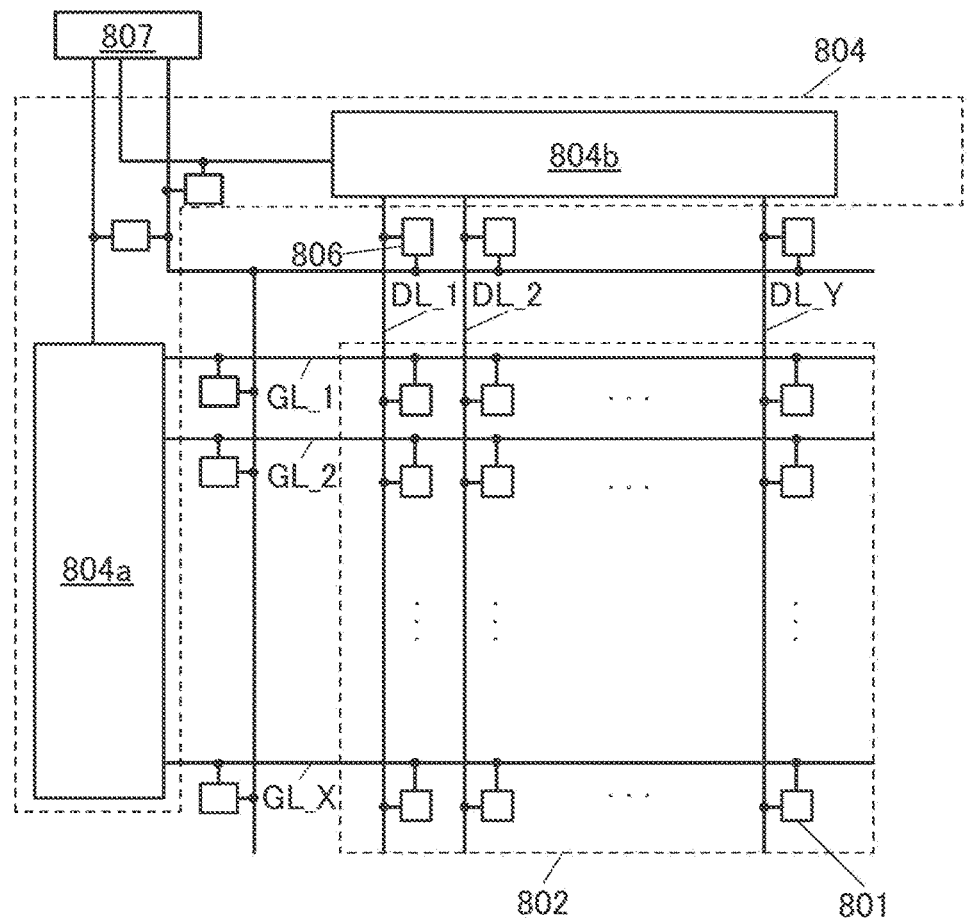
FIGS. 14A and 14B are a block diagram and a circuit diagram illustrating a display device.
Figure 14B:
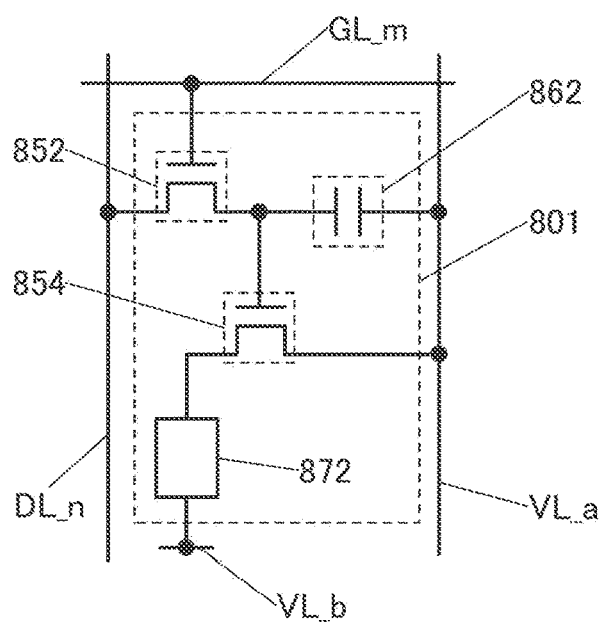

FIG. 14A is a block diagram illustrating the display device of one embodiment of the present invention, and FIG. 14B is a circuit diagram illustrating a pixel circuit of the display device of one embodiment of the present invention.

The display device illustrated in FIG. 14A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

Part or the whole of the driver circuit portion 804 is preferably formed over a substrate over which the pixel portion 802 is formed, in which case the number of components and the number of terminals can be reduced. When part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a gate driver 804a) and a circuit for supplying a signal (data signal) to drive a display element in a pixel (the circuit is hereinafter referred to as a source driver 804*b*).

The gate driver 804*a* includes a shift register or the like. Through the terminal portion 807, the gate driver 804*a* receives a signal for driving the shift register and outputs a signal. For example, the gate driver 804*a* receives a start pulse signal, a clock signal, or the like and outputs a pulse signal. The gate driver 804*a* has a function of controlling the potentials of wirings supplied with scan signals (such wirings are hereinafter referred to as scan lines GL_1 to GL_X). Note that a plurality of gate drivers 804*a* may be provided to control the scan lines GL_1 to GL_X separately. Alternatively, the gate driver 804*a* has a function of supplying an initialization signal. Without being limited thereto, the gate driver 804*a* can supply another signal.

The source driver 804*b* includes a shift register or the like. The source driver 804*b* receives a signal (image signal) from which a data signal is derived, as well as a signal for driving the shift register, through the terminal portion 807. The source driver 804*b* has a function of generating a data signal to be written to the pixel circuit 801 which is based on the image signal. In addition, the source driver 804*b* has a function of controlling output of a data signal in response to a pulse signal produced by input of a start pulse signal, a clock signal, or the like. Furthermore, the source driver 804*b* has a function of controlling the potentials of wirings supplied with data signals (such wirings are hereinafter referred to as data lines DL_1 to DL_Y). Alternatively, the source driver 804*b* has a function of supplying an initialization signal. Without being limited thereto, the source driver 804*b* can supply another signal.

The source driver 804*b* includes a plurality of analog switches or the like, for example. The source driver 804*b* can output, as the data signals, signals obtained by time-dividing the image signal by sequentially turning on the plurality of analog switches. The source driver 804*b* may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the gate driver 804*a*. For example, to the pixel circuit 801 in the m-th row and the n-th column (m is a natural number of less than or equal to X, and n is a natural number of less than or equal to Y), a pulse signal is input from the gate driver 804*a* through the scan line GL_m, and a data signal is input from the source driver 804*b* through the data line DL_n in accordance with the potential of the scan line GL_m.

The protection circuit 806 illustrated in FIG. 14A is connected to, for example, the scan line GL between the gate driver 804*a* and the pixel circuit 801. Alternatively, the protection circuit 806 is connected to the data line DL between the source driver 804*b* and the pixel circuit 801. Alternatively, the protection circuit 806 can be connected to a wiring between the gate driver 804*a* and the terminal portion 807. Alternatively, the protection circuit 806 can be connected to a wiring between the source driver 804*b* and the terminal portion 807. Note that the terminal portion 807 means a portion having terminals for inputting power, control signals, and image signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 14A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the gate driver 804*a* or a configuration in which the protection circuits 806 are connected to the source driver 804*b* may be employed. Alternatively, the protection circuits 806 may be configured to be connected to the terminal portion 807.

Although, in FIG. 14A, the driver circuit portion 804 includes the gate driver 804*a* and the source driver 804*b*, for example, the structure is not limited thereto. For example, only the gate driver 804*a* may be formed and a separately prepared substrate where a source driver is formed (e.g., a driver circuit substrate formed with a single crystal semiconductor film or a polycrystalline semiconductor film) may be mounted.

Each of the plurality of pixel circuits 801 in FIG. 14A can have a structure illustrated in FIG. 14B, for example.

The pixel circuit 801 illustrated in FIG. 14B includes transistors 852 and 854, a capacitor 862, and a light-emitting element 872.

One of a source electrode and a drain electrode of the transistor 852 is electrically connected to a wiring to which a data signal is supplied (hereinafter referred to as a signal line DL_n). A gate electrode of the transistor 852 is electrically connected to a wiring to which a gate signal is supplied (hereinafter referred to as a scan line GL_m).

The transistor 852 has a function of controlling whether to write a data signal by being turned on or off.

One of a pair of electrodes of the capacitor 862 is electrically connected to a wiring to which a potential is supplied (hereinafter referred to as a potential supply line VL_a), and the other is electrically connected to the other of a source electrode and a drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, the light-emitting element 100 described in Embodiment 1 can be used.

Note that a high power supply potential VDD is supplied to one of the potential supply line VL_a and the potential supply line VL_b, and a low power supply potential VSS is supplied to the other.

In the display device including the pixel circuits 801 in FIG. 14B, the pixel circuits 801 are sequentially selected row by row by the gate driver 804*a* in FIG. 14A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 15A and 15B and FIGS. 16A and 16B illustrate examples of the pixel circuit.

Figure 15A:
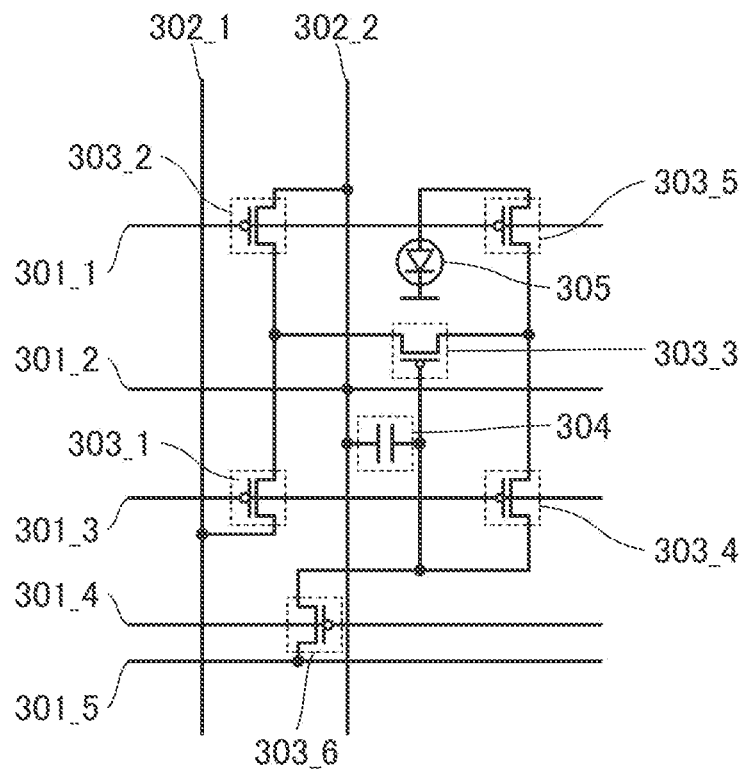
FIGS. 15A and 15B are each a circuit diagram illustrating a pixel circuit of a display device.

The pixel circuit illustrated in FIG. 15A includes six transistors (transistors 303_1 to 303_6), a capacitor 304, and a light-emitting element 305. The pixel circuit illustrated in FIG. 15A is electrically connected to wirings 301_1 to 301_5 and wirings 302_1 and 302_2. Note that as the transistors 303_1 to 303_6, for example, p-channel transistors can be used.

Figure 15B:
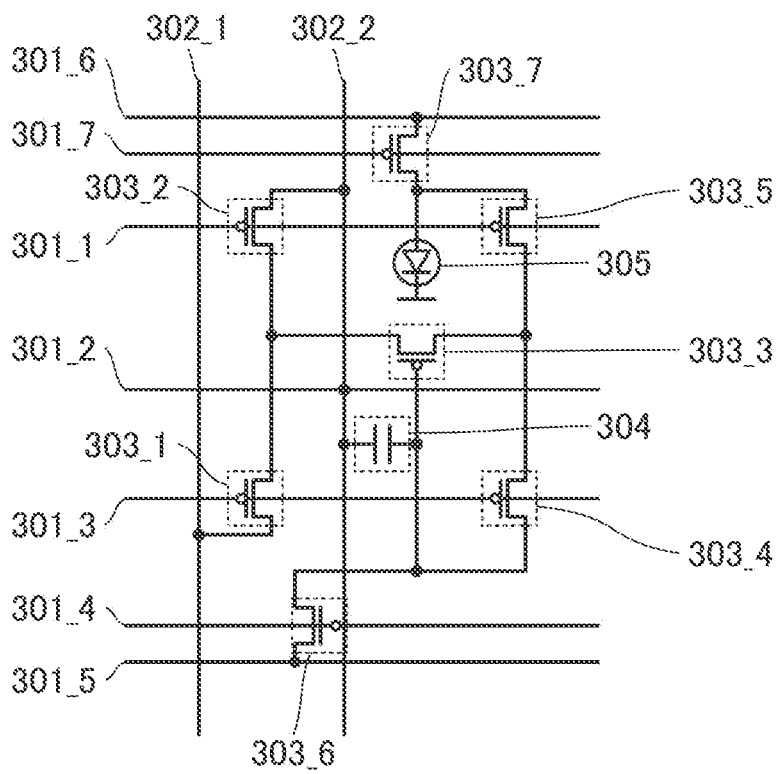

The pixel circuit shown in FIG. 15B has a configuration in which a transistor 303_7 is added to the pixel circuit shown in FIG. 15A. The pixel circuit illustrated in FIG. 15B is electrically connected to wirings 301_6 and 301_7. The wirings 3015 and 301_6 may be electrically connected to each other. Note that as the transistor 303_7, for example, a p-channel transistor can be used.

Figure 16A:
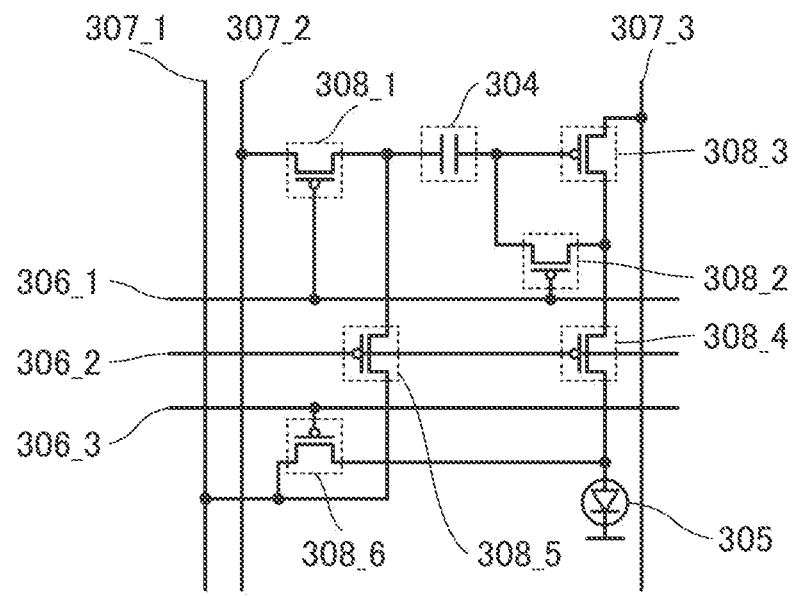
FIGS. 16A and 16B are each a circuit diagram illustrating a pixel circuit of a display device.

The pixel circuit illustrated in FIG. 16A includes six transistors (transistors 308_1 to 308_6), the capacitor 304, and the light-emitting element 305. The pixel circuit illustrated in FIG. 16A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 16B:
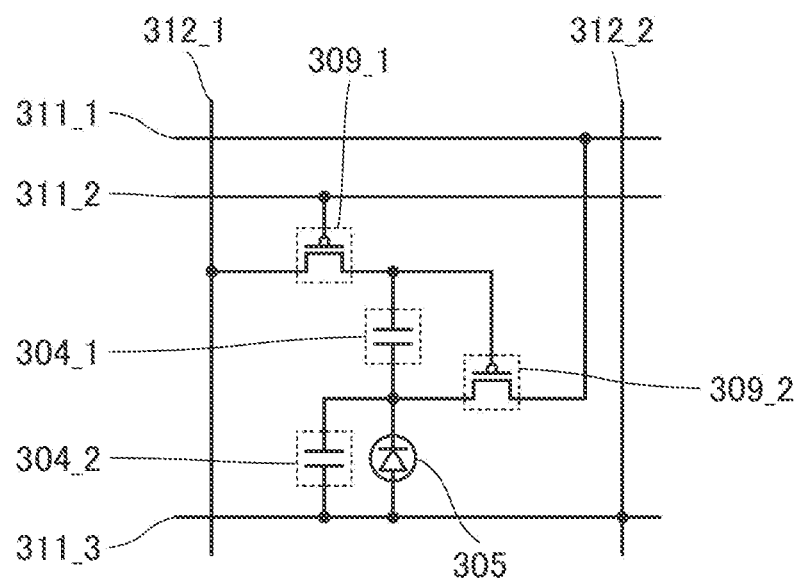

The pixel circuit illustrated in FIG. 16B includes two transistors (transistors 309_1 and 309_2), two capacitors (capacitors 304_1 and 304_2), and the light-emitting element 305. The pixel circuit illustrated in FIG. 16B is electrically connected to wirings 311_1 to 311_3 and wirings 312_1 and 312_2. With the configuration of the pixel circuit illustrated in FIG. 16B, for example, the light-emitting element 305 can be driven by constant voltage constant current (CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used in appropriate combination with any of the structures described in the other embodiments.

Embodiment 5

In this embodiment, a display panel including a light-emitting device of one embodiment of the present invention and an electronic device in which the display panel is provided with an input device will be described with reference to FIGS. 17A and 17B, FIGS. 18A to 18C, FIGS. 19A and 19B, FIGS. 20A and 20B, and FIG. 21.

<5-1. Description 1 of Touch Panel>

In this embodiment, a touch panel 2000 including a display panel and an input device will be described as an example of an electronic device. In addition, an example in which a touch sensor is used as an input device will be described. Note that a light-emitting device of one embodiment of the present invention can be used for a pixel of the display panel.

Figure 17A:
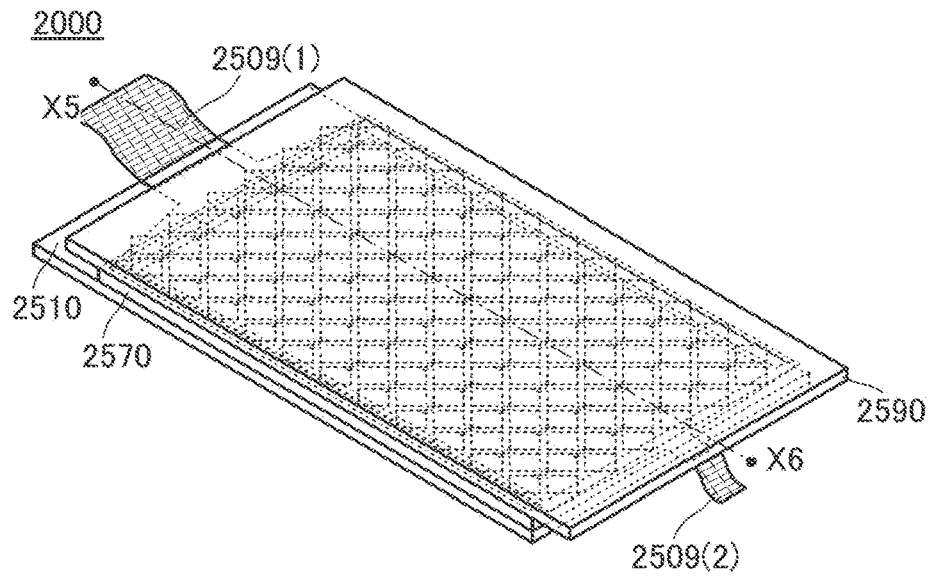
FIGS. 17A and 17B are perspective views of an example of a touch panel.
Figure 17B:
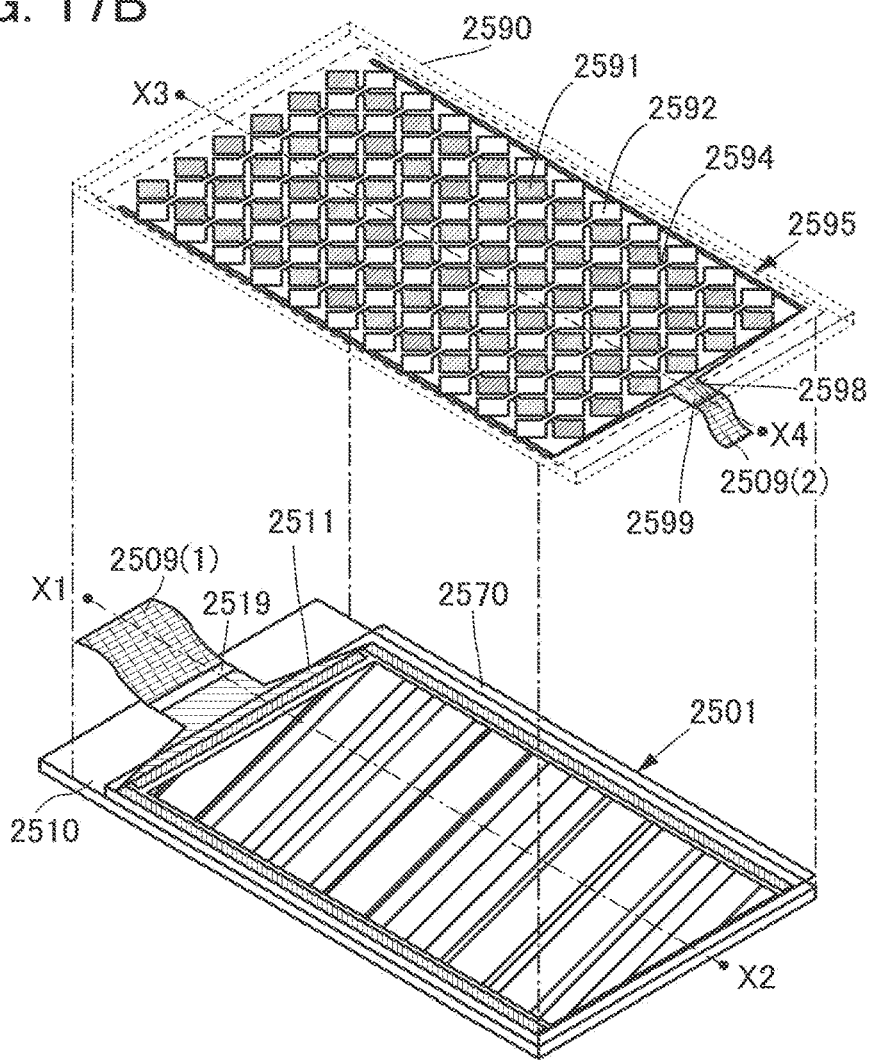

FIGS. 17A and 17B are perspective views of the touch panel 2000. Note that FIGS. 17A and 17B illustrate only main components of the touch panel 2000 for simplicity.

The touch panel 2000 includes a display panel 2501 and a touch sensor 2595 (see FIG. 17B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display panel 2501 includes a plurality of pixels over the substrate 2510 and a plurality of wirings 2511 through which signals are supplied to the pixels. The plurality of wirings 2511 are led to a peripheral portion of the substrate 2510, and part of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and part of the plurality of wirings 2598 form a terminal. The terminal is electrically connected to an FPC 2509(2). Note that in FIG. 17B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used, for example. Examples of the capacitive touch sensor include a surface capacitive touch sensor and a projected capacitive touch sensor.

Examples of the projected capacitive touch sensor include a self-capacitive touch sensor and a mutual capacitive touch sensor, which differ mainly in the driving method. The use of a mutual capacitive touch sensor is preferable because multiple points can be sensed simultaneously.

Note that the touch sensor 2595 illustrated in FIG. 17B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 17A and 17B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that for example, a transparent conductive film including indium oxide, tin oxide, zinc oxide, or the like (e.g., a film of IT) can be given as a material of conductive films used for the electrode 2591, the electrode 2592, and the wiring 2598, i.e., wirings and electrodes in the touch panel. Moreover, for example, a low-resistance material is preferably used as the material of the wiring and the electrode in the touch panel. For example, silver, copper, aluminum, a carbon nanotube, graphene, or a metal halide (such as a silver halide) may be used. Alternatively, a metal nanowire including a plurality of conductors with an extremely small width (e.g., a diameter of several nanometers) may be used. Further alternatively, a metal mesh which is a net-like conductor may be used. Examples of such materials include an Ag nanowire, a Cu nanowire, an Al nanowire, an Ag mesh, a Cu mesh, and an Al mesh. For example, in the case of using an Ag nanowire for the wiring and the electrode in the touch panel, a visible light transmittance of 89% or more and a sheet resistance of 40 $\Omega/cm^2$ or more and 100 $\Omega/cm^2$ or less can be achieved. A metal nanowire, a metal mesh, a carbon nanotube, graphene, and the like, which are examples of a material that can be used for the above-described wiring and electrode in the touch panel, have a high visible light transmittance; therefore, they may be used for an electrode of a display element (e.g., a pixel electrode or a common electrode).

<5-2. Display Panel>

Figure 18A:
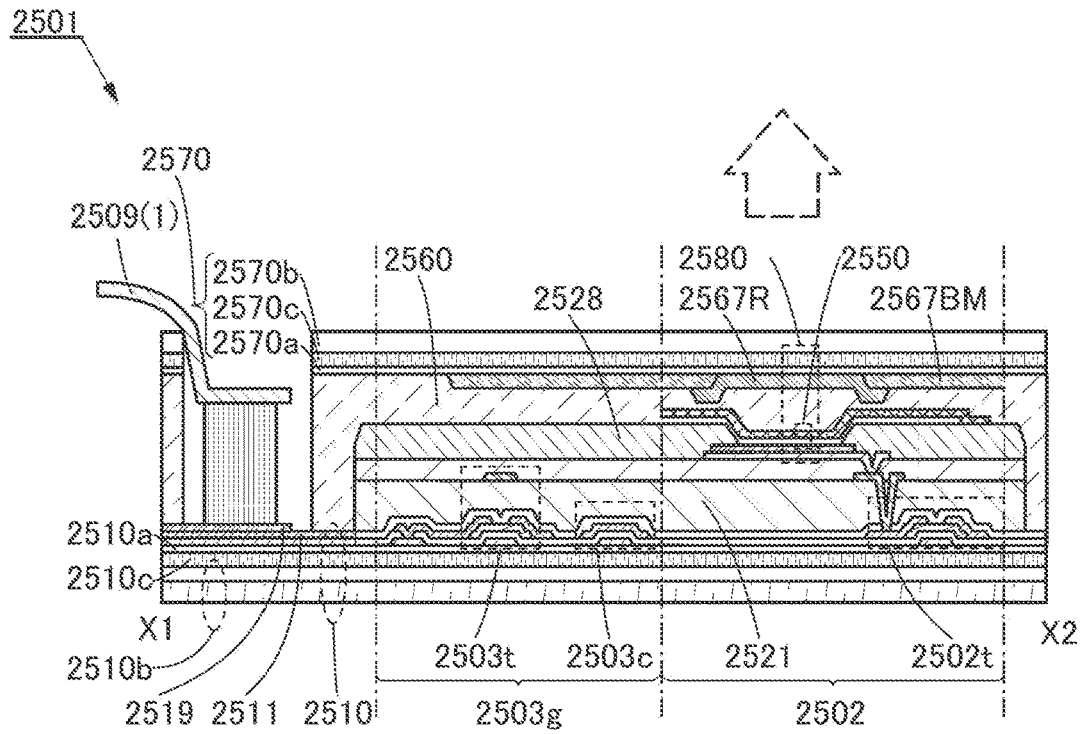
FIGS. 18A to 18C are cross-sectional views of examples of a display panel and a touch sensor.

Next, the display panel 2501 will be described in detail with reference to FIG. 18A. FIG. 18A corresponds to a cross-sectional view taken along dashed-dotted line X1-X2 in FIG. 17B.

The display panel 2501 includes a plurality of pixels arranged in a matrix. Each of the pixels includes a display element and a pixel circuit for driving the display element.

For the substrate 2510 and the substrate 2570, for example, a flexible material with a vapor permeability of lower than or equal to $10^{-5}$ g/(m$^2$·day), preferably lower than or equal to $10^{-6}$ g/(m$^2$·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, an acrylic resin, polyurethane, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 18A, the sealing layer 2560 can also serve as an optical element.

A sealant may be formed in the peripheral portion of the sealing layer 2560. With the use of the sealant, a light-emitting element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display panel 2501 includes a pixel 2502. The pixel 2502 includes a light-emitting module 2580.

The pixel 2502 includes the light-emitting element 2550 and a transistor 2502t that can supply electric power to the light-emitting element 2550. Note that the transistor 2502t functions as part of the pixel circuit. The light-emitting module 2580 includes the light-emitting element 2550 and a coloring layer 2567R.

The light-emitting element 2550 includes a lower electrode, an upper electrode, and an EL layer between the lower electrode and the upper electrode. As the light-emitting element 2550, the light-emitting element 100 described in Embodiment 1 can be used, for example. Note that although only one light-emitting element 2550 is illustrated in FIG. 18A, it is possible to employ the structure including two or more light-emitting elements.

In the case where the sealing layer 2560 is provided on the light extraction side, the seating layer 2560 is in contact with the light-emitting element 2550 and the coloring layer 2567R.

The coloring layer 2567R is positioned in a region overlapping with the light-emitting element 2550. Accordingly, part of light emitted from the light-emitting element 2550 passes through the coloring layer 2567R and is emitted to the outside of the light-emitting module 2580 as indicated by an arrow in FIG. 18A.

The display panel 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of a variety of materials by a printing method, an inkjet method, an etching method using a photolithography technique, or the like.

An insulating layer 2521 is provided in the display panel 2501. The insulating layer 2521 coven the transistor 2502t. Note that the insulating layer 2521 has a function of covering unevenness caused by the pixel circuit to provide a flat surface. The insulating layer 2521 may have a function of suppressing impurity diffusion. This can prevent the reliability of the transistor 2502t or the like from being lowered by impurity diffusion.

The light-emitting element 2550 is formed over the insulating layer 2521. A partition 2528 is provided so as to overlap with an end portion of the lower electrode of the light-emitting element 2550. Note that a spacer for controlling the distance between the substrate 2510 and the substrate 2570 may be formed over the partition 2528.

A scan line driver circuit 2503g includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a PWB.

Figure 18B:
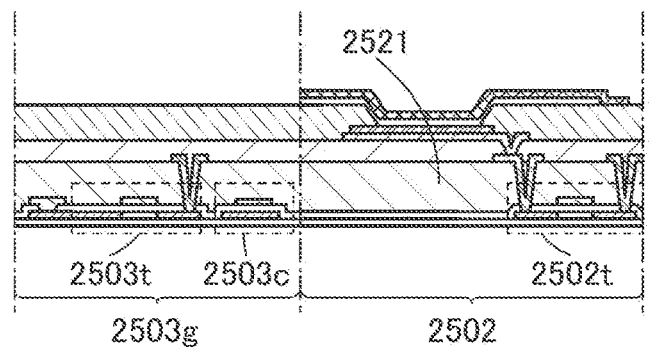

In the display panel 2501, transistors with any of a variety of structures can be used. FIG. 18A illustrates an example of using bottom-gate transistors; however, the present invention is not limited to this example, and top-gate transistors may be used in the display panel 2501 as illustrated in FIG. 18B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more and further preferably 3 eV or more, is preferably used for one of the transistors 2502t and 2503t or both, so that the off-state current of the transistors can be reduced. Examples of the oxide semiconductors include an In—Ga oxide, an In-M-Zn oxide (M represents Al, Ga, Y, Zr, La, Ce, Sn, or Nd), and the like.

<5-3. Touch Sensor>

Figure 18C:
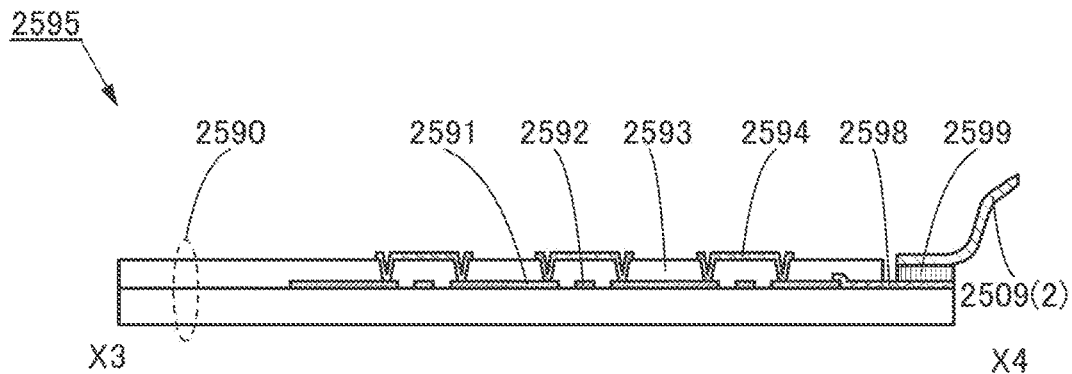

Next, the touch sensor 2595 will be described in detail with reference to FIG. 18C. FIG. 18C corresponds to a cross-sectional view taken along dashed-dotted line X3-X4 in FIG. 17B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with conductivity higher than the conductivities of the electrodes 2591 and 2592 can be favorably used for the wiring 2594 because electric resistance can be reduced.

One electrode 2592 extends in one direction, and the plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 function as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<5-4. Description 2 of Touch Panel>

Figure 19A:
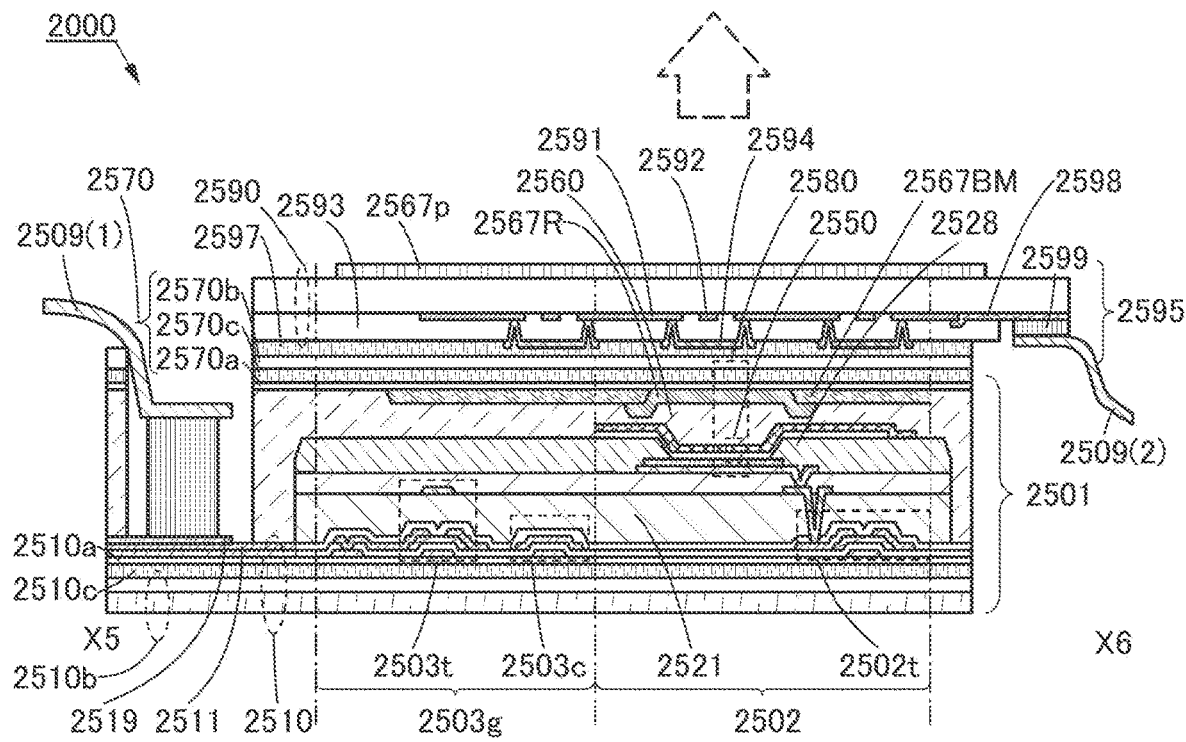
FIGS. 19A and 19B are each a cross-sectional view illustrating an example of a touch panel.

Next, the touch panel 2000 will be described in detail with reference to FIG. 19A. FIG. 19A corresponds to a cross-sectional view taken along dashed-dotted line X5-X6 in FIG. 17A.

In the touch panel 2000 illustrated in FIG. 19A, the display panel 2501 described with reference to FIG. 18A and the touch sensor 2595 described with reference to FIG. 18C are attached to each other.

The touch panel 2000 illustrated in FIG. 19A includes an adhesive layer 2597 and an anti-reflective layer 2567p in addition to the components described with reference to FIGS. 18A and 18C.

The adhesive layer 2597 is provided in contact with the wiring 2594. Note that the adhesive layer 2597 attaches the substrate 2590 to the substrate 2570 so that the touch sensor 2595 overlaps with the display panel 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 19A will be described with reference to FIG. 19B.

Figure 19B:
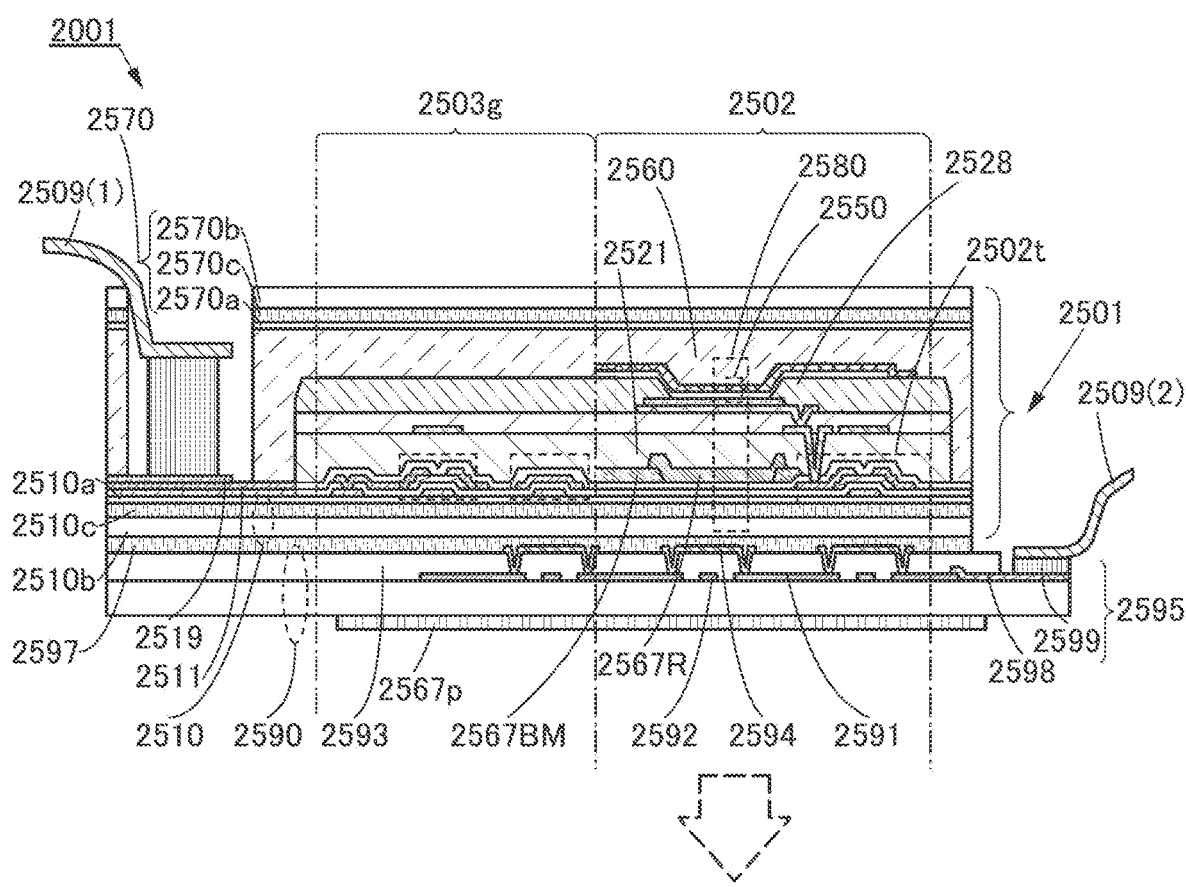

FIG. 19B is a cross-sectional view of a touch panel 2001. The touch panel 2001 illustrated in FIG. 19B differs from the touch panel 2000 illustrated in FIG. 19A in the position of the touch sensor 2595 relative to the display panel 2501. Different parts are described in detail below, and the above description of the touch panel 2000 is referred to for the other similar parts.

The coloring layer 2567R is positioned in a region overlapping with the light-emitting element 2550. The light-emitting element 2550 illustrated in FIG. 19B emits light to the side where the transistor 2502t is provided. Accordingly, part of light emitted from the light-emitting element 2550 passes through the coloring layer 2567R and is emitted to the outside of the light-emitting module 2580 as indicated by an arrow in FIG. 19B.

The touch sensor 2595 is provided on the substrate 2510 side of the display panel 2501.

The adhesive layer 2597 is provided between the substrate 2510 and the substrate 2590 and attaches the touch sensor 2595 to the display panel 2501.

As illustrated in FIG. 19A or 19B, light may be emitted from the light-emitting element through either or both of the substrates 2510 and 2570.

<5-5. Method for Driving Touch Panel>

Next, an example of a method for driving a touch panel will be described with reference to FIGS. 20A and 20B.

Figure 20A:
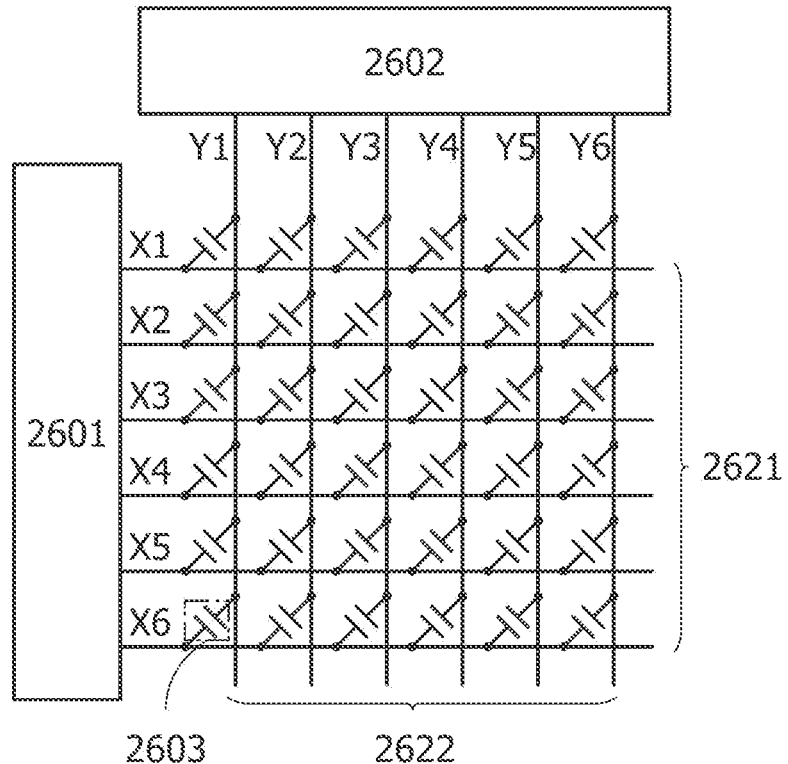
FIGS. 20A and 20B are a block diagram and a timing chart of a touch sensor.

FIG. 20A is a block diagram illustrating the structure of a mutual capacitive touch sensor. FIG. 20A illustrates a pulse voltage output circuit 2601 and a current sensing circuit 2602. Note that in FIG. 20A, six wirings X1 to X6 represent the electrodes 2621 to which a pulse voltage is applied, and six wirings Y1 to Y6 represent the electrodes 2622 that detect changes in current. FIG. 20A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 20B:
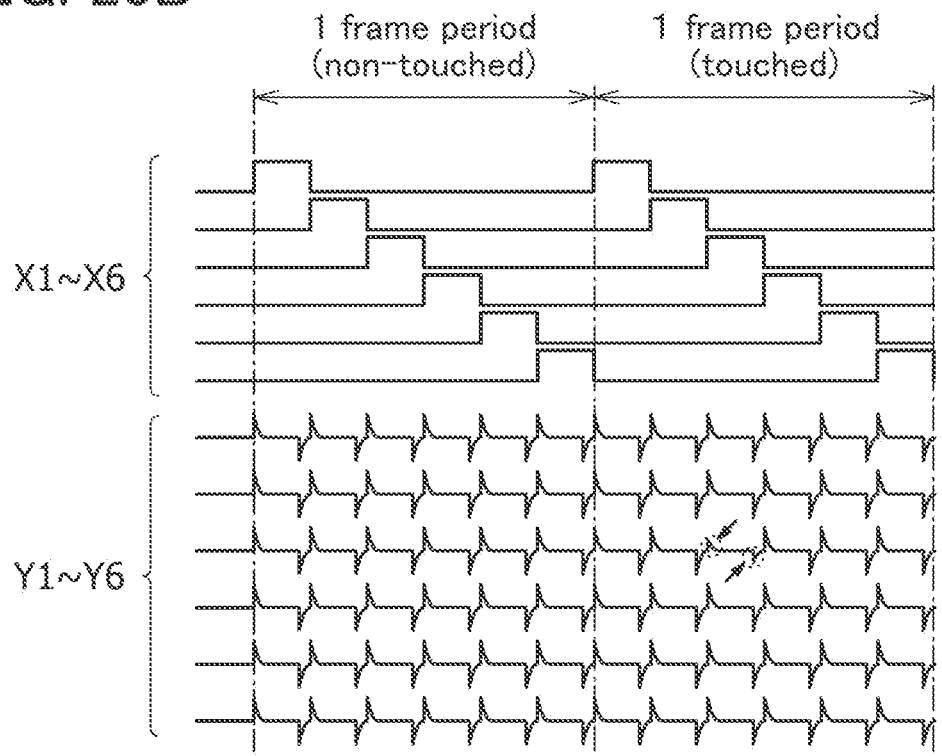

FIG. 20B is a timing chart showing input and output waveforms in the mutual capacitive touch sensor illustrated in FIG. 20A. In FIG. 20B, sensing of a sensing target is performed in all the rows and columns in one frame period. FIG. 20B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage level changes.

By detecting a change in mutual capacitance in this manner, the approach or contact of a sensing target can be sensed.

<5-6. Sensor Circuit>

Figure 21:
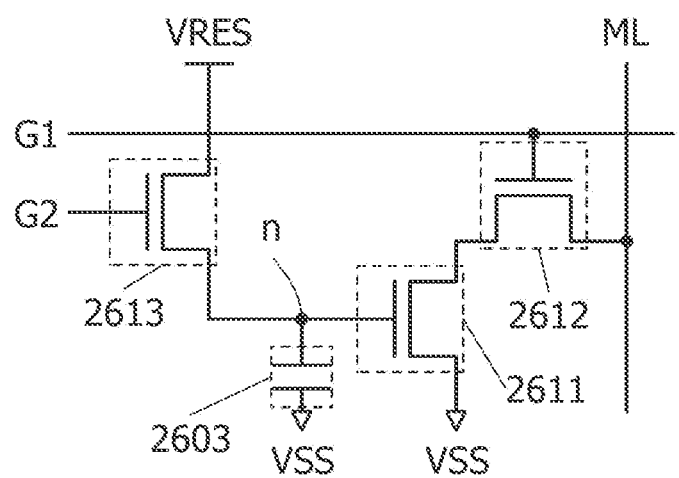
FIG. 21 is a circuit diagram of a touch sensor.

Although FIG. 20A illustrates a passive type touch sensor in which only the capacitor 2603 is provided at the intersection of wirings as a touch sensor, an active type touch sensor including a transistor and a capacitor may be used. FIG. 21 illustrates an example of a sensor circuit included in an active type touch sensor.

The sensor circuit in FIG. 21 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 21 will be described. First, a potential for turning on the transistor 2613 is supplied as the signal G2, and a potential with respect to the voltage VRES is thus applied to a node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger; accordingly, the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be used in appropriate combination with any of the structures described in the other embodiments.

Embodiment 6

In this embodiment, a display module and electronic devices including a light-emitting device of one embodiment of the present invention will be described with reference to FIG. 22 and FIGS. 23A to 23G.

<6-1. Display Module>

Figure 22:
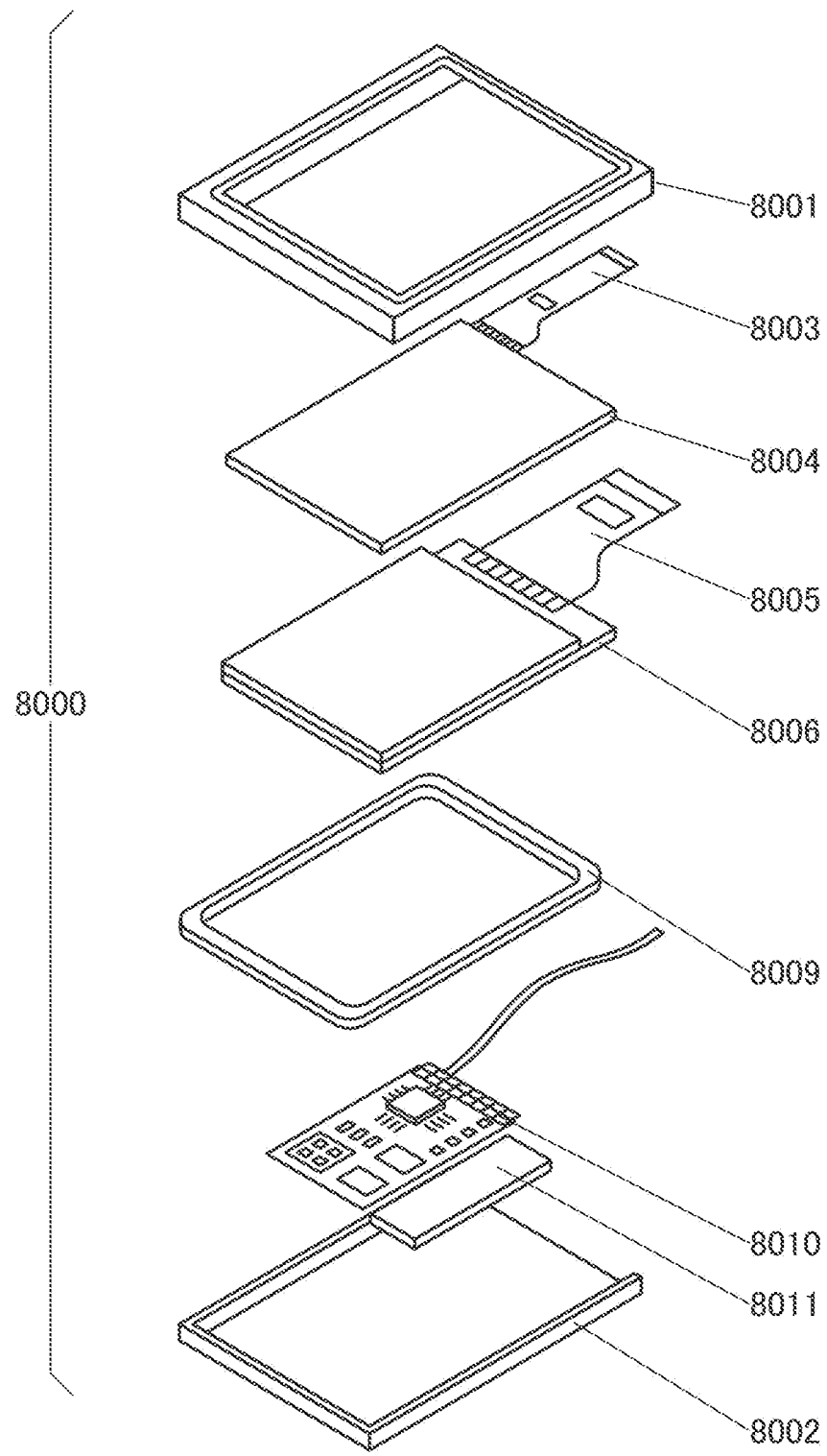
FIG. 22 is a perspective view illustrating a display module.

In a display module 8000 in FIG. 22, a touch sensor 8004 connected to an FPC 8003, a display panel 8006 connected to an FPC 8005, a frame 8009, a printed circuit board 8010, and a battery 8011 are provided between an upper cover 8001 and a lower cover 8002.

The light-emitting device of one embodiment of the present invention can be used for the display panel 8006, for example.

The shapes and sizes of the upper cover 8001 and the lower cover 8002 can be changed as appropriate in accordance with the sizes of the touch sensor 8004 and the display panel 8006.

The touch sensor 8004 can be a resistive touch panel or a capacitive touch panel and may be formed to overlap with the display panel 8006. A counter substrate (sealing substrate) of the display panel 8006 can have a touch sensor function. A photosensor may be provided in each pixel of the display panel 8006 so that an optical touch sensor is obtained.

The frame 8009 protects the display panel 8006 and also serves as an electromagnetic shield for blocking electromagnetic waves generated by the operation of the printed circuit board 8010. The frame 8009 may serve as a radiator plate.

The printed circuit board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<6-2. Electronic Device>

FIGS. 23A to 23G illustrate electronic devices. These electronic devices can include a housing 9000, a display portion 9001, a speaker 9003, operation keys 9005, a connection terminal 9006, a sensor 9007, a microphone 9008, and the like.

The electronic devices illustrated in FIGS. 23A to 23G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 23A to 23G are not limited to those described above, and the electronic devices can have a variety of functions. Although not illustrated in FIGS. 23A to 23G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 23A to 23G will be described in detail below.

Figure 23A:
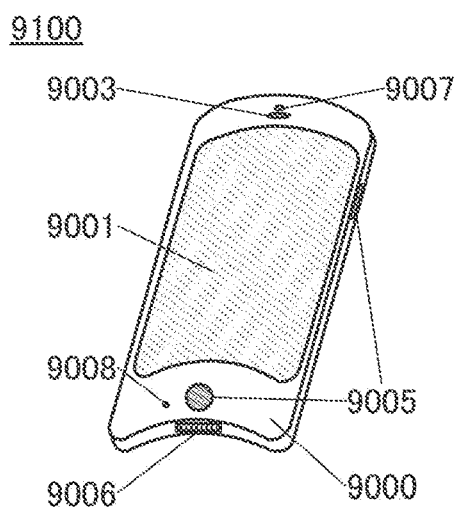
FIGS. 23A to 23G illustrate electronic devices.

FIG. 23A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 23B:
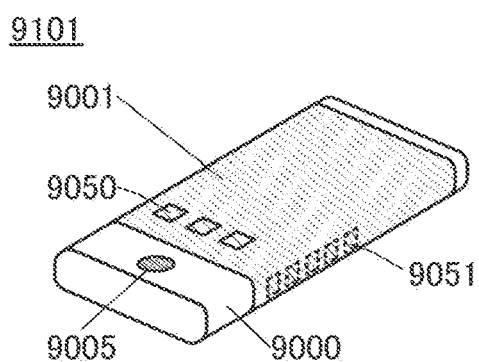

FIG. 23B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated in FIG. 23B, can be positioned in the portable information terminal 9101 as in the portable information terminal 9100 in FIG. 23A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the strength of an antenna. Instead of the information 9051, the operation buttons 9050 or the like may be displayed on the position where the information 9051 is displayed.

Figure 23C:
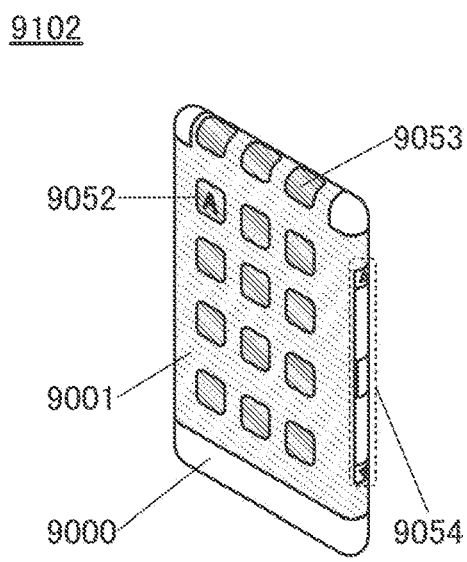

FIG. 23C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 23D:
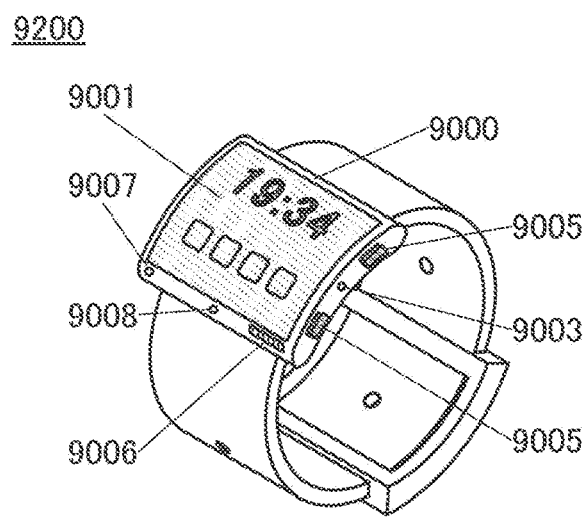

FIG. 23D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 23E:
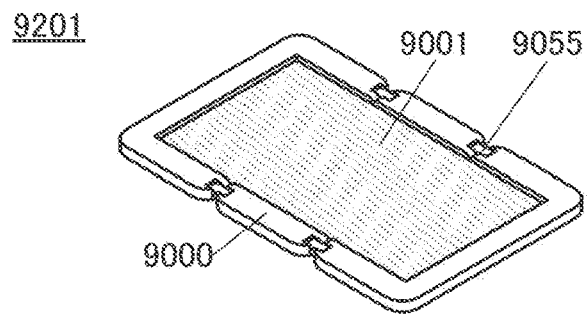
Figure 23F:
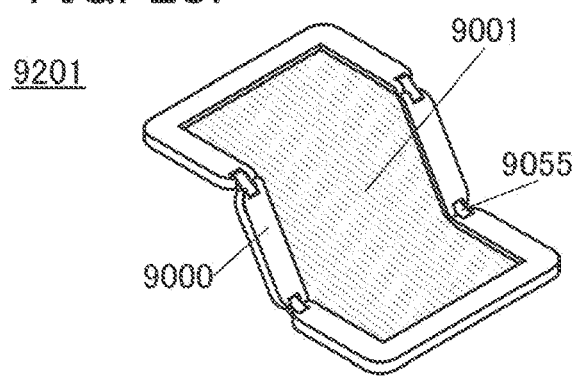
Figure 23G:
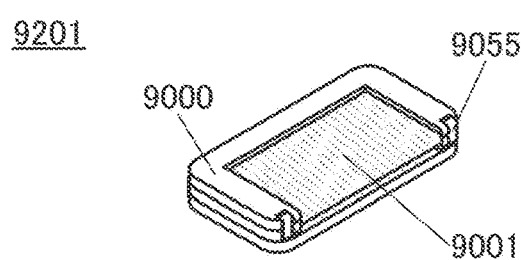

FIGS. 23B, 23F, and 23G are perspective views of a foldable portable information terminal 9201. FIG. 23E is a perspective view illustrating the portable information terminal 9201 that is opened. FIG. 23F is a perspective view illustrating the portable information terminal 9201 that is being opened or being folded. FIG. 23G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting device of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in appropriate combination with any of the structures described in the other embodiments.

Embodiment 7

Figure 24A:
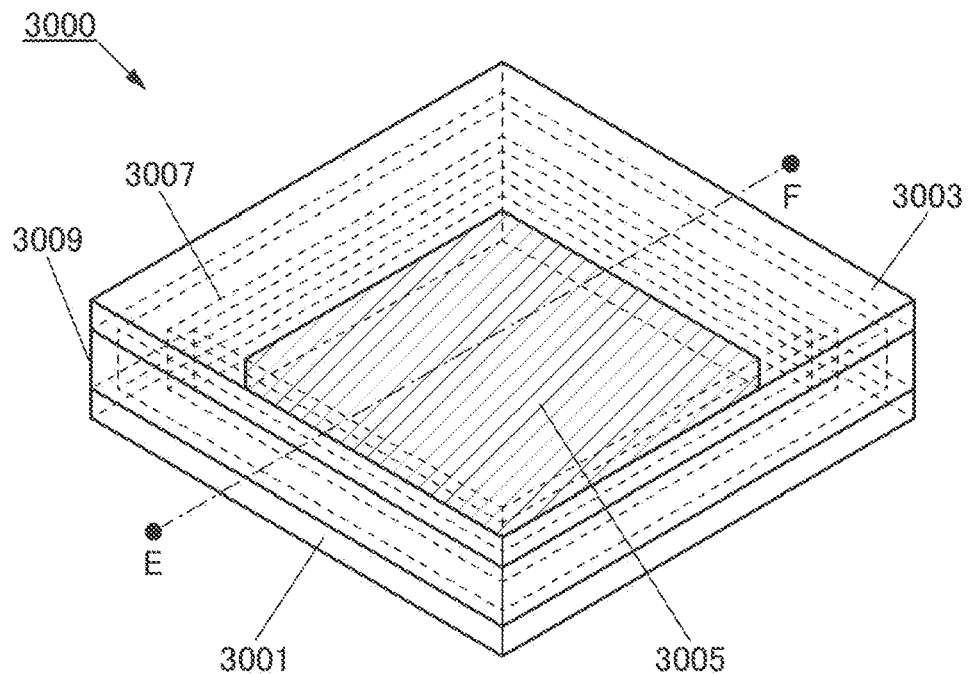
FIGS. 24A to 24C are a perspective view and cross-sectional views illustrating a light-emitting device.
Figure 24B:
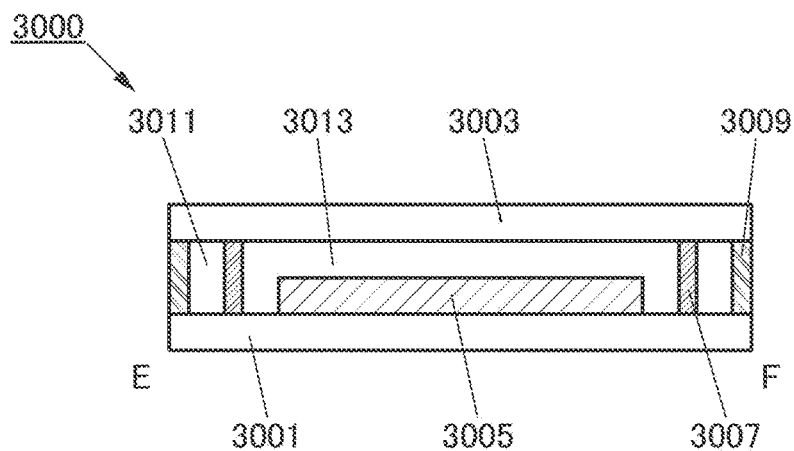

In this embodiment, the light-emitting device of one embodiment of the present invention will be described with reference to FIGS. 24A to 24C.
<7. Light-Emitting Device>
FIG. 24A is a perspective view of a light-emitting device 3000 shown in this embodiment, and FIG. 24B is a cross-sectional view taken along dashed-dotted line E-F in FIG. 24A. Note that in FIG. 24A, some components am illustrated by broken lines in order to avoid complexity of the drawing.

The light-emitting device 3000 illustrated in FIGS. 24A and 24B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 24A and 24B, a structure in which light is emitted from the light-emitting element 3005 to the lower side (the substrate 3001 side) is illustrated.

As illustrated in FIGS. 24A and 24B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 24B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 102 and the substrate 152 described in Embodiment 1, respectively. The light-emitting element 3005 can have a structure similar to that of any of the first to third light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon, aramid), polyimide, polycarbonate, polyurethane, an acrylic resin, an epoxy resin, or a resin having a siloxane bond can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009. The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second region 3009 is sealed using the material containing glass, whereby the light-emitting device 3000 is less likely to be damaged even when distortion due to external force or the like is generated.

Furthermore, as illustrated in FIG. 24B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Note that for the first region 3011 and the second region 3013, a reduced pressure state is preferred to an atmospheric pressure state.

Figure 24C:
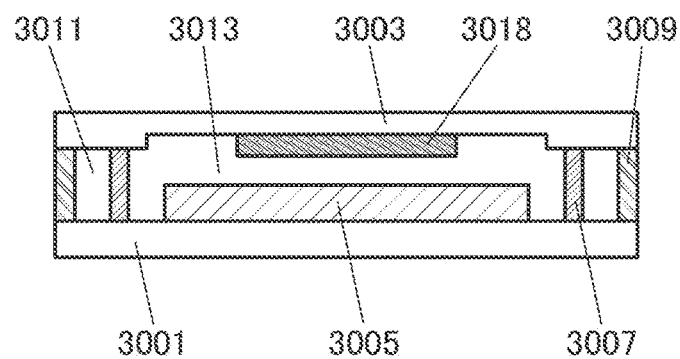

FIG. 24C illustrates a modification example of the structure in FIG. 24B. FIG. 24C is a cross-sectional view illustrating the modification example of the light-emitting device 3000.

FIG. 24C illustrates a structure in which a desiccant 3018 is provided in a recessed portion provided in part of the substrate 3003. The other components are the same as those of the structure illustrated in FIG. 24B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxides (e.g., calcium oxide, barium oxide, and the like), sulfate, metal halides, perchlorate, zeolite, silica gel, and the like.

Next, modification examples of the light-emitting device 3000 which is illustrated in FIG. 24B are described with reference to FIGS. 25A to 25D. Note that FIGS. 25A to 25D are cross-sectional views illustrating the modification examples of the light-emitting device 3000 illustrated in FIG. 24B.

Figure 25A:
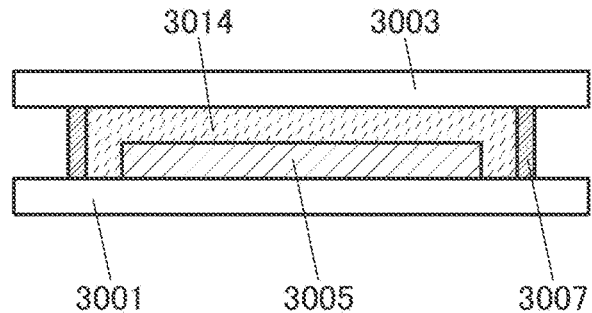
FIGS. 25A to 25D are cross-sectional views illustrating a light-emitting device.

In the light-emitting device illustrated in FIG. 25A, the second sealing region 3009 is not provided but only the first sealing region 3007 is provided. Moreover, in the light-emitting device illustrated in FIG. 25A, a region 3014 is provided instead of the second region 3013 illustrated in FIG. 24B.

For the region 3014, for example, materials that include polyester, polyolefin, polyamide (e.g., nylon or aramid), polyimide, polycarbonate, polyurethane, an acrylic resin, an epoxy resin, or a resin having a siloxane bond can be used.

When the above-described material is used for the region 3014, what is called a solid-sealing light-emitting device can be obtained.

Figure 25B:
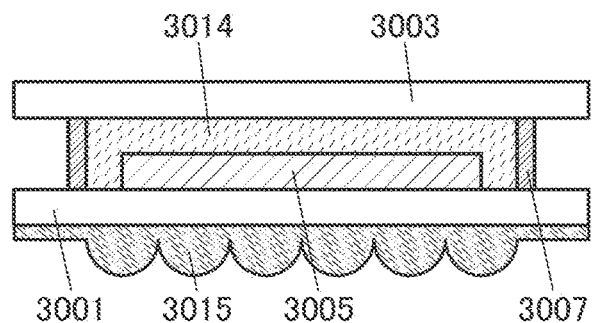

In the light-emitting device illustrated in FIG. 25B, a substrate 3015 is provided on the substrate 3001 side of the light-emitting device illustrated in FIG. 25A.

The substrate 3015 has unevenness as illustrated in FIG. 25B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 25B, a substrate having a function as a diffusion plate may be provided.

Figure 25C:
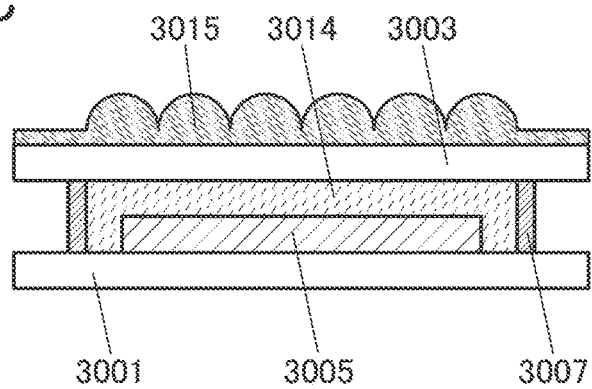

In the light-emitting device illustrated in FIG. 25C, light is extracted through the substrate 3003 side, unlike in the light-emitting device illustrated in FIG. 25A, in which light is extracted through the substrate 3001 side.

The light-emitting device illustrated in FIG. 25C includes the substrate 3015 on the substrate 3003 side. The other components are the same as those of the light-emitting device illustrated in FIG. 25B.

Figure 25D:
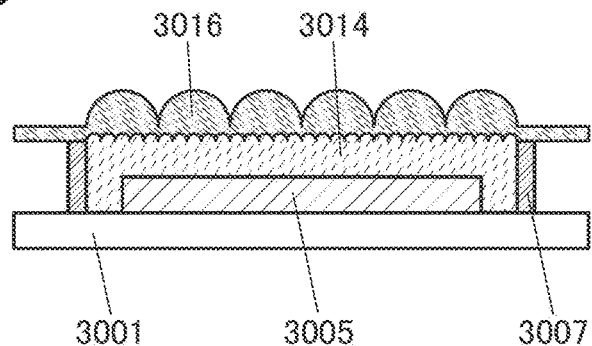

In the light-emitting device illustrated in FIG. 25D, the substrate 3003 and the substrate 3015 included in the light-emitting device illustrated in FIG. 25C are not provided but a substrate 3016 is provided.

The substrate 3016 includes first unevenness positioned closer to the light-emitting element 3005 and second unevenness positioned farther from the light-emitting element 3005. With the structure illustrated in FIG. 25D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

The structure described in this embodiment can be used in appropriate combination with any of the structures described in the other embodiments.

Embodiment 8

In this embodiment, examples in which the light-emitting device of one embodiment of the present invention is applied to various lighting devices and electronic devices will be described with reference to FIGS. 26A to 26C.

<8. Lighting Device and Electronic Device>

An electronic device or a lighting device that has a light-emitting region with a curved surface can be obtained with the use of the light-emitting device of one embodiment of the present invention which is manufactured over a substrate having flexibility.

Furthermore, a light-emitting device to which one embodiment of the present invention is applied can also be applied to lighting for motor vehicles, examples of which are lighting for a dashboard, a windshield, a ceiling, and the like.

Figure 26A:
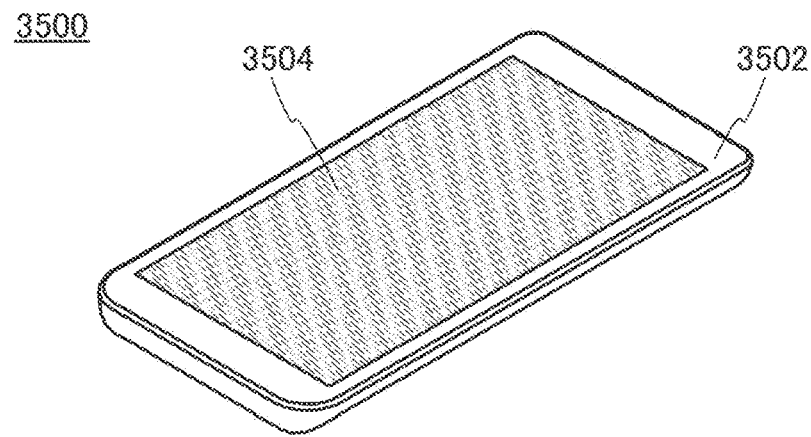
FIGS. 26A to 26C illustrate a lighting device and an electronic device.
Figure 26B:
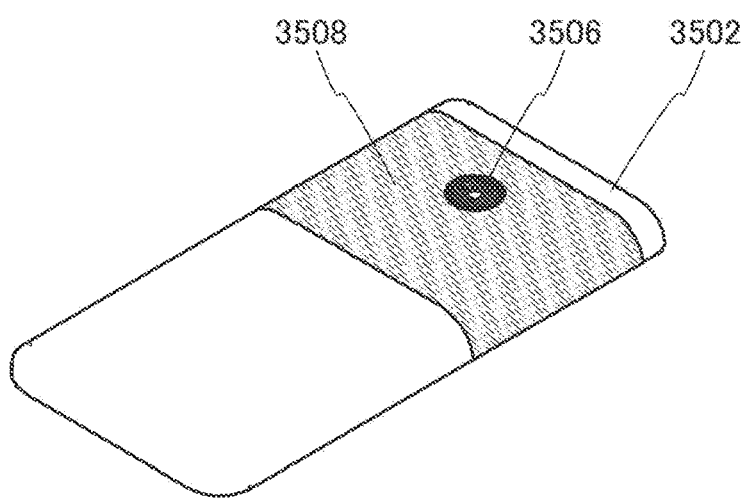

FIG. 26A is a perspective view illustrating one surface of a multifunction terminal 3500, and FIG. 26B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 26A and 26B can have a variety of functions as in the electronic devices illustrated in FIGS. 23A to 23G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 26C:
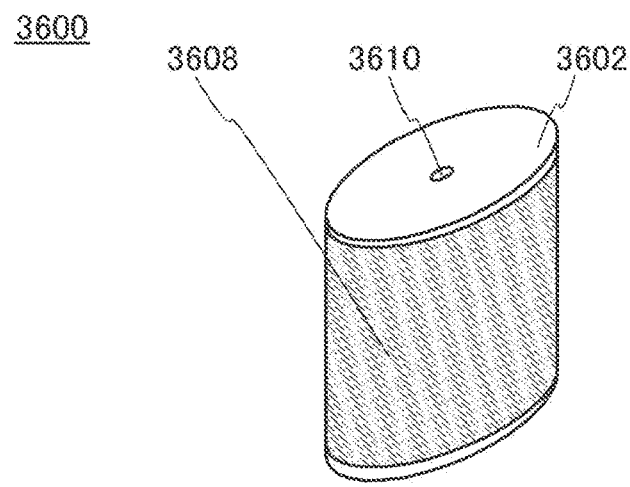

FIG. 26C is a perspective view of a security light 3600. The security light 3600 includes lighting 3608 on the outside of a housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described in this embodiment can be used in appropriate combination with any of the structures described in the other embodiments.

This application is based on Japanese Patent Application serial no. 2015-033719 filed with Japan Patent Office on Feb. 24, 2015, the entire contents of which are hereby incorporated by reference.

What is claimed is:

1. A light-emitting element comprising:
a pair of electrodes; and
a first light-emitting layer and a second light-emitting layer provided between the pair of electrodes,
wherein the first light-emitting layer comprises a fluorescent material and a first host material,
wherein the second light-emitting layer comprises a material exhibiting thermally activated delayed fluorescence,
wherein the first host material has one of an anthracene skeleton and a tetracene skeleton,
wherein a $S_1$ level of the first host material is higher than the $S_1$ level of the fluorescent material,
wherein that the $T_1$ level of the first host material is lower than the $T_1$ level of the fluorescent material,
wherein light emitted from the first light-emitting layer comprises light emitted from the fluorescent material,
wherein light emitted from the second light-emitting layer comprises light emitted from the material exhibiting thermally activated delayed fluorescence,
wherein a difference in peak wavelength between a first emission spectrum of light from the first light-emitting layer and a second emission spectrum of light from the second light-emitting layer is larger than or equal 0 nm and smaller than or equal to 30 nm, and
wherein a peak wavelength of the first emission spectrum is shorter than or equal a peak wavelength of the second emission spectrum.

2. The light-emitting element according to claim 1,
wherein the second light-emitting layer further comprises a second host material comprising a first organic compound and a second organic compound, and
wherein a combination of the first organic compound and the second organic compound can form an exciplex.

3. The light-emitting element according to claim 1, wherein the first emission spectrum and the second emission spectrum each have the peak wavelength in a blue wavelength range.

4. The light-emitting element according to claim 1, wherein a ratio of excitons generated in the first light-emitting layer to excitons generated in the second light-emitting layer is in a range of 0.9:0.1 to 0.5:0.5.

5. A light-emitting device comprising:
the light-emitting element according to claim 1; and
a color filter.

6. A lighting device comprising:
the light-emitting element according to claim 1; and
a housing.

7. A light-emitting element comprising:
a pair of electrodes; and
a first EL layer and a second EL layer provided between the pair of electrodes,
wherein the first EL layer comprises a first light-emitting layer and a second light-emitting layer,
wherein the first light-emitting layer comprises a fluorescent material and a first host material,
wherein the second light-emitting layer comprises a first material,
wherein the first material is a material exhibiting thermally activated delayed fluorescence,
wherein the first host material has one of an anthracene skeleton and a tetracene skeleton,
wherein a $S_1$ level of the first host material is higher than the $S_1$ level of the fluorescent material,
wherein that the $T_1$ level of the first host material is lower than the $T_1$ level of the fluorescent material,
wherein the second EL layer comprises a third light-emitting layer,
wherein the third light-emitting layer comprises a second material,
wherein the second material is one of a phosphorescent material and a material exhibiting thermally activated delayed fluorescence,
wherein light emitted from the first light-emitting layer comprises light emitted from the fluorescent material,
wherein light emitted from the second light-emitting layer comprises light emitted from the first material,
wherein a difference in peak wavelength between a first emission spectrum of light from the first light-emitting layer and a second emission spectrum of light from the second light-emitting layer is larger than or equal 0 nm and smaller than or equal to 30 nm and,
wherein a peak wavelength of the first emission spectrum is shorter than or equal a peak wavelength of the second emission spectrum.

8. The light-emitting element according to claim 7,
wherein the second light-emitting layer further comprises a second host material comprising a first organic compound and a second organic compound, and
wherein a combination of the first organic compound and the second organic compound can form an exciplex.

9. The light-emitting element according to claim 7, wherein the first emission spectrum and the second emission spectrum each have the peak wavelength in a blue wavelength range.

10. The light-emitting element according to claim 7, wherein a ratio of excitons generated in the first light-emitting layer to excitons generated in the second light-emitting layer is in a range of 0.9:0.1 to 0.5:0.5.

11. A light-emitting device comprising:
the light-emitting element according to claim 7; and
a color filter.

12. A lighting device comprising:
the light-emitting element according to claim 7; and
a housing.

13. A light-emitting element comprising:
a pair of electrodes; and
a first EL layer and a second EL layer provided between the pair of electrodes,
wherein the first EL layer comprises a first light-emitting layer and a second light-emitting layer,
wherein the first light-emitting layer comprises a fluorescent material and a first host material,
wherein the second light-emitting layer comprises a first material,
wherein the first material is a material exhibiting thermally activated delayed fluorescence,
wherein the second EL layer comprises a third light-emitting layer and a fourth light-emitting layer,
wherein the third light-emitting layer comprises a second material,
wherein the second material is one of a phosphorescent material and a material exhibiting thermally activated delayed fluorescence,
wherein the fourth light-emitting layer comprises a third material,
wherein the third material is one of a phosphorescent material and a material exhibiting thermally activated delayed fluorescence,
wherein the first host material has one of an anthracene skeleton and a tetracene skeleton,
wherein a $S_1$ level of the first host material is higher than the $S_1$ level of the fluorescent material,
wherein that the $T_1$ level of the first host material is lower than the $T_1$ level of the fluorescent material,
wherein light emitted from the first light-emitting layer comprises light emitted from the fluorescent material,
wherein light emitted from the second light-emitting layer comprises light emitted from the first material,
wherein a difference in peak wavelength between a first emission spectrum of light from the first light-emitting layer and a second emission spectrum of light from the second light-emitting layer is larger than or equal 0 nm and smaller than or equal to 30 nm and,
wherein a peak wavelength of the first emission spectrum is shorter than or equal a peak wavelength of the second emission spectrum.

14. The light-emitting element according to claim 13,
wherein the second light-emitting layer further comprises a second host material comprising a first organic compound and a second organic compound, and
wherein a combination of the first organic compound and the second organic compound can form an exciplex.

15. The light-emitting element according to claim 13, wherein the first emission spectrum and the second emission spectrum each have the peak wavelength in a blue wavelength range.

16. A light-emitting device comprising:
the light-emitting element according to claim 13; and
a color filter.

17. A lighting device comprising:
the light-emitting element according to claim 13; and
a housing.

18. The light-emitting element according to claim 13, wherein a ratio of excitons generated in the first light-emitting layer to excitons generated in the second light-emitting layer is in a range of 0.9:0.1 to 0.5:0.5.

* * * * *